United States Patent
Kodate et al.

(10) Patent No.: US 11,322,597 B2
(45) Date of Patent: May 3, 2022

(54) GATE MATERIAL-BASED CAPACITOR AND RESISTOR STRUCTURES AND METHODS OF FORMING THE SAME

(71) Applicant: SANDISK TECHNOLOGIES LLC, Addison, TX (US)

(72) Inventors: Hokuto Kodate, Nagoya (JP); Hiroyuki Ogawa, Nagoya (JP); Dai Iwata, Yokkaichi (JP); Mitsuhiro Togo, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/006,228

(22) Filed: Aug. 28, 2020

(65) Prior Publication Data
US 2022/0069097 A1    Mar. 3, 2022

(51) Int. Cl.
*H01L 21/00* (2006.01)
*H01L 29/423* (2006.01)
*H01L 49/02* (2006.01)
*H01L 27/06* (2006.01)
*H01L 29/40* (2006.01)

(52) U.S. Cl.
CPC .... *H01L 29/42364* (2013.01); *H01L 27/0629* (2013.01); *H01L 28/24* (2013.01); *H01L 28/75* (2013.01); *H01L 28/91* (2013.01); *H01L 28/92* (2013.01); *H01L 29/401* (2013.01); *H01L 29/4236* (2013.01)

(58) Field of Classification Search
CPC .......... H01L 29/42364; H01L 27/0629; H01L 28/24; H01L 28/75; H01L 28/91; H01L 28/92; H01L 29/401; H01L 29/4236
See application file for complete search history.

(56) References Cited

U.S. PATENT DOCUMENTS 6,130,449 A * 10/2000 Matsuoka ......... H01L 27/10894
                                                    257/296
9,589,981 B2    3/2017 Nishikawa et al.
9,646,981 B2    5/2017 Nishikawa et al.
(Continued)

FOREIGN PATENT DOCUMENTS

JP    2005-203455 A    7/2005
KR    10-2000-0020238 A    4/2000

OTHER PUBLICATIONS

Kodate, H. et al., "Gate Material-Based Capacitor and Resistor Structures and Methods of Forming the Same," U.S. Appl. No. 17/006,265, filed Aug. 28, 2020.
(Continued)

*Primary Examiner* — Richard A Booth
(74) *Attorney, Agent, or Firm* — The Marbury Law Group PLLC

(57) ABSTRACT

At least one of a capacitor or a resistor structure can be formed concurrently with formation of a field effect transistor by patterning a gate dielectric layer into gate dielectric and into a first node dielectric or a first resistor isolation dielectric, and by patterning a semiconductor layer into a gate electrode and into a second electrode of a capacitor or a resistor strip. Contacts are then formed to the capacitor or resistor structure. Sidewall spacers may be formed on the gate electrode prior to patterning the capacitor or resistor contacts to reduce damage to the underlying capacitor or resistor layers.

20 Claims, 25 Drawing Sheets

(56) References Cited

U.S. PATENT DOCUMENTS

| | | |
|---|---|---|
| 10,580,783 B2 | 3/2020 | Cui et al. |
| 10,629,675 B1 | 4/2020 | Nishikawa et al. |
| 2003/0038337 A1* | 2/2003 | Kanamitsu ........ H01L 27/10855 257/510 |
| 2003/0151068 A1* | 8/2003 | Ishibashi ........... H01L 27/10841 257/200 |
| 2009/0004809 A1 | 1/2009 | Chinthakindi et al. |
| 2011/0309420 A1 | 12/2011 | Chang et al. |
| 2016/0365351 A1 | 12/2016 | Nishikawa et al. |
| 2016/0365352 A1 | 12/2016 | Nishikawa et al. |
| 2019/0273088 A1 | 9/2019 | Cui et al. |
| 2020/0091276 A1 | 3/2020 | Cheng |

OTHER PUBLICATIONS

Notification of Transmittal of the International Search Report and the Written Opinion of the International Searching Authority for International Patent Application No. PCTUS2021/035846, dated Dec. 6, 2021, 12 pages.

\* cited by examiner

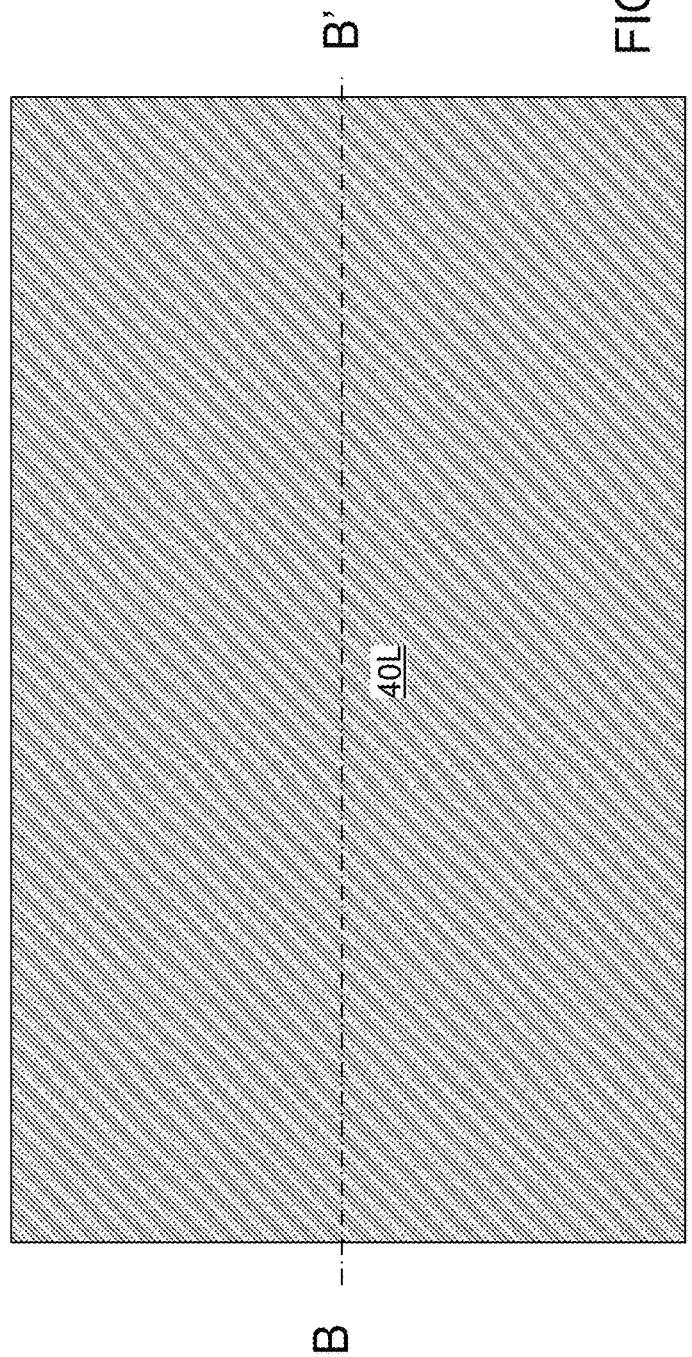
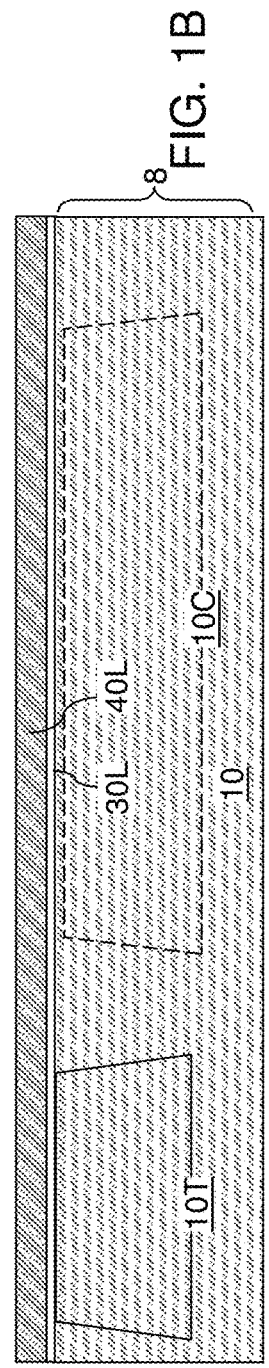

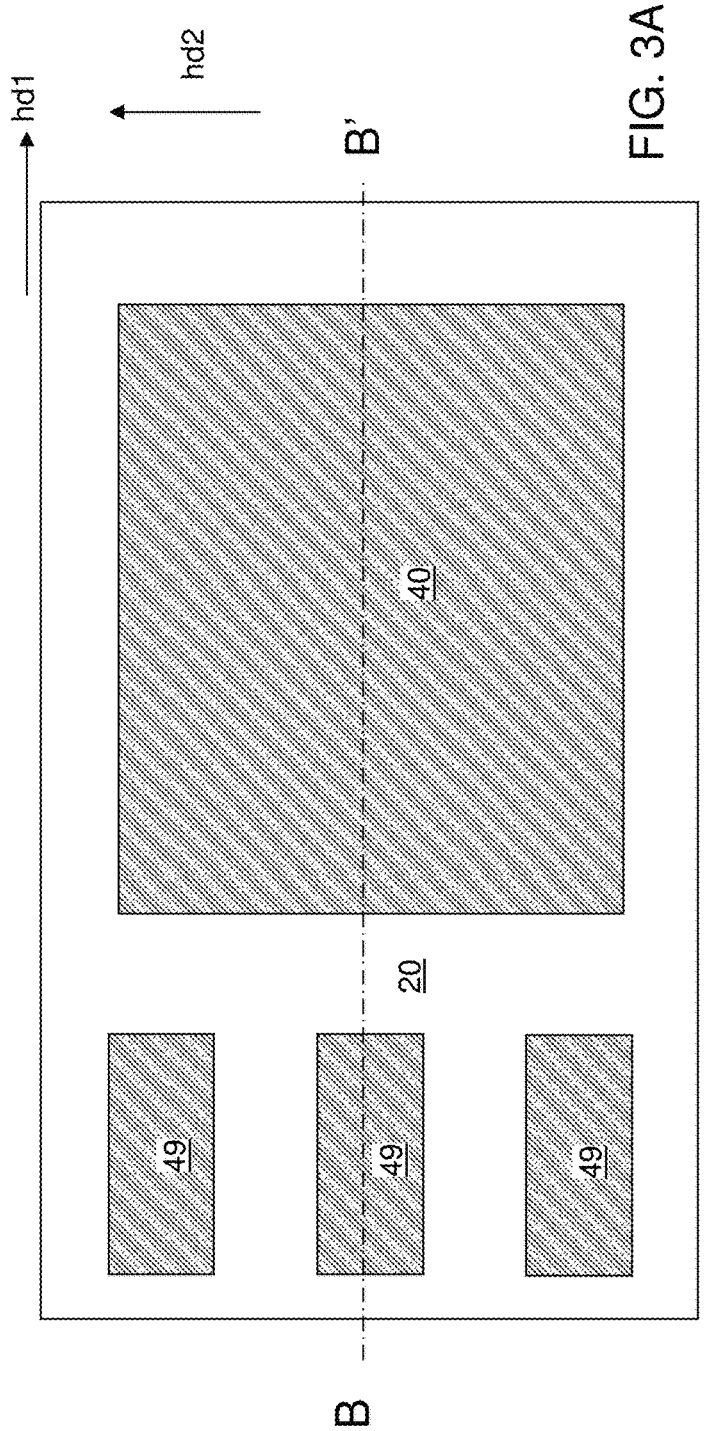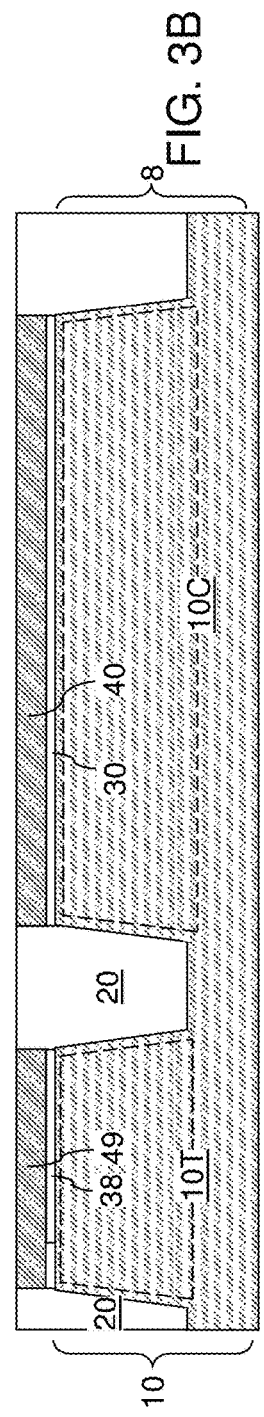

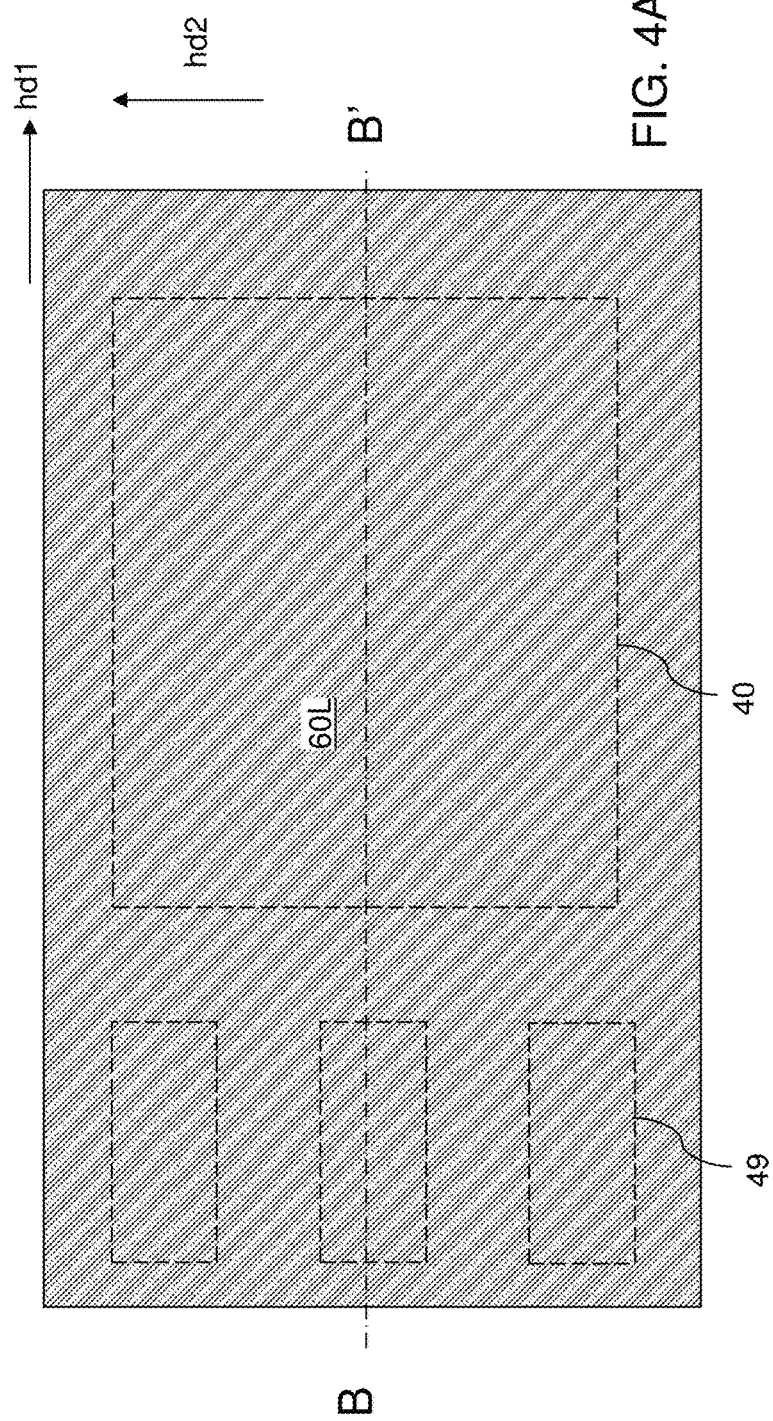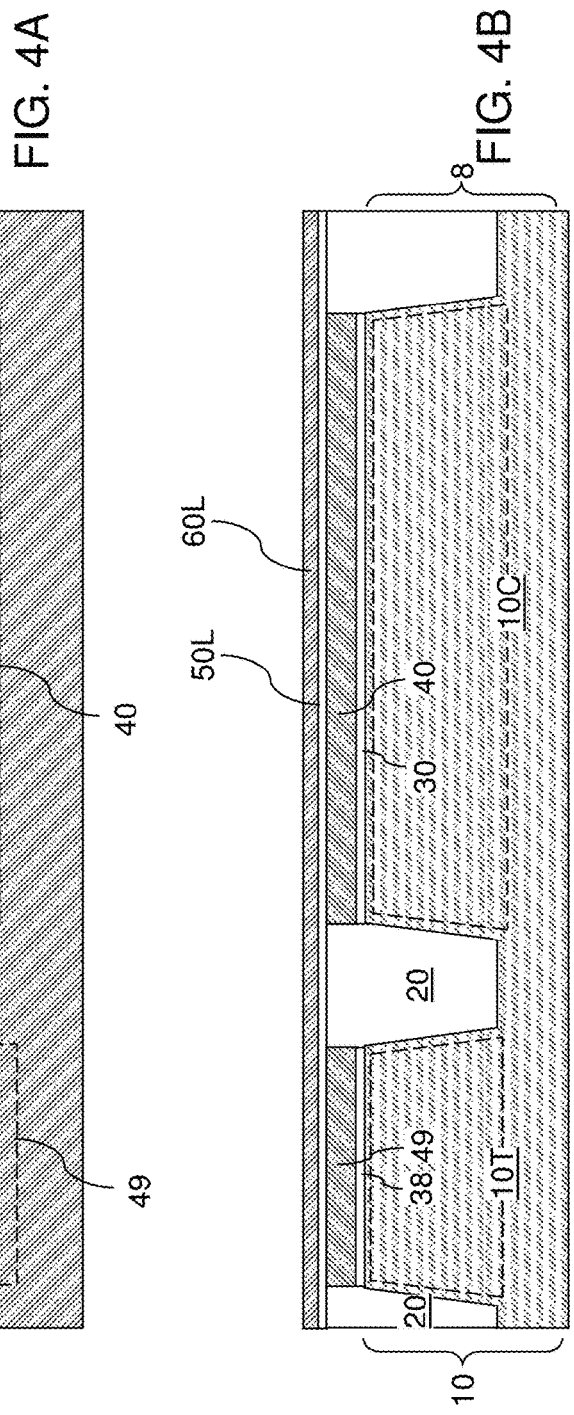

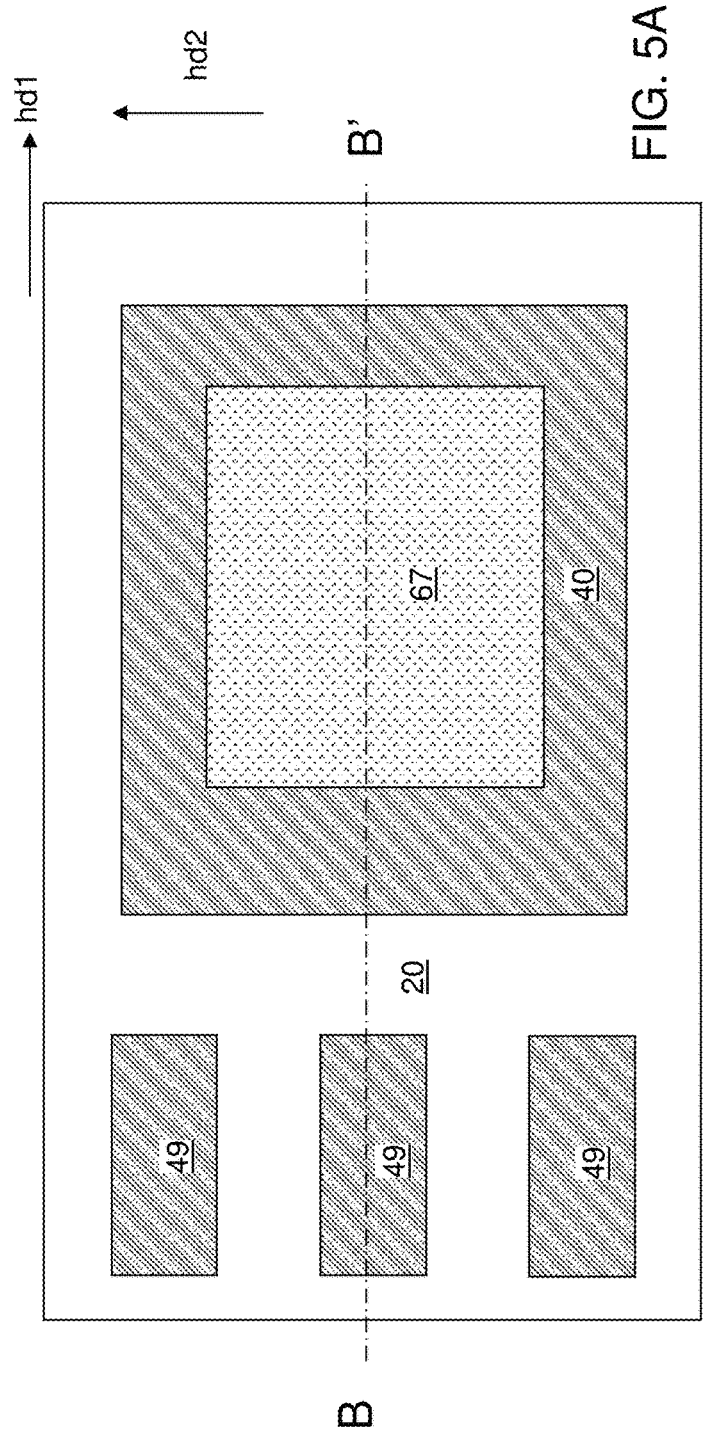
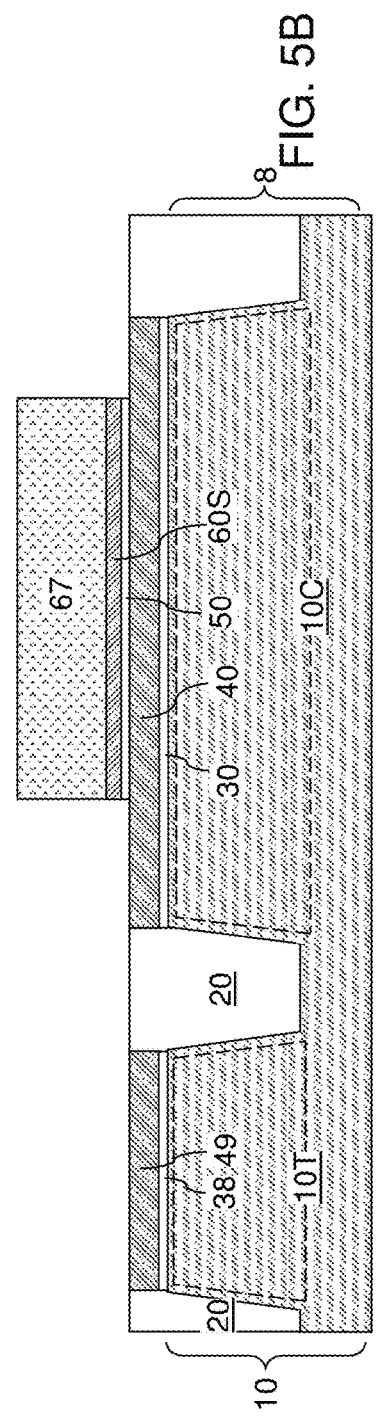

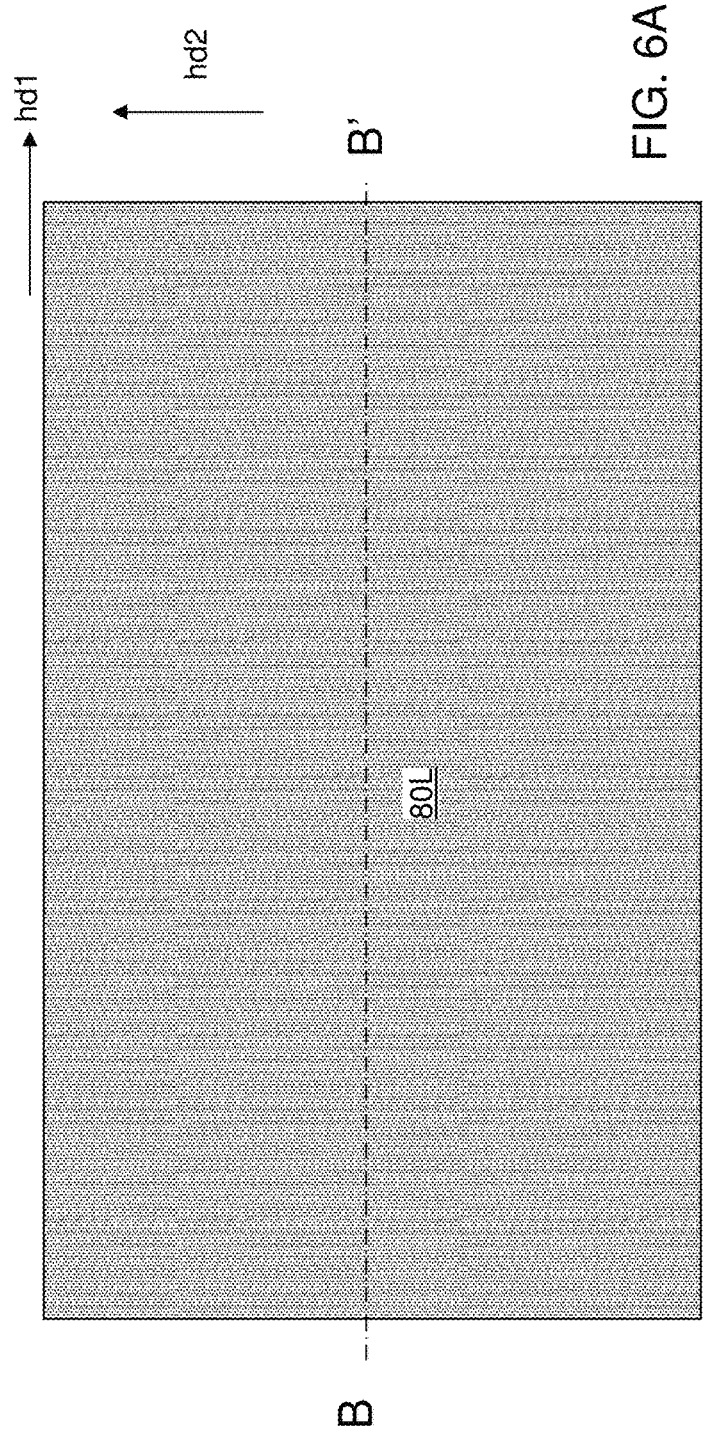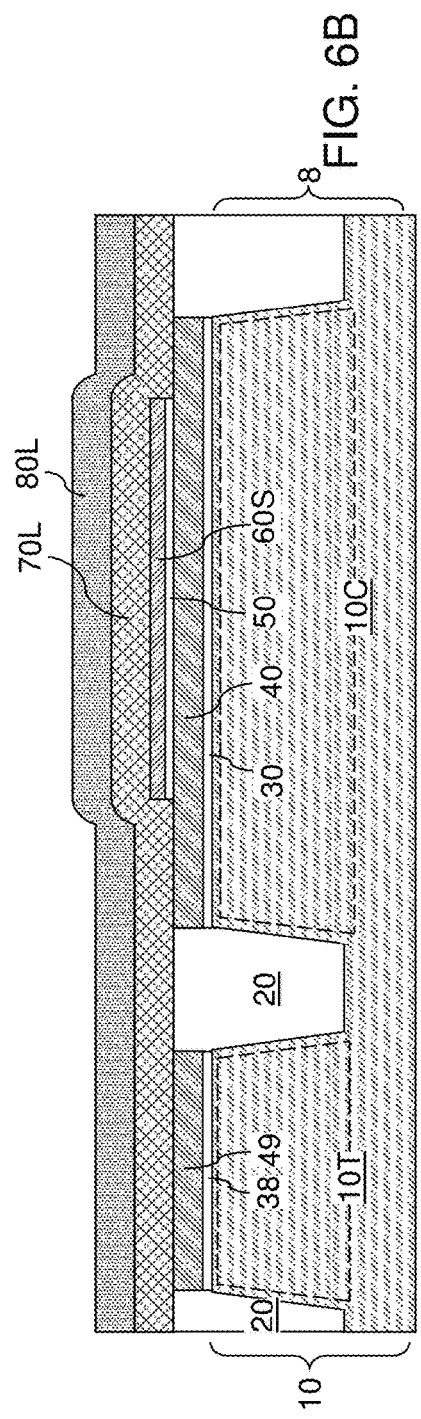

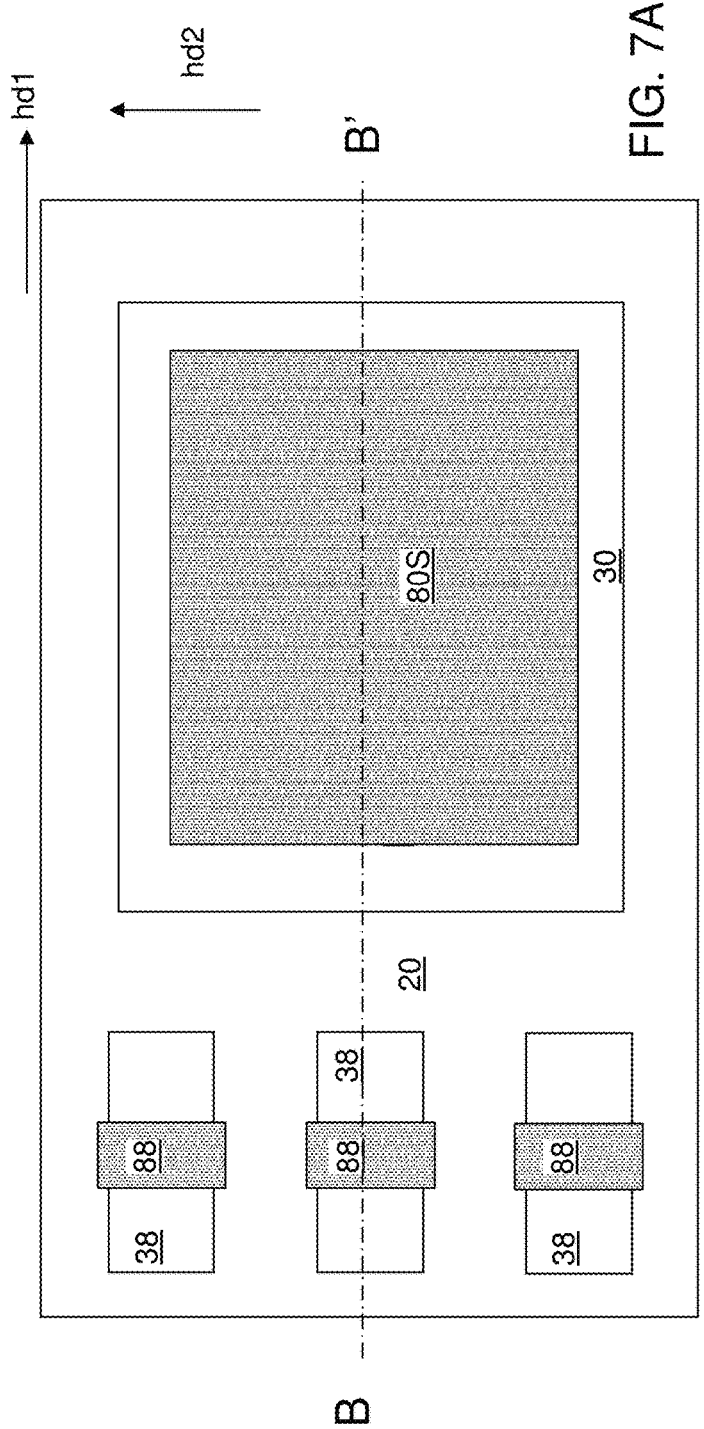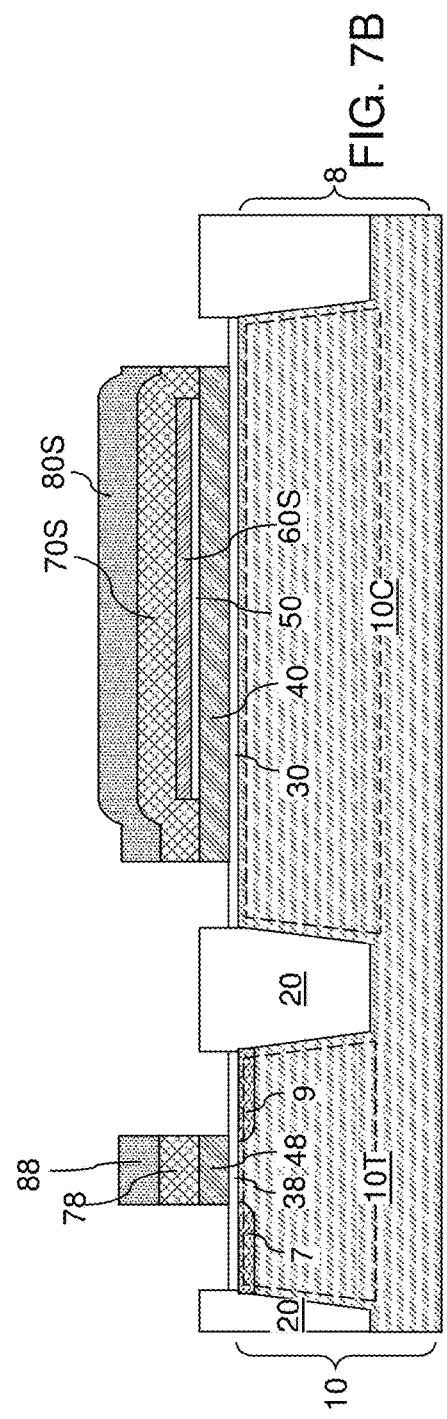

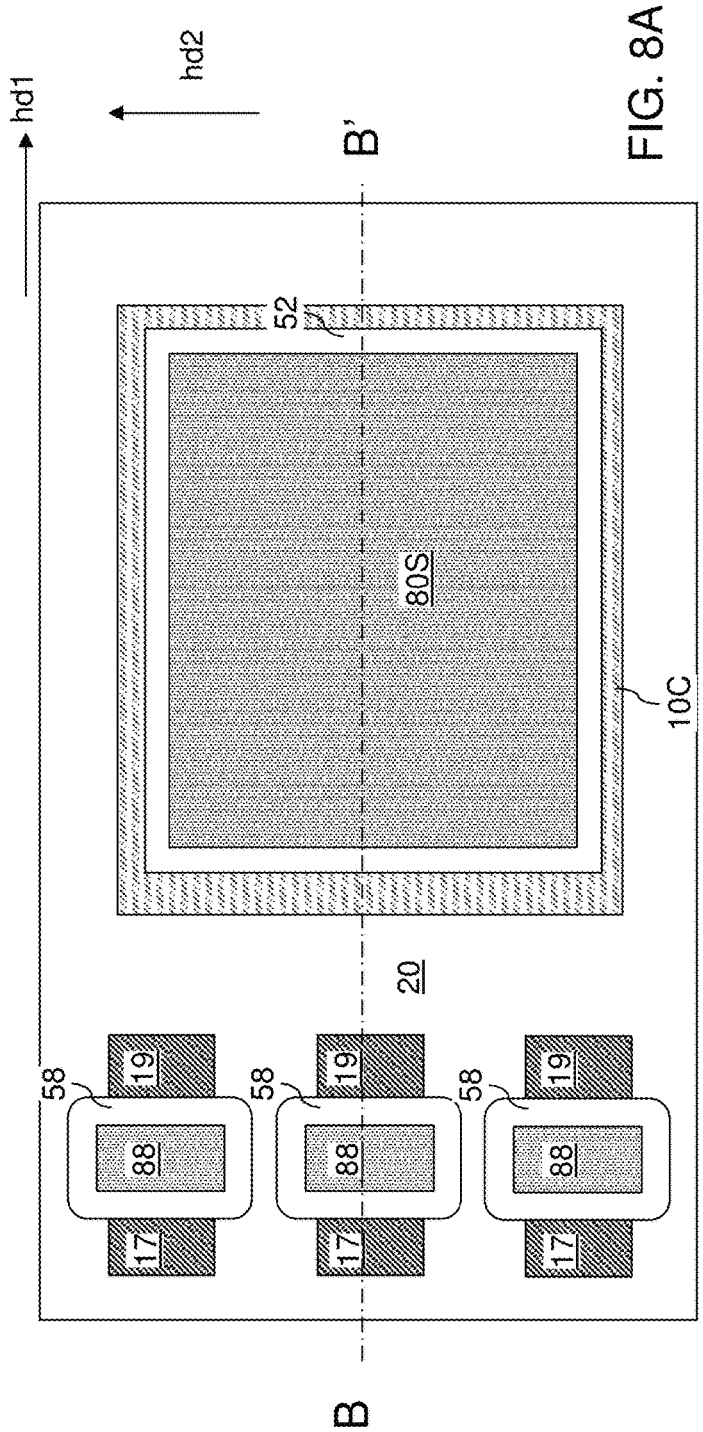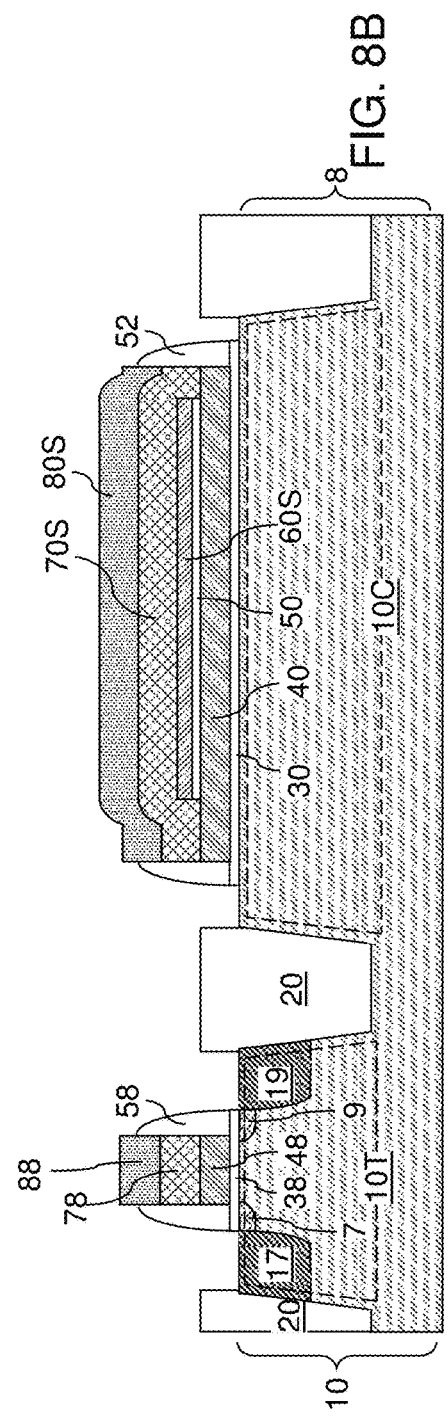

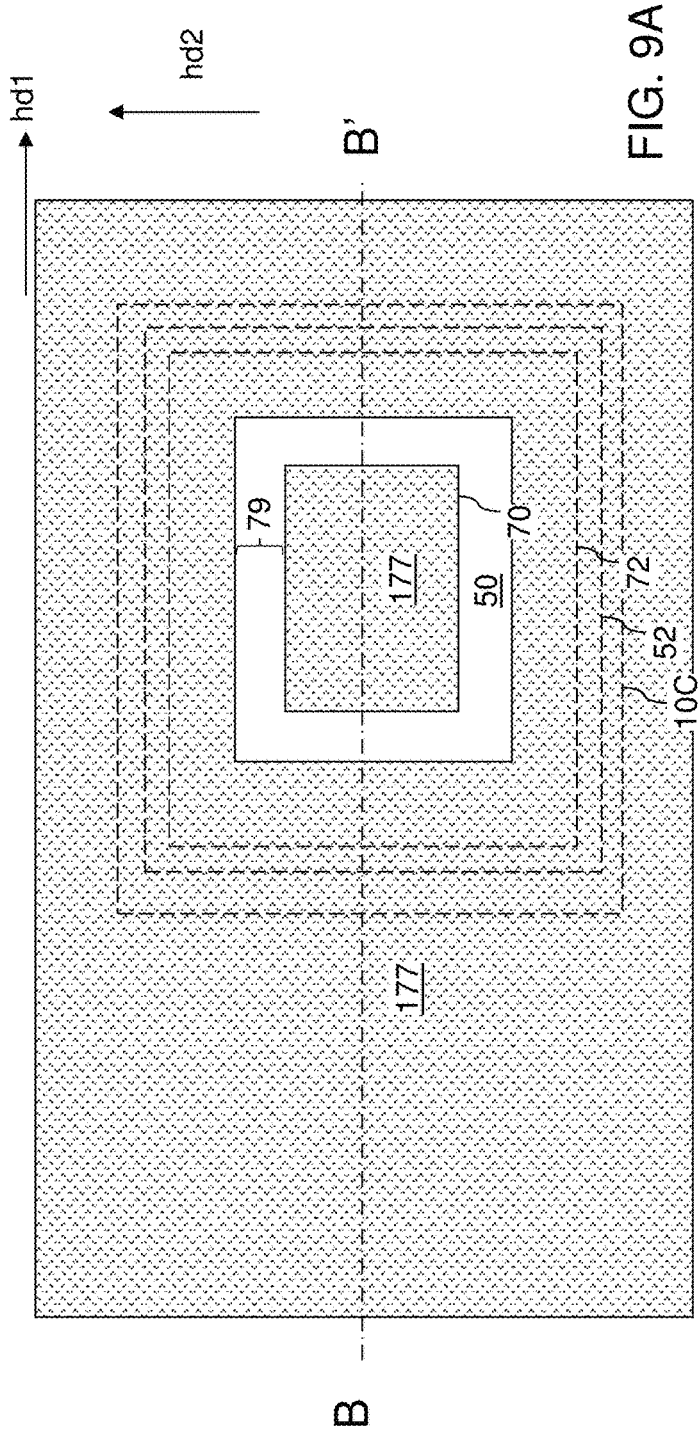
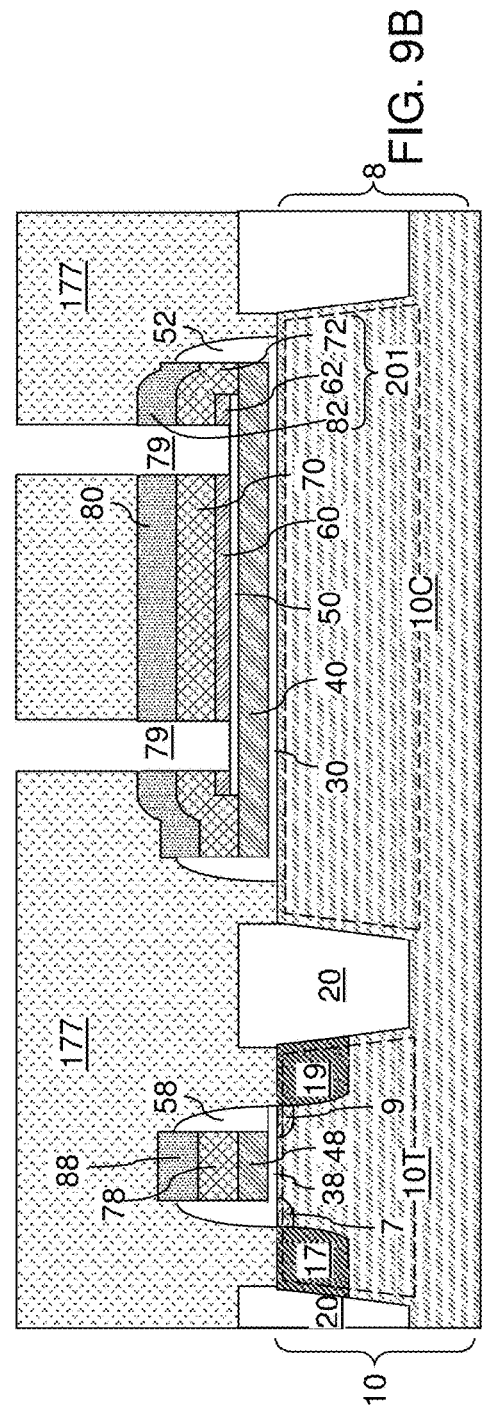

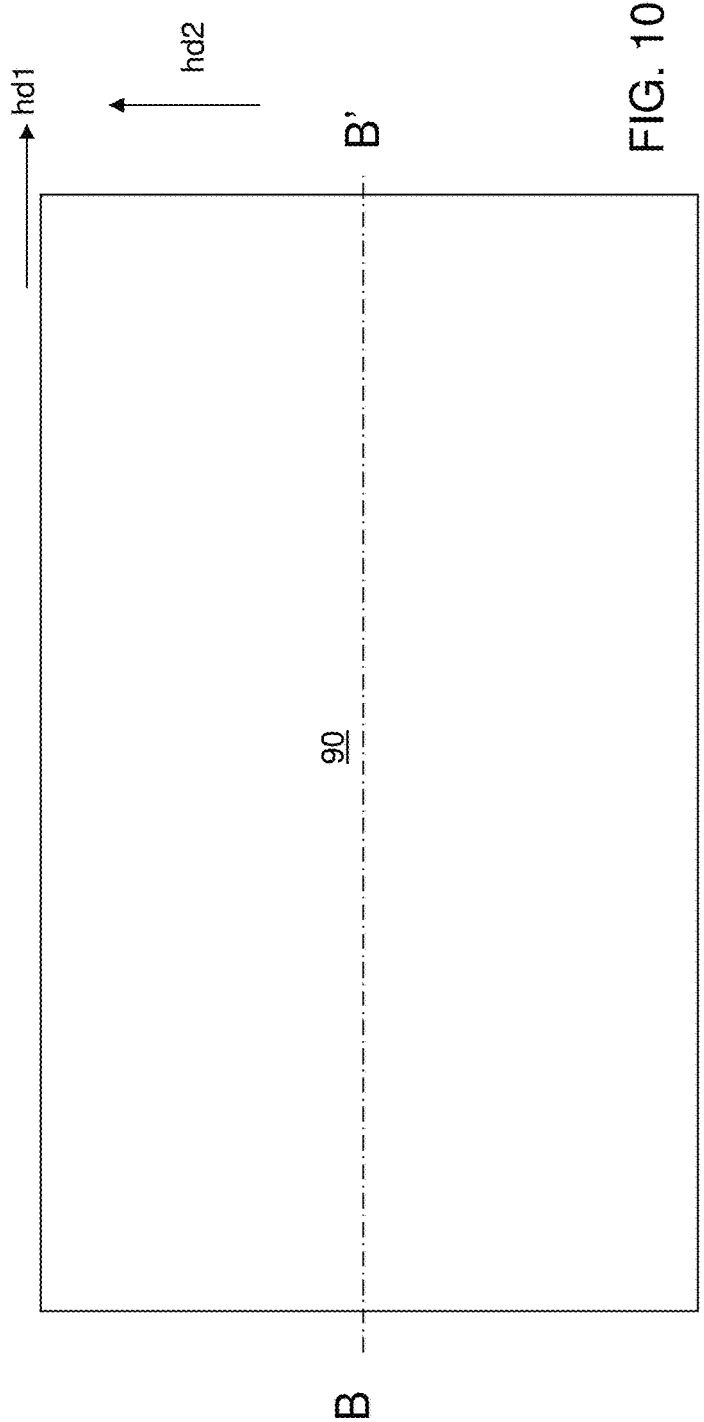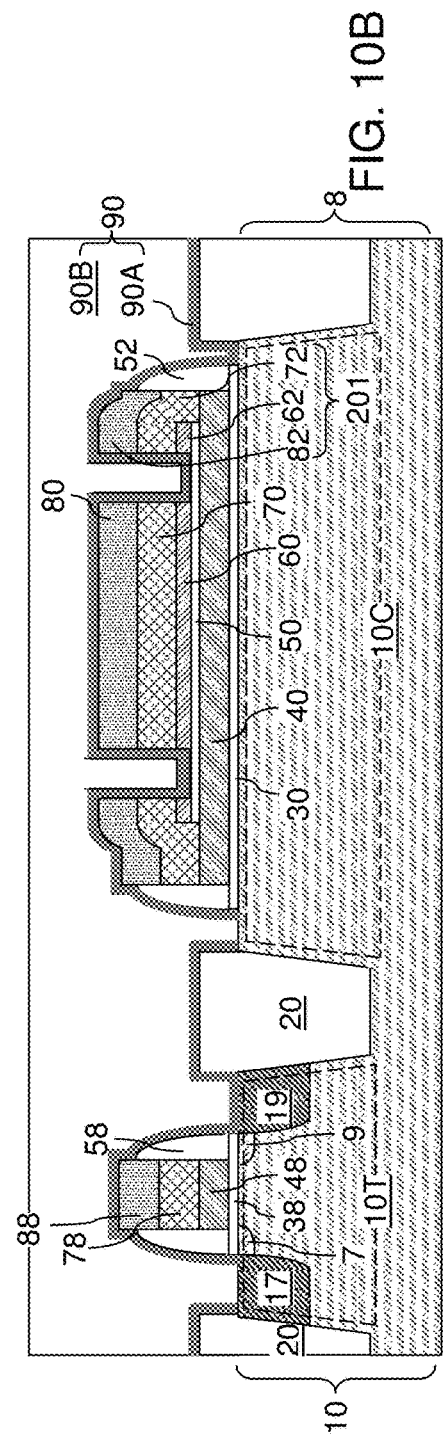

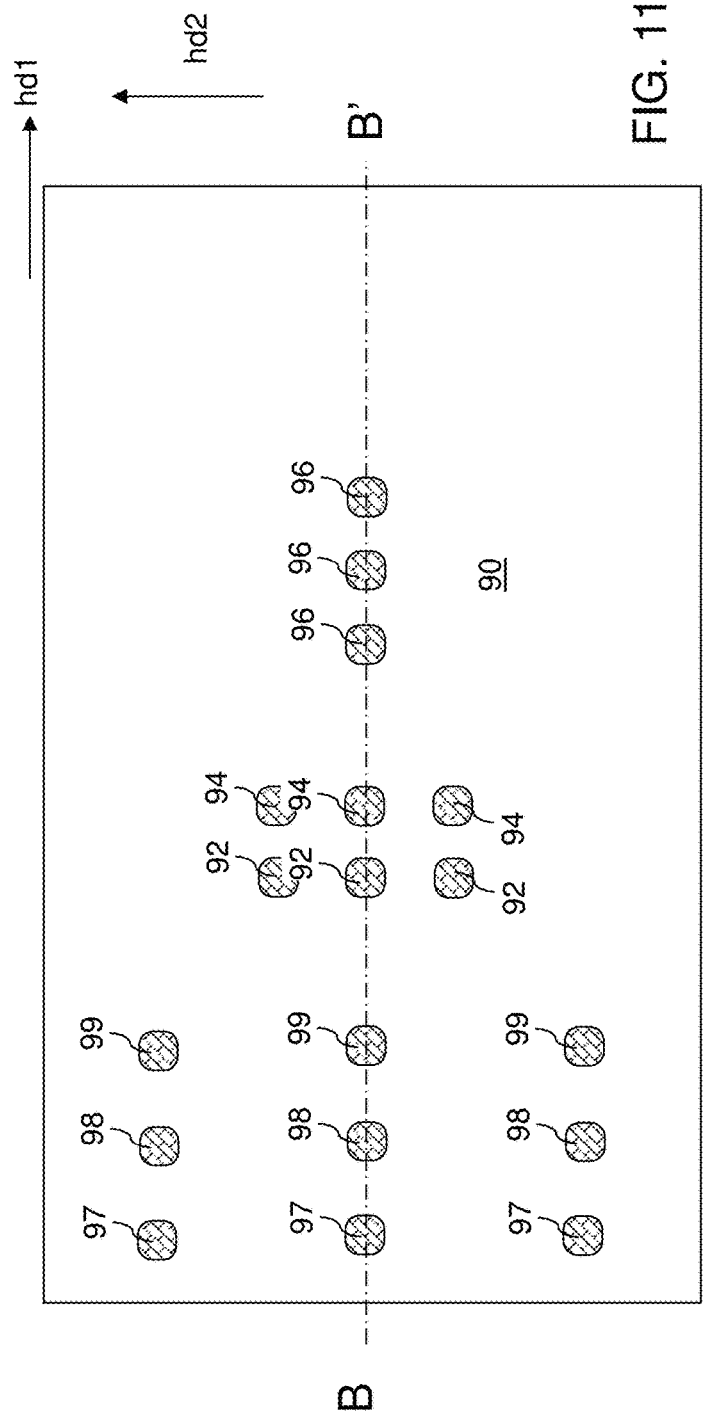
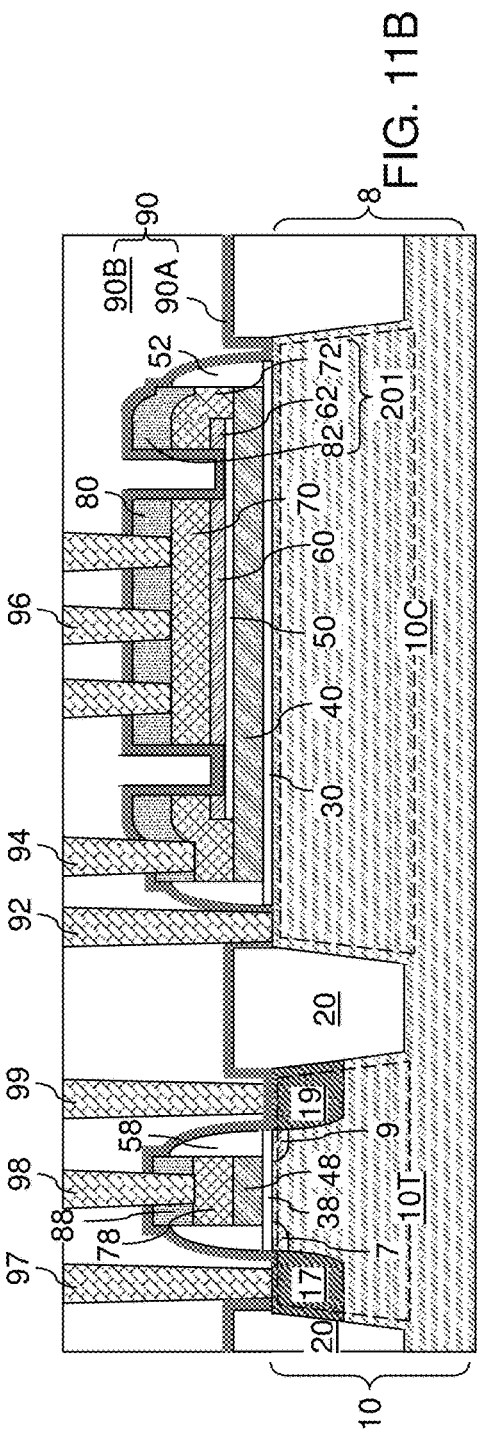
FIG. 11A
FIG. 11B

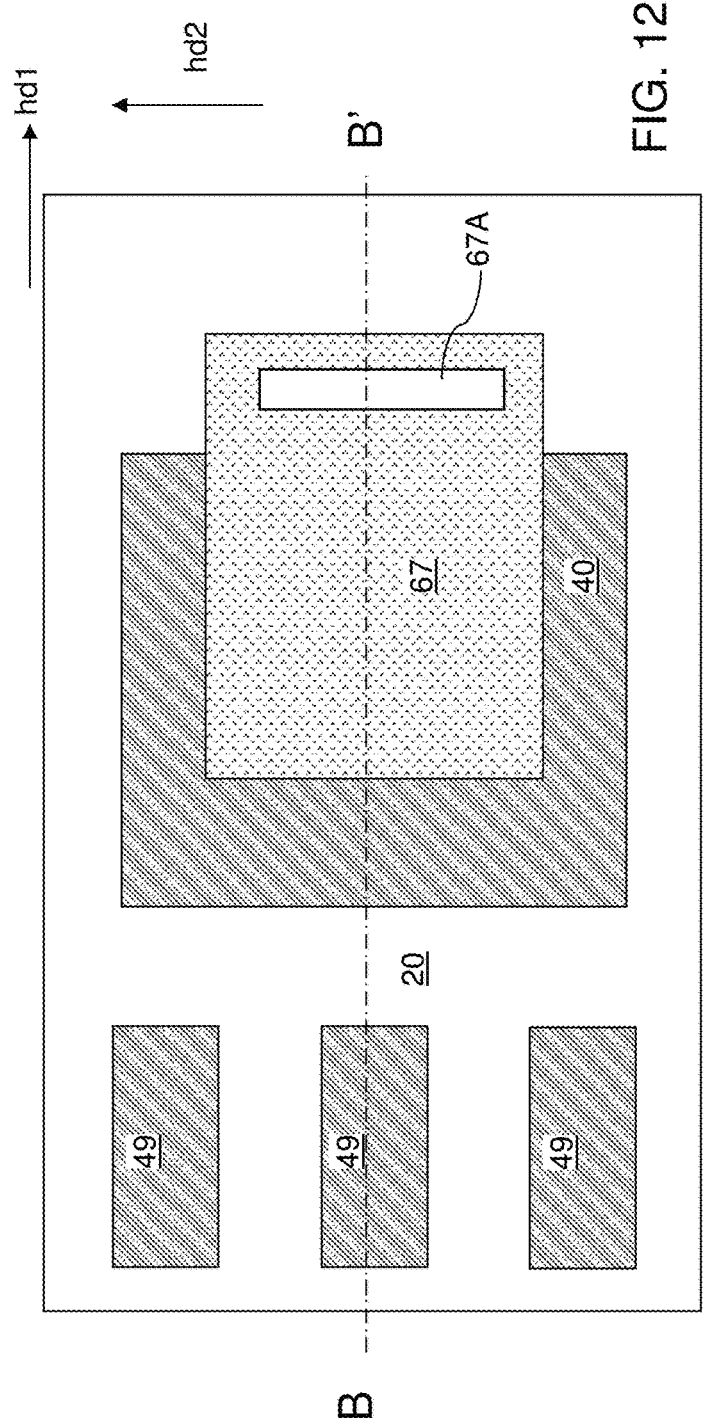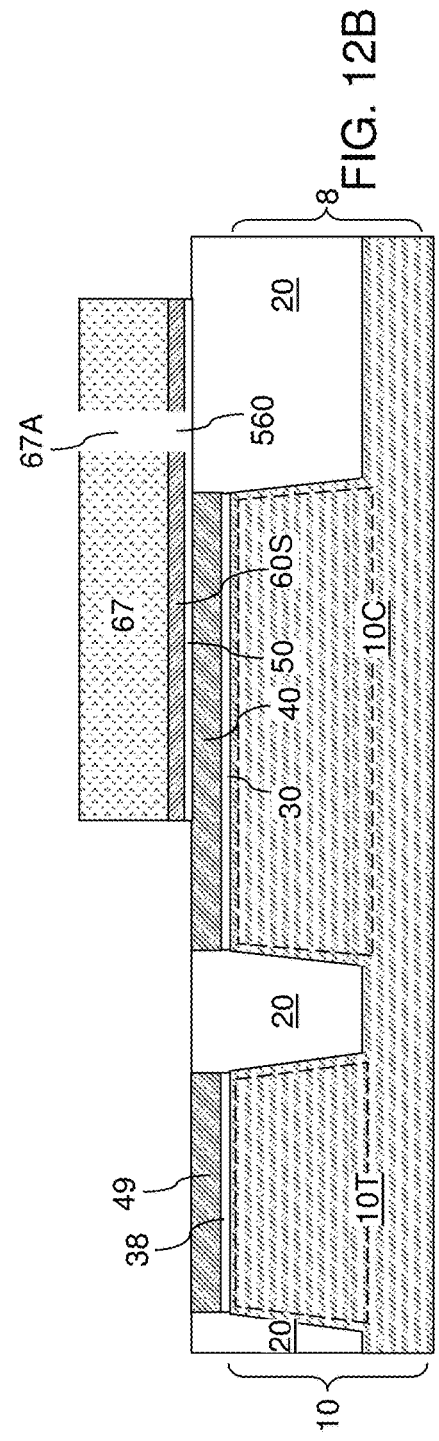

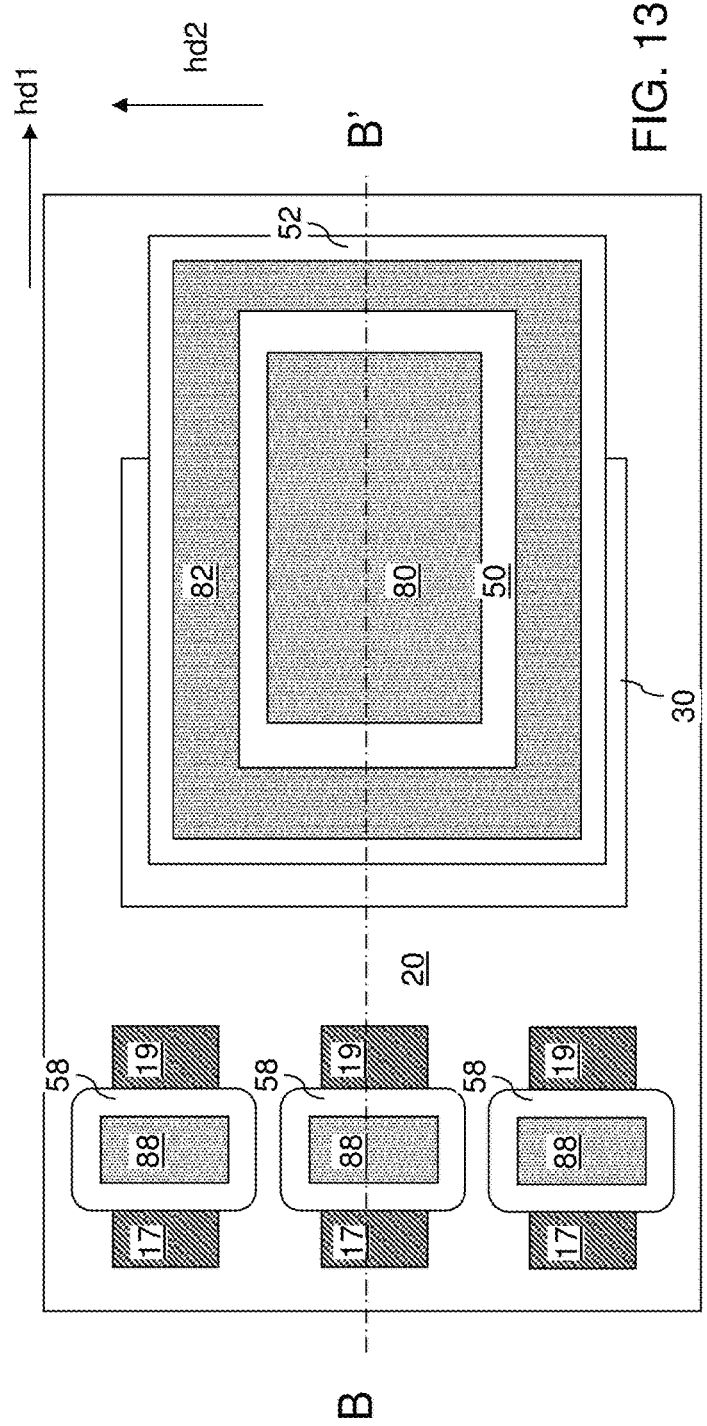
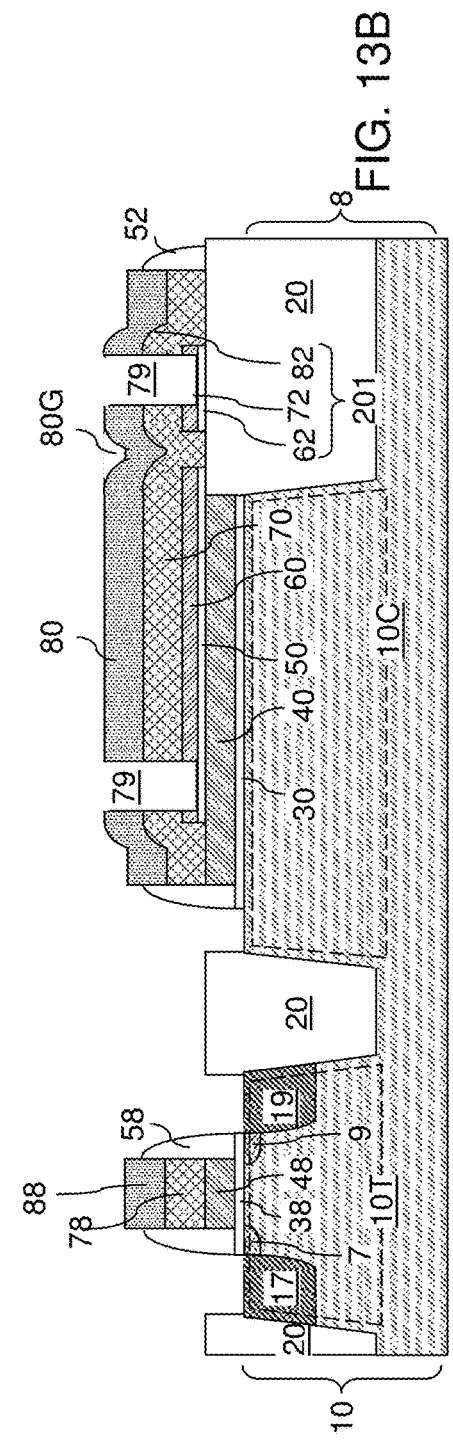

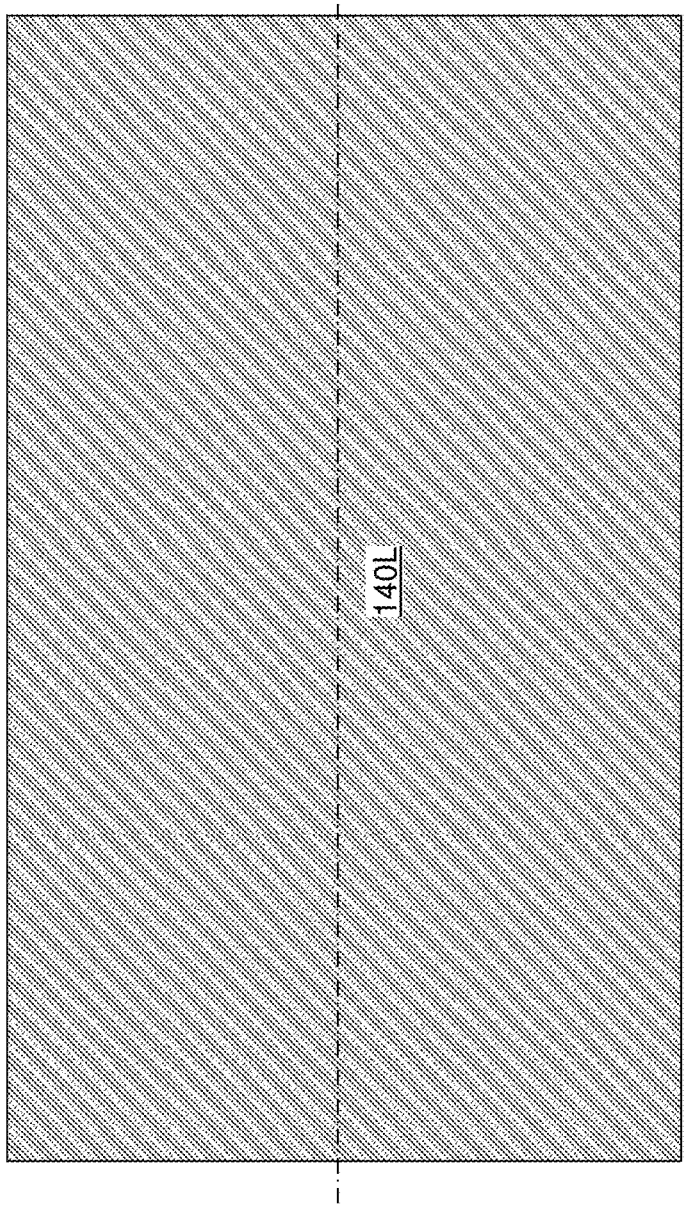
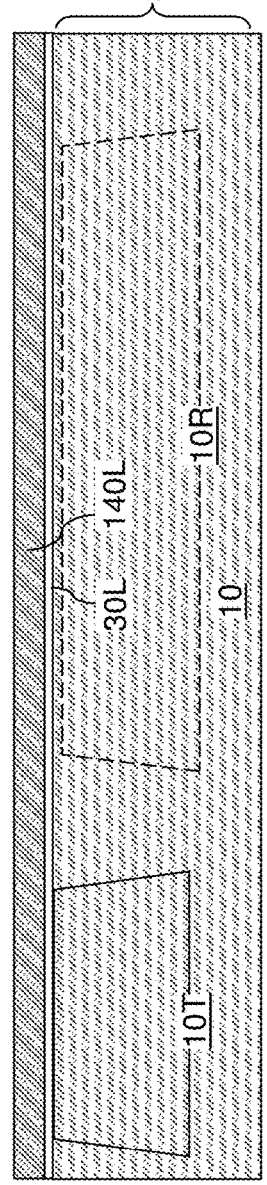

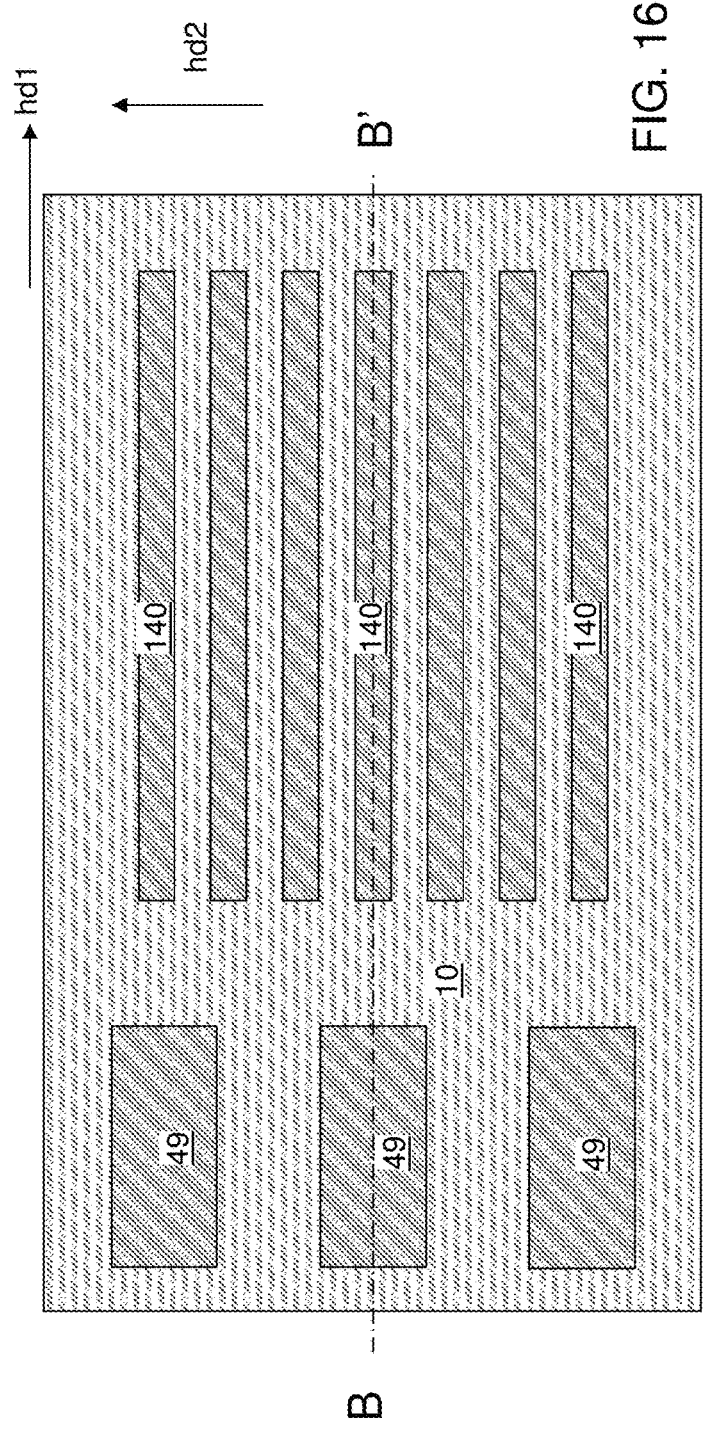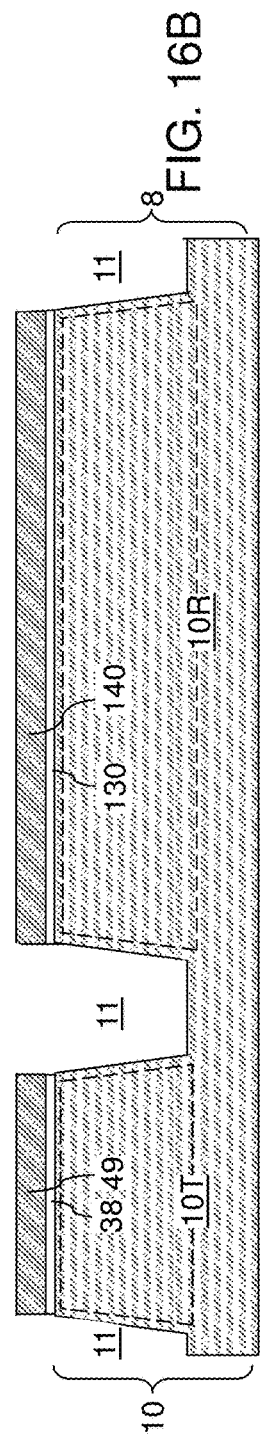

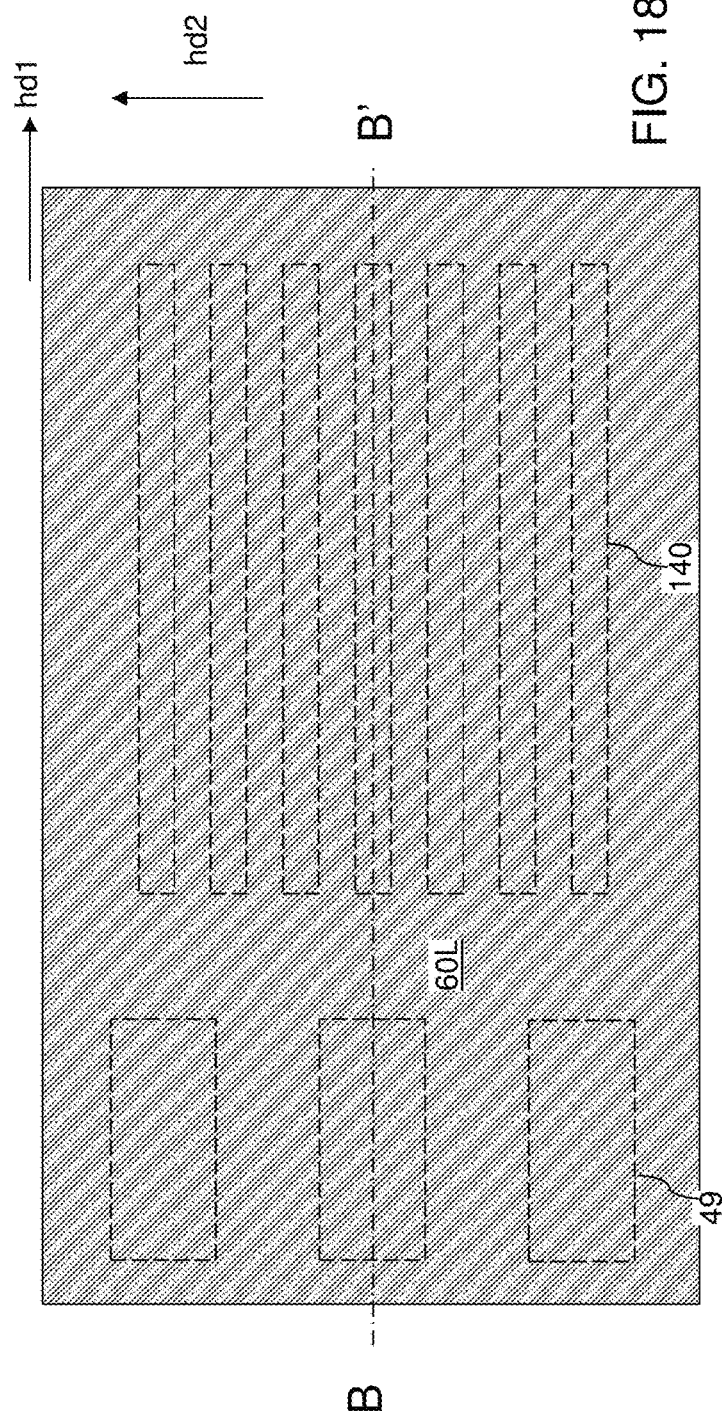
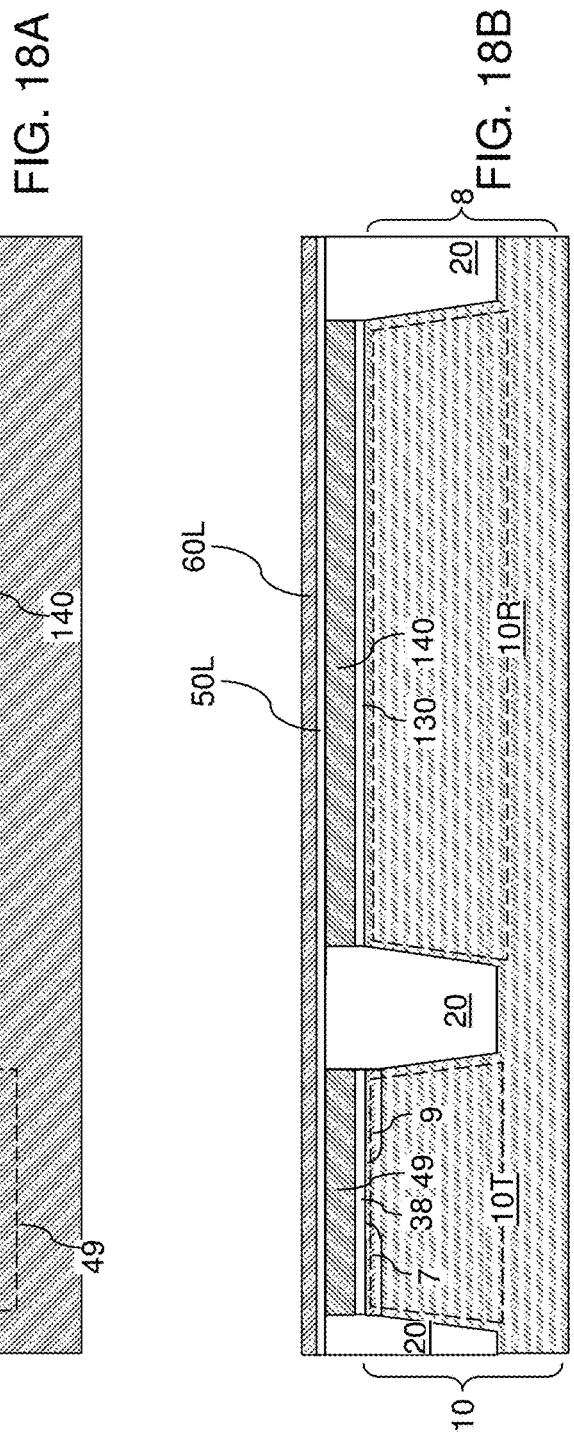

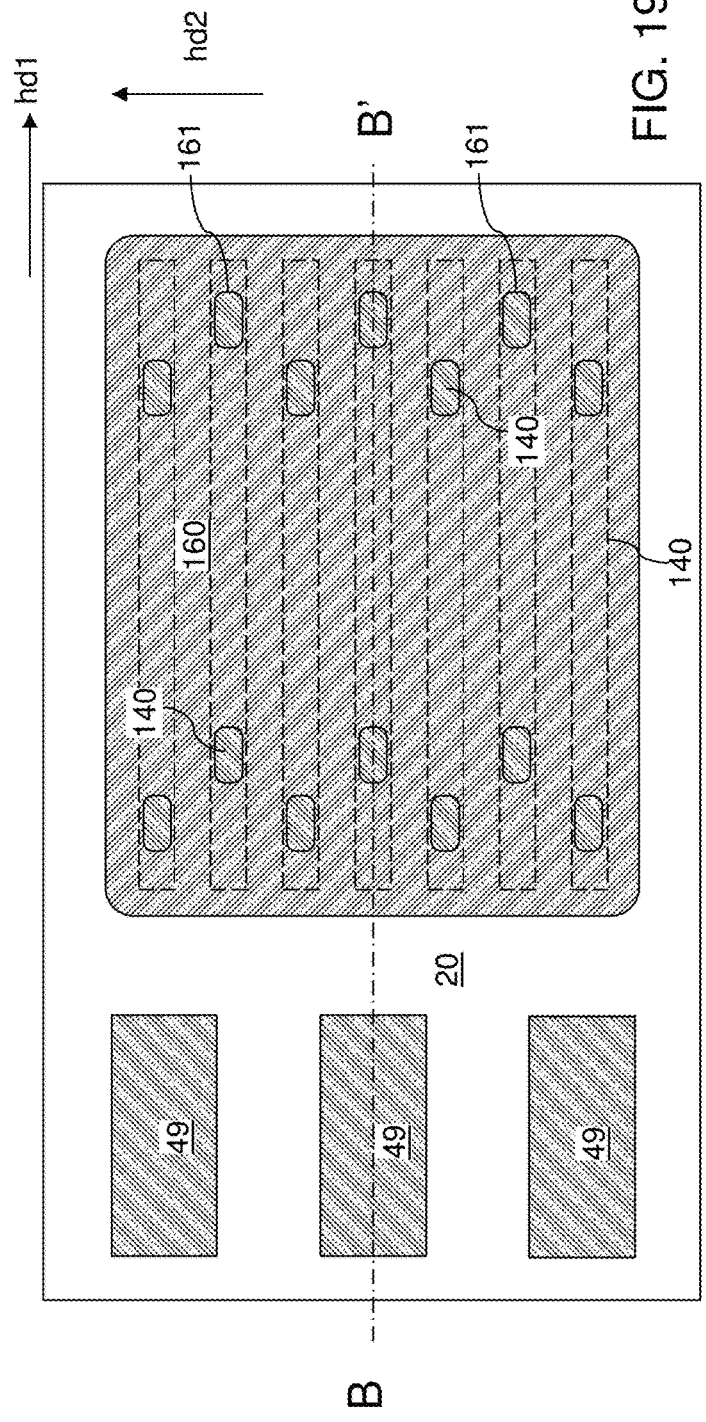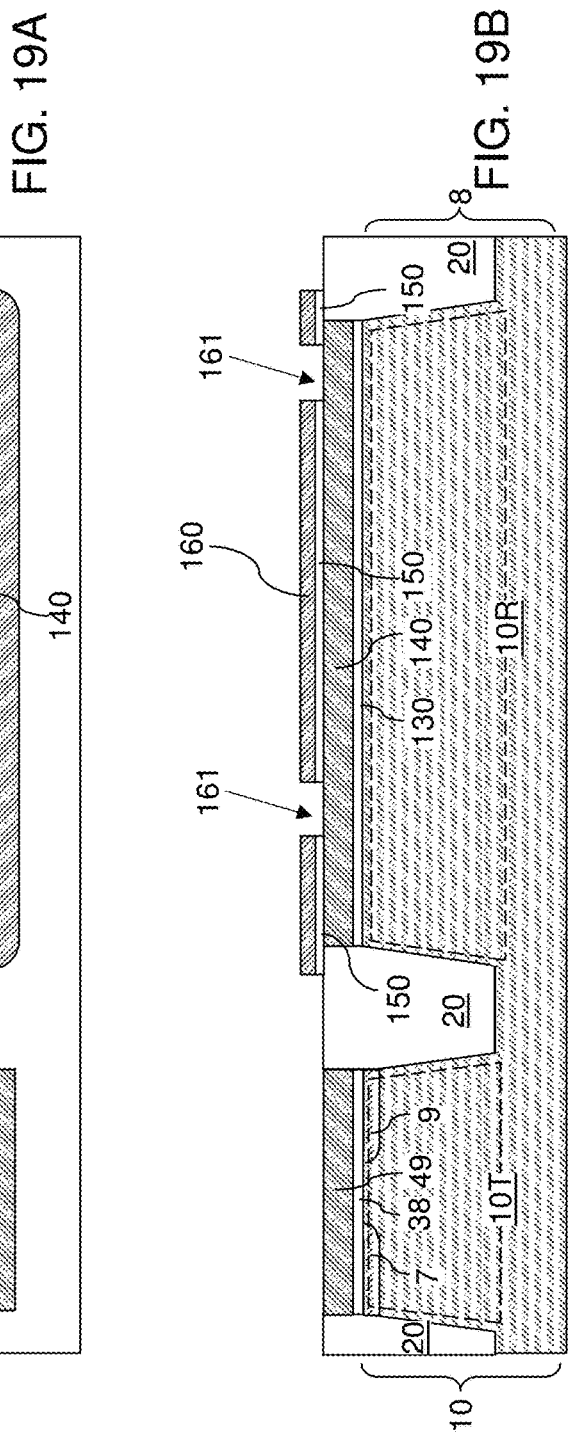

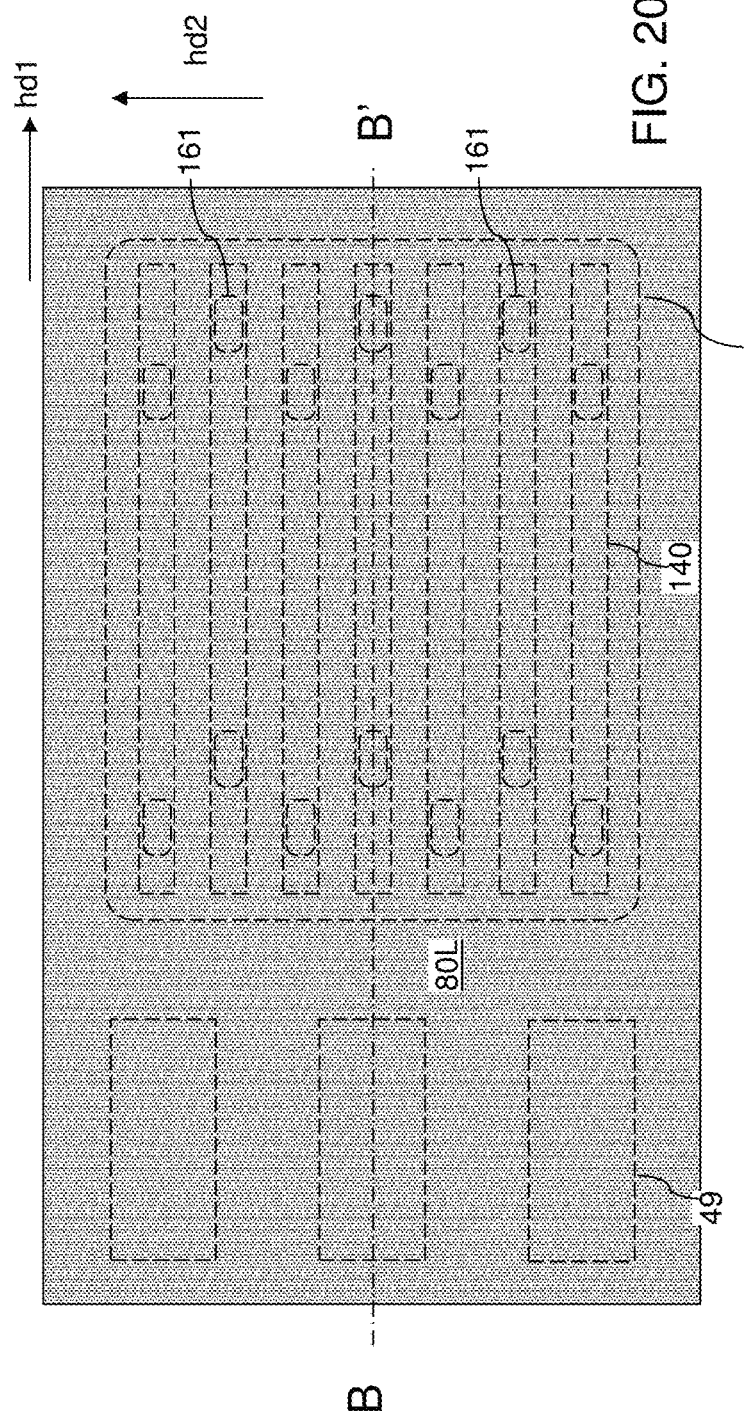
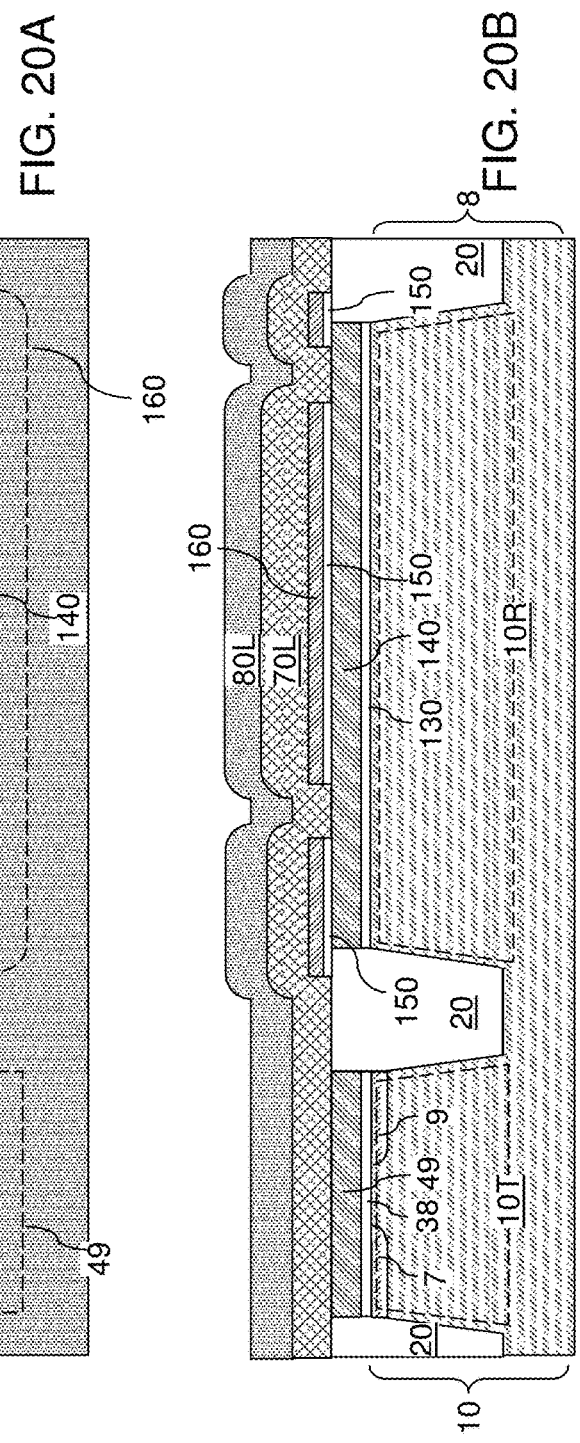
FIG. 20A
FIG. 20B

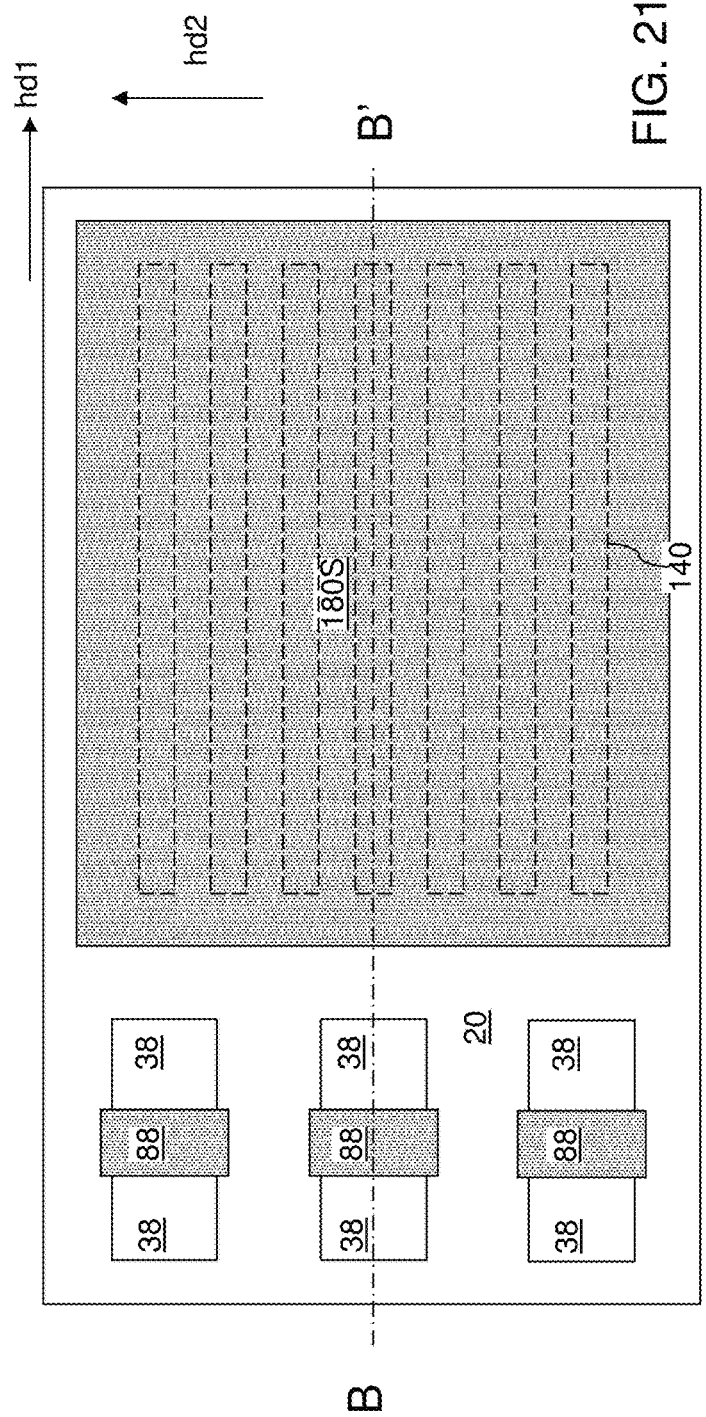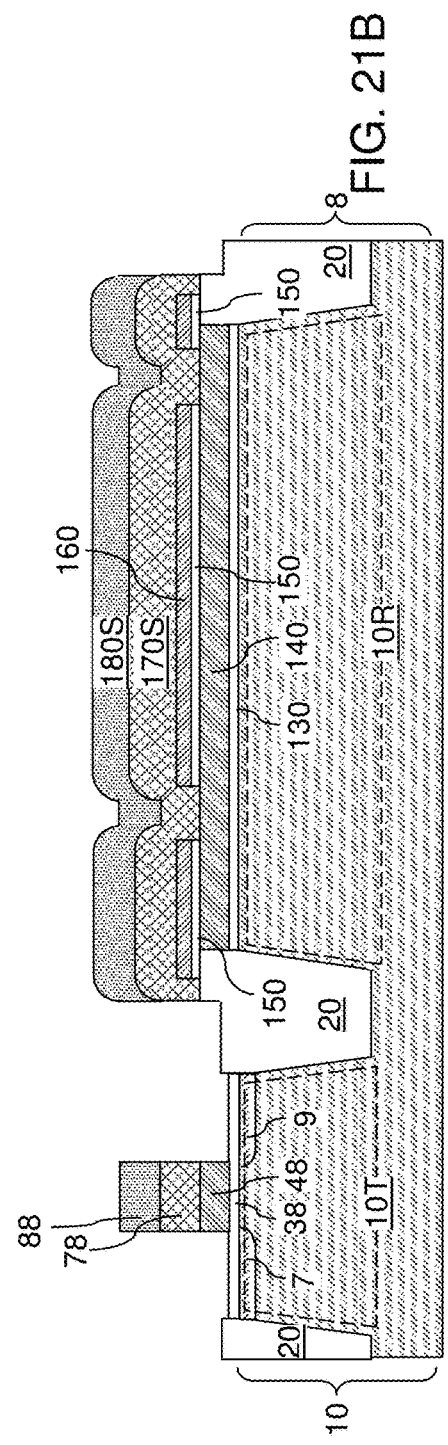

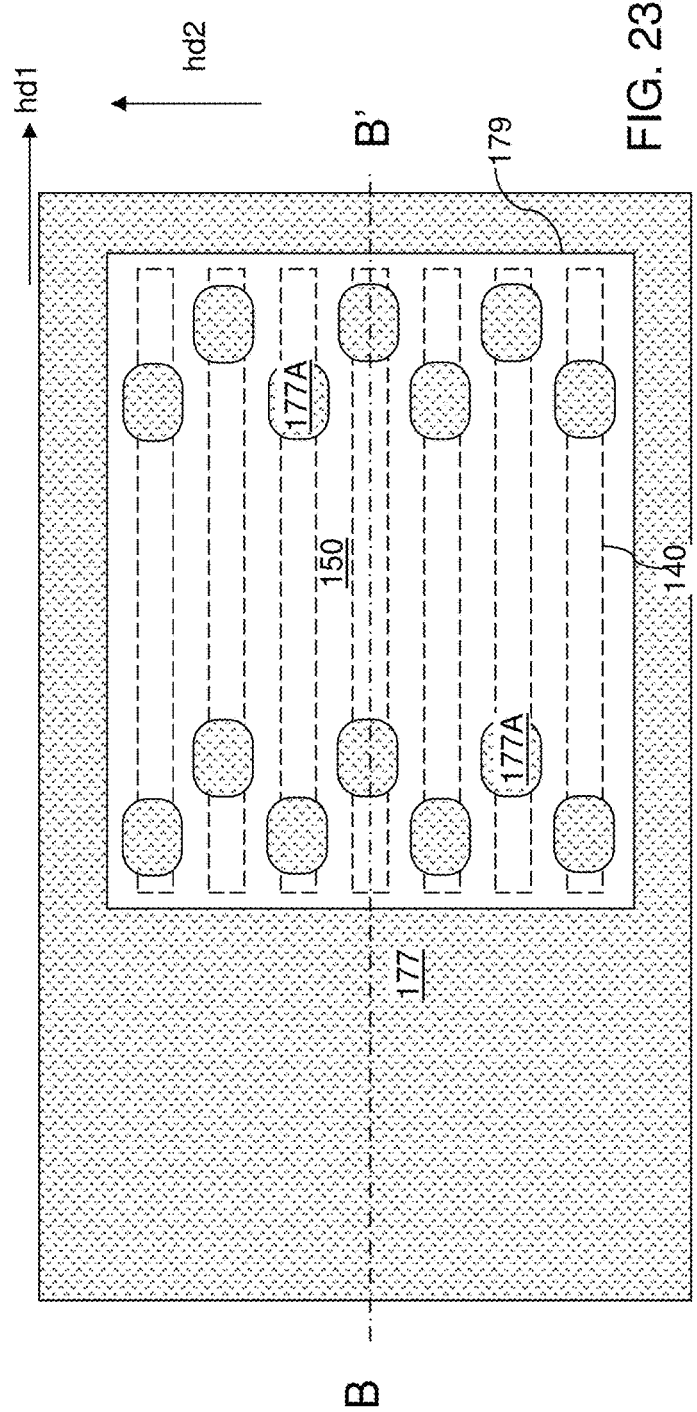
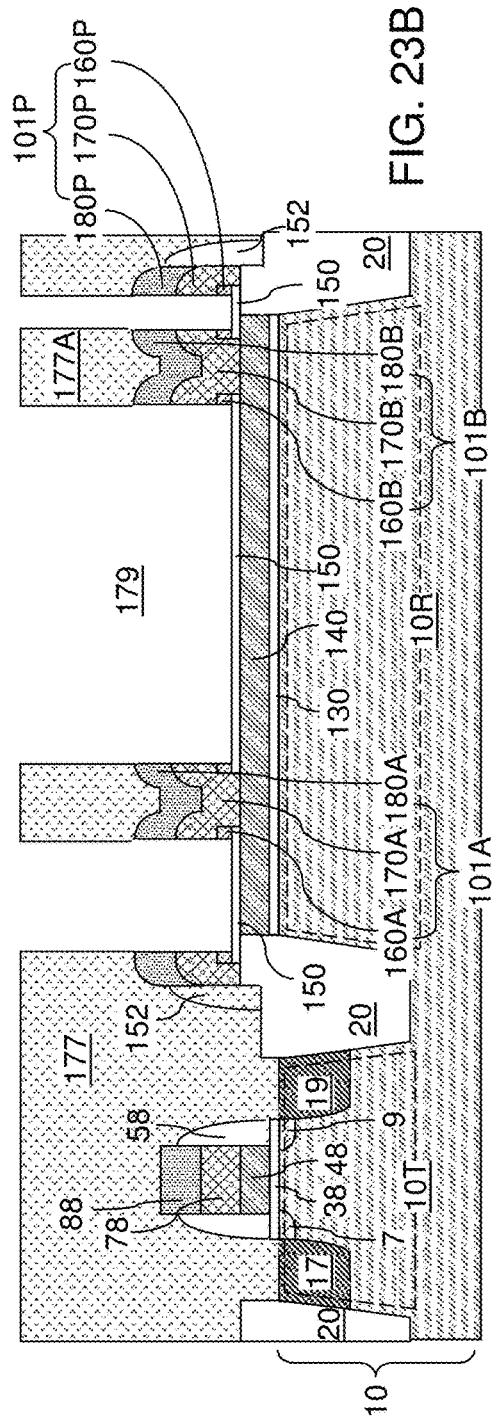
FIG. 23A
FIG. 23B

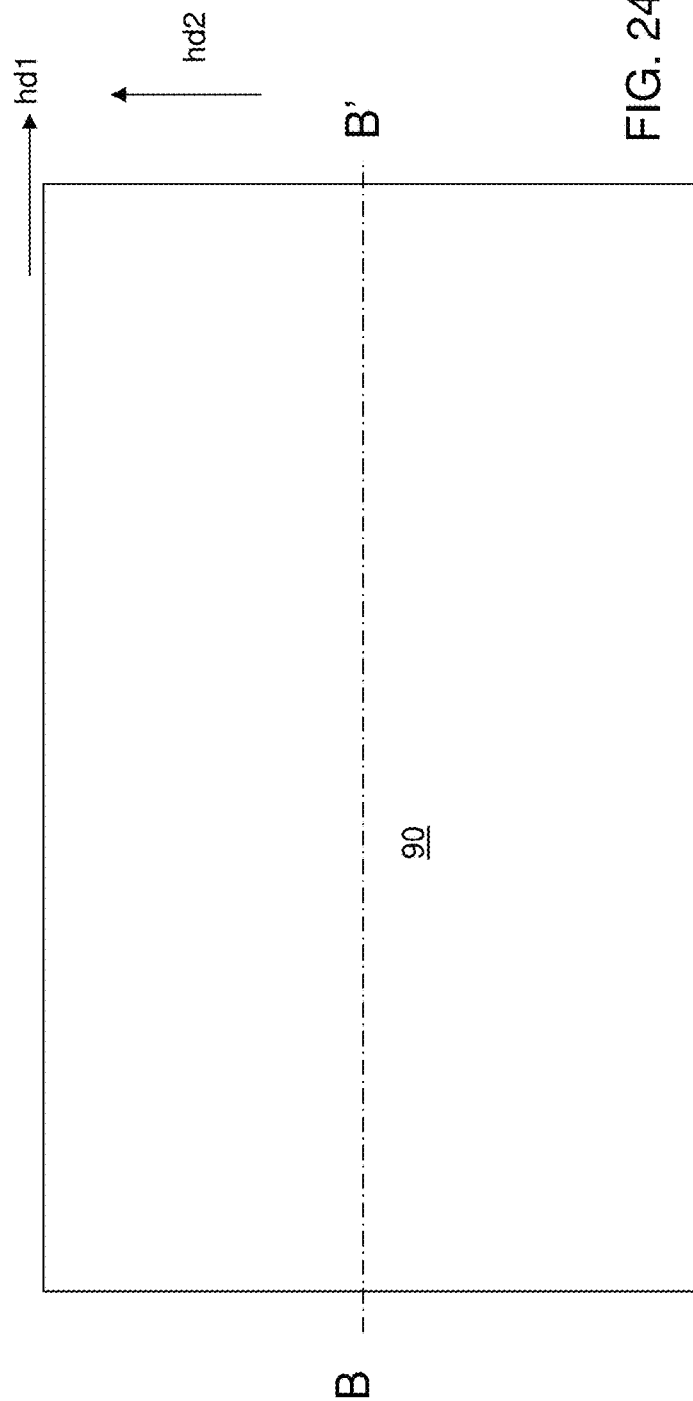
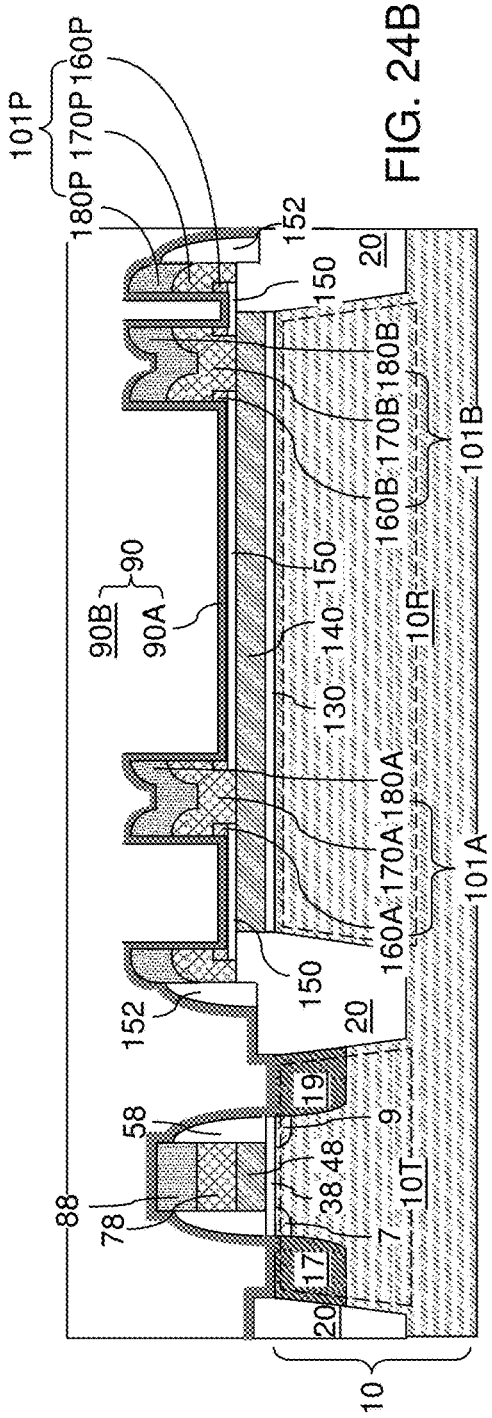

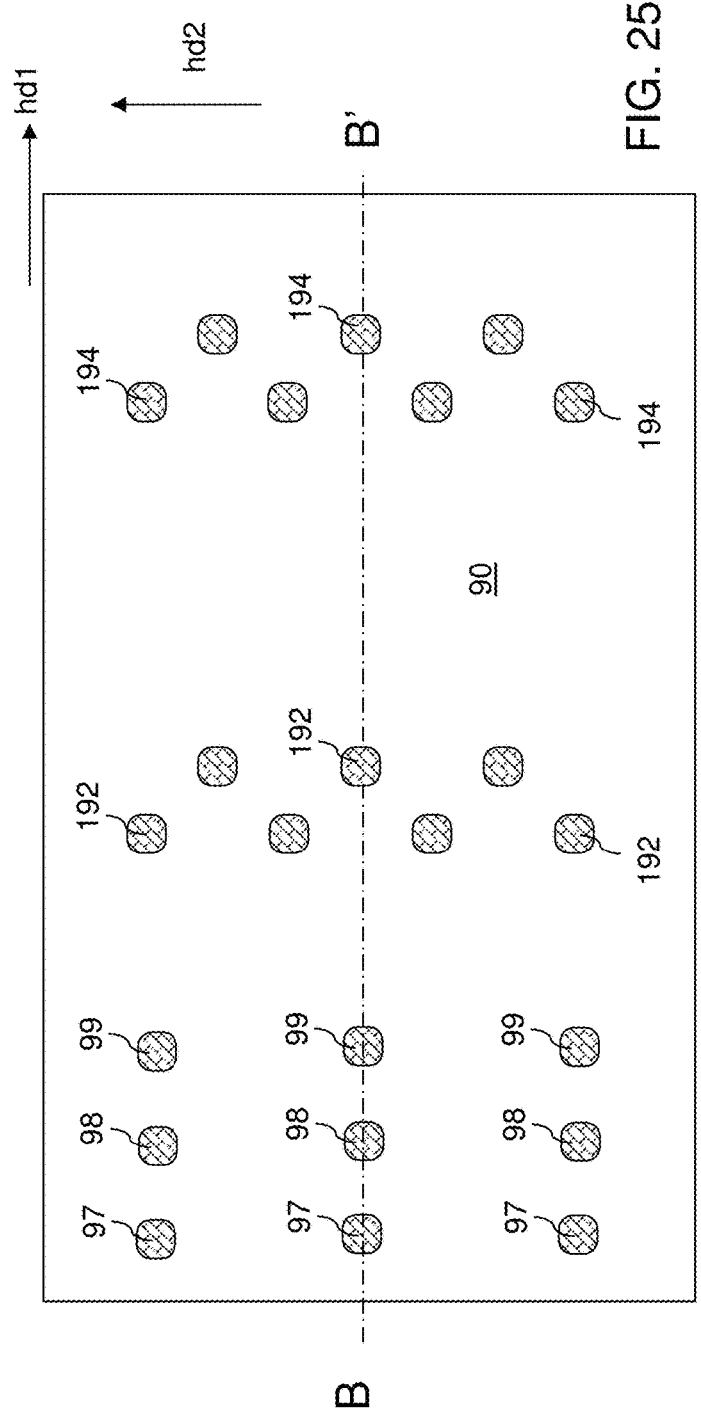
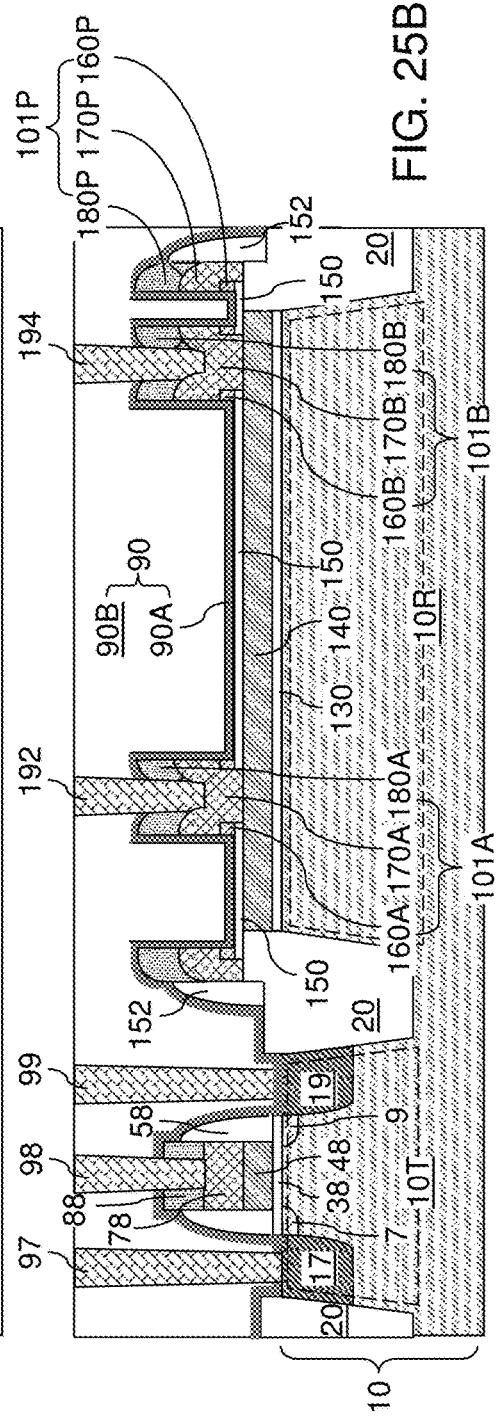

GATE MATERIAL-BASED CAPACITOR AND RESISTOR STRUCTURES AND METHODS OF FORMING THE SAME

FIELD

The present disclosure relates generally to the field of semiconductor devices, and particularly to gate material-based capacitor and resistor structures and methods of manufacturing the same.

BACKGROUND

Passive devices, such as capacitor and resistor structures may be used in conjunction with transistors to provide various circuits. Manufacture of capacitor and resistor structures requires many processing steps which can contribute to process complexity and the total cost of manufacture for a semiconductor die.

SUMMARY

According to an aspect of the present disclosure, a semiconductor structure is provided, which comprises a capacitor structure located on a semiconductor substrate including a substrate semiconductor layer. The capacitor structure comprises: a first electrode comprising a first substrate semiconductor portion of the substrate semiconductor layer; a first node dielectric located on a top surface of the first substrate semiconductor portion of the substrate semiconductor layer; a second electrode comprising a first semiconductor plate and located on a top surface of the first node dielectric; a second node dielectric located on a top surface of the first semiconductor plate; a third electrode comprising a stack of a second semiconductor plate and a primary metallic plate; a moat trench laterally surrounding the third electrode; a peripheral stack laterally surrounding the third electrode, wherein the peripheral stack comprises a peripheral semiconductor plate and a peripheral metallic plate, and wherein the peripheral semiconductor plate contacts a peripheral portion of a top surface of the second node dielectric, comprises a same material as the second semiconductor plate, and is laterally spaced from the second semiconductor plate; and at least one contact-level dielectric layer laterally extending over the third electrode and the peripheral stack.

According to another aspect of the present disclosure, a method of forming a semiconductor structure comprising a capacitor structure on a semiconductor substrate including a substrate semiconductor layer is provided. The method comprises: forming a first stack including a first node dielectric and a first semiconductor plate on a top surface the first substrate semiconductor portion of the substrate semiconductor layer; forming a second stack including a second node dielectric and a semiconductor sheet over the first stack; forming a metallic sheet over the second stack and a peripheral portion of a top surface of the first semiconductor plate; dividing the metallic sheet and the semiconductor sheet into an inner layer stack surrounded by a moat trench and a peripheral stack surrounding the moat trench, wherein sidewalls of the layer stack and sidewalls of the peripheral stack are physically exposed in the moat trench; forming at least one contact-level dielectric layer directly on the sidewalls of the inner layer stack and the sidewalls of the peripheral stack; and forming contact via structures through the at least one contact-level dielectric layer on the layer stack and on the peripheral stack, wherein: the inner layer stack comprises a primary semiconductor plate and a primary metallic plate; the peripheral stack includes a peripheral semiconductor plate and a peripheral metallic plate; the primary semiconductor plate and the peripheral semiconductor plate are patterned portions of the semiconductor sheet; and the primary metallic plate and the peripheral metallic plate are patterned portions of the metallic sheet.

According to yet another aspect of the present disclosure, a semiconductor structure is provided, which comprises a resistor structure located on a semiconductor substrate including a substrate semiconductor layer. The resistor structure comprises: a first resistor isolation dielectric located on a top surface of a first substrate semiconductor portion of the substrate semiconductor layer; a semiconductor material strip located on a top surface of the first resistor isolation dielectric; a first resistor contact assembly comprising a first semiconductor plate including an opening therein and a first metallic plate extending through an opening in the first semiconductor plate and contacting a first area of a top surface of the semiconductor material strip; a second resistor contact assembly comprising a second semiconductor plate including an opening therein and a second metallic plate extending through an opening in the second semiconductor plate and contacting a second area of the top surface of the semiconductor material strip; and a peripheral stack comprising a peripheral semiconductor plate and a peripheral metallic plate and electrically isolated from the semiconductor material strip, wherein the peripheral semiconductor plate comprises a same material as the first semiconductor plate and the second semiconductor plate, and the peripheral metallic plate comprises a same material as the first metallic plate and the second metallic plate.

According to still another aspect of the present disclosure, a method of forming a semiconductor structure comprising a resistor structure on a semiconductor substrate including a substrate semiconductor layer is provided. The method comprises: forming a first stack including a first resistor isolation dielectric and a semiconductor material strip on a top surface the first substrate semiconductor portion of the substrate semiconductor layer; forming a second stack including a second resistor isolation dielectric and a semiconductor sheet over the first stack, wherein the second stack comprises openings therethrough, and a portion of a top surface of the semiconductor material strip is physically exposed at a bottom of each of the openings in the second stack; forming a metallic sheet over the second stack and on physically exposed portions of the top surface of the semiconductor material strip; and dividing the metallic sheet and the semiconductor plate into patterned portions that comprise a first resistor contact assembly and a second resistor contact assembly. In one embodiment, the first resistor contact assembly comprises a first semiconductor plate including an opening therein and a first metallic plate extending through an opening in the first semiconductor plate and contacting a first area of a top surface of the semiconductor material strip; and the second resistor contact assembly comprising a second semiconductor plate including an opening therein and a second metallic plate extending through an opening in the second semiconductor plate and contacting a second area of the top surface of the semiconductor material strip.

BRIEF DESCRIPTION OF THE DRAWINGS

FIG. 1A is a schematic vertical cross-sectional view of a first exemplary structure after formation of a first isolation dielectric layer and a first semiconductor material layer according to a first embodiment of the present disclosure.

FIG. 1B is a top-down view of the first exemplary structure along the vertical plane B-B' of FIG. 1A.

FIG. 3A is a schematic vertical cross-sectional view of the first exemplary structure after formation of a shallow isolation structure according to the first embodiment of the present disclosure.

FIG. 3B is a top-down view of the first exemplary structure along the vertical plane B-B' of FIG. 3A.

FIG. 4A is a schematic vertical cross-sectional view of the first exemplary structure after formation of a second isolation dielectric layer and a second semiconductor material layer according to the first embodiment of the present disclosure.

FIG. 4B is a top-down view of the first exemplary structure along the vertical plane B-B' of FIG. 4A.

FIG. 5A is a schematic vertical cross-sectional view of the first exemplary structure after formation of a second node dielectric and a semiconductor sheet according to the first embodiment of the present disclosure.

FIG. 5B is a top-down view of the first exemplary structure along the vertical plane B-B' of FIG. 5A.

FIG. 6A is a schematic vertical cross-sectional view of the first exemplary structure after formation of a metallic material layer and a dielectric cap layer according to the first embodiment of the present disclosure.

FIG. 6B is a top-down view of the first exemplary structure along the vertical plane B-B' of FIG. 6A.

FIG. 7A is a schematic vertical cross-sectional view of the first exemplary structure after patterning the dielectric cap layer, the metallic material layer, a first semiconductor plate, and a gate semiconductor material portion and after formation of source and drain extension regions according to the first embodiment of the present disclosure.

FIG. 7B is a top-down view of the first exemplary structure along the vertical plane B-B' of FIG. 7A.

FIG. 8A is a schematic vertical cross-sectional view of the first exemplary structure after formation of a dielectric capacitor spacer, a dielectric gate spacer, and source and drain regions according to the first embodiment of the present disclosure.

FIG. 8B is a top-down view of the first exemplary structure along the vertical plane B-B' of FIG. 8A.

FIG. 9A is a schematic vertical cross-sectional view of the first exemplary structure after formation of a moat trench that patterns a stack of the semiconductor sheet and the metallic sheet into a primary semiconductor plate, a primary metallic plate, a peripheral semiconductor plate, and a peripheral metallic plate according to the first embodiment of the present disclosure.

FIG. 9B is a top-down view of the first exemplary structure along the vertical plane B-B' of FIG. 9A.

FIG. 10A is a schematic vertical cross-sectional view of the first exemplary structure after formation of at least one contact-level dielectric layer according to the first embodiment of the present disclosure.

FIG. 10B is a top-down view of the first exemplary structure along the vertical plane B-B' of FIG. 10A.

FIG. 11A is a schematic vertical cross-sectional view of the first exemplary structure after formation of contact via structures according to the first embodiment of the present disclosure.

FIG. 11B is a top-down view of the first exemplary structure along the vertical plane B-B' of FIG. 11A.

FIG. 12A is a schematic vertical cross-sectional view of an alternative configuration of the first exemplary structure after formation of a second node dielectric and a semiconductor sheet according to the first embodiment of the present disclosure.

FIG. 12B is a top-down view of the first exemplary structure along the vertical plane B-B' of FIG. 12A.

FIG. 13A is a schematic vertical cross-sectional view of an alternative configuration of the first exemplary structure after formation of a moat trench that patterns a stack of the semiconductor sheet and the metallic sheet into a primary semiconductor plate, a primary metallic plate, a peripheral semiconductor plate, and a peripheral metallic plate according to the first embodiment of the present disclosure.

FIG. 13B is a top-down view of the alternative configuration of the first exemplary structure along the vertical plane B-B' of FIG. 13A.

FIG. 15A is a schematic vertical cross-sectional view of a second exemplary structure after formation of a first isolation dielectric layer and a first semiconductor material layer according to a first embodiment of the present disclosure.

FIG. 15B is a top-down view of the first exemplary structure along the vertical plane B-B' of FIG. 15A.

FIG. 16A is a schematic vertical cross-sectional view of the second exemplary structure after formation of shallow isolation trenches according to the second embodiment of the present disclosure.

FIG. 16B is a top-down view of the second exemplary structure along the vertical plane B-B' of FIG. 16A.

FIG. 18A is a schematic vertical cross-sectional view of the second exemplary structure after formation of a second isolation dielectric layer and a second semiconductor material layer according to the second embodiment of the present disclosure.

FIG. 18B is a top-down view of the second exemplary structure along the vertical plane B-B' of FIG. 18A.

FIG. 19A is a schematic vertical cross-sectional view of the second exemplary structure after formation of a second resistor isolation dielectric and a semiconductor sheet according to the second embodiment of the present disclosure.

FIG. 19B is a top-down view of the second exemplary structure along the vertical plane B-B' of FIG. 19A.

FIG. 20A is a schematic vertical cross-sectional view of the second exemplary structure after formation of a metallic material layer and a dielectric cap layer according to the second embodiment of the present disclosure.

FIG. 20B is a top-down view of the second exemplary structure along the vertical plane B-B' of FIG. 20A.

FIG. 21A is a schematic vertical cross-sectional view of the second exemplary structure after patterning the dielectric cap layer, the metallic material layer, and a gate semiconductor material portion and after formation of source and drain extension regions according to the second embodiment of the present disclosure.

FIG. 21B is a top-down view of the second exemplary structure along the vertical plane B-B' of FIG. 21A.

FIG. 23A is a schematic vertical cross-sectional view of the second exemplary structure after formation of a moat trench that patterns a layer stack of a semiconductor sheet, a metallic sheet, and a dielectric cap sheet into resistor contact assemblies and a peripheral stack according to the second embodiment of the present disclosure.

FIG. 23B is a top-down view of the second exemplary structure along the vertical plane B-B' of FIG. 23A.

FIG. 24A is a schematic vertical cross-sectional view of the second exemplary structure after formation of at least one contact-level dielectric layer according to the second embodiment of the present disclosure.

FIG. 24B is a top-down view of the second exemplary structure along the vertical plane B-B' of FIG. 24A.

FIG. 25A is a schematic vertical cross-sectional view of the second exemplary structure after formation of contact via structures according to the second embodiment of the present disclosure.

FIG. 25B is a top-down view of the second exemplary structure along the vertical plane B-B' of FIG. 25A.

DETAILED DESCRIPTION

Figure 2A:
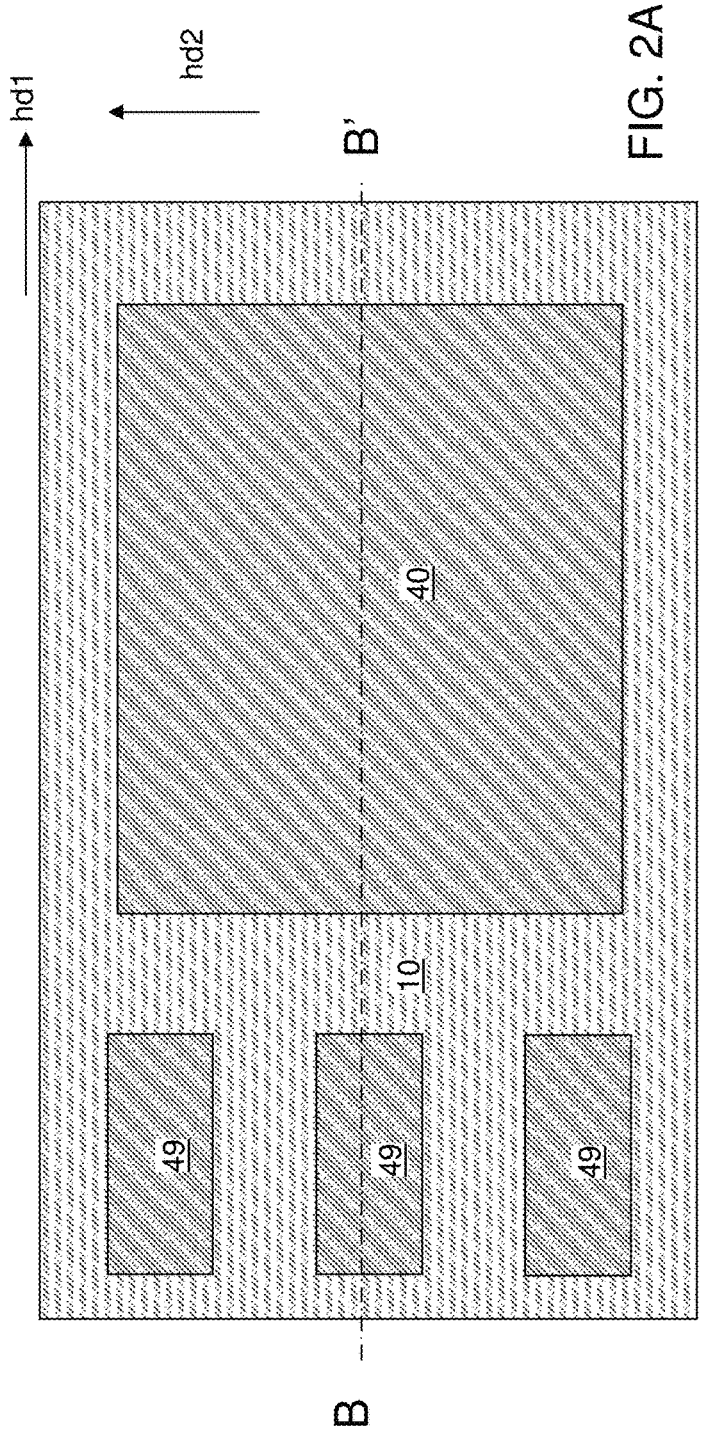
FIG. 2A is a schematic vertical cross-sectional view of the first exemplary structure after formation of shallow isolation trenches according to the first embodiment of the present disclosure.

As discussed above, the present disclosure is directed to gate material-based capacitor structures and resistor structures and methods of manufacturing the same, the various aspects of which are described below. The embodiments of the present disclosure can be employed to form capacitor structures and resistor structures that incorporate electrically conductive layers that are employed to form gate structures of adjacent field effect transistors. The field effect transistors, capacitors and resistors may be used in any suitable semiconductor device, such as in a driver circuit of a three dimensional NAND memory device.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous structure that has a thickness less than the thickness of the structure. For example, a layer may be located between any pair of horizontal planes between, or at, a top surface and a bottom surface of the structure. A layer may extend horizontally, vertically, and/or along a tapered surface. A substrate may be a layer, may include one or more layers therein, or may have one or more layer thereupon, thereabove, and/or therebelow.

Referring to FIGS. 1A and 1B, a first exemplary structure according to a first embodiment of the present disclosure includes a substrate that contains a substrate semiconductor layer 10. The substrate 8 can be a semiconductor substrate including a semiconductor material at least at an upper portion thereof. The substrate 8 may be a bulk semiconductor substrate or a semiconductor-on-insulator (SOI) substrate including a top semiconductor (e.g., silicon) layer (which corresponds to the substrate semiconductor layer 10), a buried insulating layer (not shown), and a handle substrate. In one embodiment, the substrate 8 may be a commercially available semiconductor wafer such as a silicon wafer.

The substrate semiconductor layer 10 as provided may include a semiconductor material. As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Generally, the substrate semiconductor layer 10 may include any semiconductor material known in the art. For example, single crystalline silicon, a silicon-germanium alloy, polysilicon, a III-V semiconductor material, a III-VI semiconductor material, or any other semiconductor material may be employed for the substrate semiconductor layer 10. In one embodiment, the substrate semiconductor layer 10 may include single crystalline silicon, and may comprise either a doped well in the upper portion of a single crystal silicon wafer or an epitaxial, single crystal silicon layer grown on the top surface of the single crystal silicon wafer. In one embodiment, the substrate semiconductor layer 10 as provided may include dopants of a first conductivity type (which may be p-type or n-type) at an atomic concentration in a range from $1.0 \times 10^{14}/cm^3$ to $1.0 \times 10^{18}/cm^3$, although lesser and greater dopant concentrations may also be employed. The substrate semiconductor layer 10 includes a first substrate semiconductor portion 10C located in a first device area (in which a capacitor structure is subsequently formed) and second substrate semiconductor portions 10T located in a second device area (in which field effect transistors are subsequently formed).

In one embodiment, the first substrate semiconductor portion 10C can be suitable doped by implanting dopants into the first substrate semiconductor portion 10C. For example, electrical dopants of the first conductivity type or a second conductivity type that is the opposite of the first conductivity type can be implanted into the first substrate semiconductor portion 10C by performing a patterned ion implantation process. In one embodiment, a surface region of the first substrate semiconductor portion 10C may include electrical dopants at an atomic concentration in a range from $5.0 \times 10^{19}/cm^3$ to $2.0 \times 10^{21}/cm^3$ to render the implanted surface region of the first substrate semiconductor portion 10C electrically conductive. The conductive region of the first substrate semiconductor portion 10C comprises a first electrode of a capacitor structure to be subsequently formed. The conductive region of the first substrate semiconductor portion 10C may be limited to a surface region having a thickness in a range from 10 nm to 200 nm, or may occupy the entire volume of the first substrate semiconductor portion 10C.

A first isolation dielectric layer 30L can be formed over the entire top surface of the substrate semiconductor layer 10. The first isolation dielectric layer 30L can be formed over the first substrate semiconductor portion 10C and each of the second substrate semiconductor portions 10T of the substrate semiconductor layer 10. The first isolation dielectric layer 30L includes at least one dielectric material that may be employed as a gate dielectric, and thus, is also referred to as a gate dielectric layer. The first isolation dielectric layer 30L can include silicon oxide, silicon nitride and/or a dielectric metal oxide (such as aluminum oxide, hafnium oxide, lanthanum oxide, tantalum pentoxide, etc.). The first isolation dielectric layer 30L may be formed by thermal oxidation of the semiconductor material of the substrate semiconductor layer 10, and/or may be formed by deposition of a high quality dielectric material such as a dielectric metal oxide, silicon nitride and/or silicon oxide employing chemical vapor deposition or atomic layer deposition. The thickness of the first isolation dielectric layer 30L may be in a range from 1 nm to 20 nm, such as from 2 nm to 12 nm and/or from 4 nm to 8 nm, although lesser and greater thicknesses may also be employed.

A first semiconductor material layer 40L can be deposited over, and directly on, the first isolation dielectric layer 30L. The first semiconductor material layer 40L can include a doped semiconductor material having a doping of the first conductivity type or the second conductivity type. In one embodiment, the first semiconductor material layer 40L may include amorphous silicon, polysilicon, or a silicon-germanium alloy. In one embodiment, the first semiconductor material layer 40L may be electrically conductive. The first semiconductor material layer 40L may be deposited employing chemical vapor deposition. The first semiconductor material layer 40L may be in-situ doped with electrical dopants during deposition of the first semiconductor material layer 40L, or may be ex-situ doped after deposition of an intrinsic semiconductor material by performing a low energy ion implantation process. The thickness of the first semiconductor material layer 40L may be in a range from 20 nm to 200 nm, such as 40 nm to 60 nm, although lesser and greater thicknesses may also be employed.

Figure 2B:
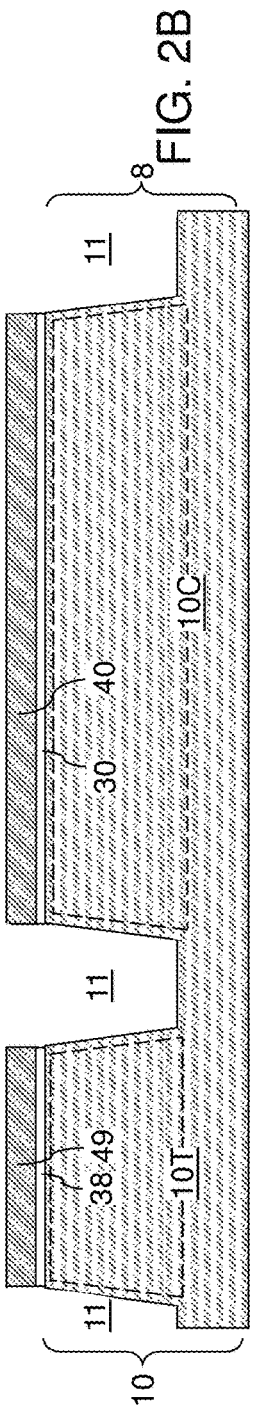
FIG. 2B is a top-down view of the first exemplary structure along the vertical plane B-B' of FIG. 2A.

Referring to FIGS. 2A and 2B, the first semiconductor material layer 40L and the first isolation dielectric layer 30L can be patterned, for example, by applying and patterning a photoresist layer to form a discrete patterned photoresist material portion over the area of the first substrate semiconductor portion 10C and to form an additional patterned photoresist material portion over each area of the second substrate semiconductor portions 10T. An anisotropic etch process can be performed to etch unmasked portions of the first semiconductor material layer 40L, the first isolation dielectric layer 30L, and an upper portion of the substrate semiconductor layer 10. Shallow isolation trenches 11 laterally surrounding patterned portions of the first semiconductor material layer 40L, the first isolation dielectric layer 30L, and the upper portions of the substrate semiconductor layer 10 are formed. The shallow isolation trenches 11 can be interconnected among one another as a single continuous volume, as shown in FIG. 2A. The photoresist layer can be subsequently removed, for example, by ashing. The bottom boundaries of the first substrate semiconductor portion 10C and the second substrate semiconductor portions 10T can be located within a horizontal plane including the bottom surfaces of the shallow isolation trenches 11.

Patterned portions of the substrate semiconductor layer 10 include the first substrate semiconductor portion 10C and the second substrate semiconductor portions 10T. In other words, the pattern in the patterned photoresist layer can be selected such that the remaining portions of the substrate semiconductor layer 10 include the first substrate semiconductor portion 10C and the second substrate semiconductor portions 10T. In one embodiment, the first substrate semiconductor portion 10C and the second substrate semiconductor portions 10T may optionally include vertically tapered and horizontally straight sidewalls that laterally extend along horizontal directions. For example, the first substrate semiconductor portion 10C and the second substrate semiconductor portions 10T may include a respective pair of sidewalls that laterally extend along a first horizontal direction hd1 and a respective pair of sidewalls that laterally extend along a second horizontal direction hd2 that is perpendicular to the first horizontal direction hd1. Generally, the first substrate semiconductor portion 10C may have any horizontal cross-sectional shape such as a shape of a polygon, a rounded polygon, a circle, an ellipse, or any two-dimensional closed curvilinear shape. The second substrate semiconductor portions 10T may have rectangular horizontal cross-sectional shapes which are conducive to formation of field effect transistors thereupon.

Patterned portions of the first isolation dielectric layer 30L comprise a first node dielectric (i.e., a first capacitor dielectric) 30 that is formed on a top surface of the first substrate semiconductor portion 10C and gate dielectrics 38 formed on a respective one of the second substrate semiconductor portions 10T. Patterned portions of the first semiconductor material layer 40L comprise a first semiconductor plate 40 and gate semiconductor material portions 49. The first semiconductor plate 40 can be formed on a top surface of the first node dielectric 30. The gate semiconductor material portions 49 can be formed on a top surface of a respective one of the gate dielectrics 38. The first semiconductor plate 40 can be employed as a second electrode of the capacitor structure of one embodiment of the present disclosure. Thus, a first stack of a first node dielectric 30 and a first semiconductor plate 40 can be formed. The periphery of the bottom surface of the first semiconductor plate 40 may coincide with the periphery of the top surface of the first node dielectric 30. The sidewalls of the first semiconductor plate 40 and the first node dielectric 30 can be vertically coincident. As used herein, a first surface and a second surface are vertically coincident if the second surface overlies or underlies the first surface and if a vertical plane including the first surface and the second surface exists. The vertical plane may, or may not, have a curvature in a horizontal cross-sectional view.

Referring to FIGS. 3A and 3B, at least one dielectric material can be deposited in the shallow isolation trenches 11. The at least one dielectric material may include an optional diffusion barrier liner material (such as a silicon nitride liner material) and a planarizable dielectric fill material (such as undoped silicate glass or a doped silicate glass). The at least one dielectric material can fill the entire volume of the shallow isolation trenches 11. Excess portions of the at least one dielectric material can be removed from above the horizontal plane including the top surfaces of the first semiconductor plate 40 and the gate semiconductor material portions 49 by a planarization process. For example, a chemical mechanical planarization process may be employed to remove the excess portions of the at least one dielectric material from above the horizontal plane including the top surfaces of the first semiconductor plate 40 and the gate semiconductor material portions 49. Remaining portions of at least one dielectric material that fill the volumes of the shallow isolation trenches 11 constitute a shallow trench isolation (STI) structure 20. The shallow trench isolation structure 20 laterally surrounds the first substrate semiconductor portion 10C and the second substrate semiconductor portions 10T, the first node dielectric 30 and each of the gate dielectrics 38, and the first semiconductor plate 40 and each of the gate semiconductor material portions 49. In one embodiment, each sidewall of the first substrate semiconductor portion 10C, the second substrate semiconductor portions 10T, the first node dielectric 30, the gate dielectrics 38, the first semiconductor plate 40, and the gate semiconductor material portions 49 can contact the shallow trench isolation structure 20. In one embodiment, the top surfaces of the first semiconductor plate 40 and the gate semiconductor material portions 49 can be located within a same horizontal plane as the top surface of the shallow trench isolation structure 20.

Referring to FIGS. 4A and 4B, a second isolation dielectric layer 50L and a second semiconductor material layer 60L can be deposited over the first semiconductor plate 40 and the gate semiconductor material portions 49 as continuous material layers. The second isolation dielectric layer 50L can include any dielectric material that may be employed as a node dielectric of a capacitor (i.e., as a capacitor dielectric). In one embodiment, the second isolation dielectric layer 50L includes silicon oxide, silicon nitride, and/or a dielectric metal oxide. In one embodiment, the second isolation dielectric layer 50L may include a dielectric metal oxide having a dielectric constant greater than 7.9. Generally, the higher the dielectric constant of the second isolation dielectric layer 50L, the greater the capacitance of a second electrode including the first semiconductor plate 40 and a third electrode that is subsequently formed by patterning the second semiconductor material layer 60L. The thickness of the second isolation dielectric layer 50L may be in a range from 1 nm to 20 nm, such as from 2 nm to 12 nm and/or from 4 nm to 10 nm, although lesser and greater thicknesses may also be employed. The second isolation dielectric layer 50L may, or may not, include the same material as the first node dielectric 40. The second isolation dielectric layer 50L may, or may not, have the same thickness as the first node dielectric 40.

A second semiconductor material layer 60L can be deposited over, and directly on, the second isolation dielectric layer 50L. The second semiconductor material layer 60L can include a doped semiconductor material having a doping of the first conductivity type or the second conductivity type. In one embodiment, the second semiconductor material layer 60L may include amorphous silicon, polysilicon, or a silicon-germanium alloy. In one embodiment, the second semiconductor material layer 60L may be conductive. The second semiconductor material layer 60L may be deposited employing chemical vapor deposition. The second semiconductor material layer 60L may be in-situ doped with electrical dopants during deposition of the second semiconductor material layer 60L, or may be ex-situ doped after deposition of an intrinsic semiconductor material by performing a low energy ion implantation process. The thickness of the second semiconductor material layer 60L may be in a range from 5 nm to 50 nm, such as 10 nm to 20 nm, although lesser and greater thicknesses may also be employed.

Referring to FIGS. 5A and 5B, a photoresist layer 67 can be applied over the second semiconductor material layer 60L, and can be lithographically patterned to cover a center portion of the area of the first substrate semiconductor portion 10C in a top-down view, i.e., in a plan view. The periphery of the patterned portion of the photoresist layer 67 may be laterally offset inward from the periphery of the top surface of the first substrate semiconductor portion 10C. At least one etch process can be performed to remove unmasked portions of the second semiconductor material layer 60L and the second isolation dielectric layer SOL. In one embodiment, the at least one etch process may include a first etch process that etches unmasked portions of the second semiconductor material layer 60L selective to the material of the second isolation dielectric layer 50L, and a second etch process that etches unmasked portions of the second isolation dielectric layer 50L selective to the material of the first semiconductor plate 40. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first etch process and/or the second etch process may include at least one anisotropic etch process (such as a reactive ion etch process) or an isotropic etch process (such as a wet etch process). For example, a wet etch process employing hot trimethyl-2 hydroxyethyl ammonium hydroxide ("hot TMY") or tetramethyl ammonium hydroxide (TMAH) may be performed to remove unmasked portions of the second semiconductor material layer 60L during a first etch process, and a wet etch process employing an etchant that etches the dielectric material of the second isolation dielectric layer 50L may be employed to remove unmasked portions of the second isolation dielectric layer 50L. The remaining patterned portion of the second semiconductor material layer 60L comprises a semiconductor sheet 60S, and the remaining patterned portion of the second isolation dielectric layer 50L comprises a second node dielectric 50. A second stack of the second node dielectric 50 and the semiconductor sheet 60S can be formed over the first stack of the first node dielectric 30 and the first semiconductor plate 40. The periphery of the bottom surface of the semiconductor sheet 60S may coincide with the periphery of the top surface of the second node dielectric 50. The sidewalls of the second node dielectric 50 and the semiconductor sheet 60S can be vertically coincident.

Referring to FIGS. 6A and 6B, a metallic material layer 70L and a dielectric cap layer 80L can be deposited over the second stack of the second node dielectric 50 and the semiconductor sheet 60S, the gate semiconductor material portions 49, and the shallow trench isolation structure 20. The metallic material layer 70L includes a metallic material such as a transition metal, an intermetallic alloy of at least two transition metals, a conductive nitride of at least one transition metal, a silicide of at least one transition metal, or a combination, stack, or an alloy thereof. The metallic material may include a metal element that forms a metal silicide with the semiconductor material of the gate semiconductor material portions 49, or may not include any metallic element that forms a metal silicide with the semiconductor material of the gate semiconductor material portions 49. For example, the at least one metal element within the metallic material layer 70L may include Al, Ti, Co, W, Ta, Ni, Mo or electrically conductive nitride or silicide thereof. The metallic material layer 70L can be deposited by chemical vapor deposition or physical vapor deposition. The thickness of the metallic material layer 70L can be in a range from 10 nm to 100 nm, although lesser and greater thicknesses may also be employed.

The dielectric cap layer 80L includes a dielectric capping material that is resistant to diffusion of metal and impurity ions. For example, the dielectric cap layer 80L can include silicon nitride. The dielectric cap layer 80L may be deposited, for example, by chemical vapor deposition. The thickness of the dielectric cap layer 80L can be in a range from 10 nm to 60 nm, although lesser and greater thicknesses may also be employed.

Referring to FIGS. 7A and 7B, a photoresist layer (not shown) can be applied over the dielectric cap layer 80L, and can be lithographically patterned to cover an area overlying a portion of the first substrate semiconductor portion 10C and gate areas of transistors to be subsequently formed over the second substrate semiconductor portions 10T. In one embodiment, the area of a patterned portion of the photoresist layer overlying the first substrate semiconductor portion can include the entire area of the second stack of the second node dielectric 50 and the semiconductor sheet 60S. In one embodiment, the periphery of the patterned portion of the photoresist layer overlying the first substrate semiconductor portion 10C can be laterally offset outward from the sidewalls of the second stack of the second node dielectric 50 and the semiconductor sheet 60S by a finite lateral spacing, which may be in a range from 10 nm to 200 nm, although lesser and greater spacings may also be employed. In one embodiment, the periphery of the patterned portion of the photoresist layer overlying the first substrate semiconductor portion 10C may be laterally offset inward from a closed periphery of the portion of the shallow trench isolation structure 20 that laterally surrounds, and contacts, the first substrate semiconductor portion 10C. The lateral offset distance may be in a range from 10 nm to 200 nm, although lesser and greater spacings may also be employed. Each patterned portion of the photoresist layer that overlies a respective one of the second substrate semiconductor portion 10T may laterally traverse a center portion of the respective one of the second substrate semiconductor portion 10T. The width each patterned portion of the photoresist layer may correspond to the gate length of a respective field effect transistor to be subsequently formed.

An anisotropic etch process can be performed to transfer the pattern in the photoresist layer through the dielectric cap layer 80L, the metallic material layer 70L, the first semiconductor plate 40, and each of the gate semiconductor material portions 49 by performing an anisotropic etch process. The anisotropic etch process may include a non-selective reactive ion etch process that etches the material of the dielectric cap layer 80L, the material of the metallic material layer 70L, and the material of the first semiconductor plate 40 and the gate semiconductor material portions 49. The etch process may stop on the material of the first node dielectric 30 and the gate dielectrics 38.

Patterned portions of the dielectric cap layer 80L include a dielectric cap sheet 80S formed over the first substrate semiconductor portion 10C and dielectric gate caps 88 formed across a respective one of the second substrate semiconductor portions 10T. Patterned portions of the metallic material layer 70L include a metallic sheet 70S formed over the first substrate semiconductor portion 10C and metallic gate electrodes 78 formed across a respective one of the second substrate semiconductor portions 10T. A peripheral portion of the first semiconductor plate 40 is trimmed by the anisotropic etch process. The second stack of the second node dielectric 50 and the semiconductor sheet 60S are encapsulated by the metallic sheet 70S and the first semiconductor plate 40, and is preferably not etched by the anisotropic etch process. Each patterned portion of the gate semiconductor material portions 49 comprises a semiconductor gate electrode 48. The first node dielectric 30 and the gate dielectrics 38 can function as etch stop structures for the anisotropic etch process. The first node dielectric 30 may cover the entire top surface of the first substrate semiconductor portion 10C, and the gate dielectrics 38 may cover the entire top surface of a respective one of the second substrate semiconductor portions 10T.

The sidewalls of the dielectric cap sheet 80S, the metallic sheet 70S, and the first semiconductor plate 40 can be vertically coincident with each other. Each combination of a semiconductor gate electrode 48 and a metallic gate electrode 78 constitutes a composite gate electrode (48, 78). The sidewalls of each contiguous set of a semiconductor gate electrode 48, a metallic gate electrode 78, and a dielectric gate cap 88 can be vertically coincident with each other. Each contiguous combination of a semiconductor gate electrode 48, a metallic gate electrode 78, and a dielectric gate cap 88 constitutes a gate stack (38, 78, 88).

Electrical dopants can be implanted into regions of the second substrate semiconductor portions 10T that are not masked by the gate stacks (38, 78, 88) to form source and drain extension regions (7, 9). The source and drain extension regions (7, 9) can include source extension regions 7 formed on one side of a respective composite gate electrode (48, 78) and drain extension regions 9 formed on another side of a respective composite gate electrode (48, 78). In one embodiment, masked ion implantation processes can be employed to form a first subset of the source and drain extension regions (7, 9) having a p-type doping, and to form a second subset of the source and drain extension regions (7, 9) having an n-type doping if CMOS transistors are to be formed. The mask may optionally cover the first substrate semiconductor portion 10C to avoid implanting the capacitor areas of the substrate.

Referring to FIGS. 8A and 8B, a dielectric material layer can be conformally deposited over the first exemplary structure, and can be anisotropically etched using a sidewall spacer etch to remove horizontally-extending portions of the dielectric material layer. The dielectric material layer includes at least one dielectric material such as silicon nitride and/or silicon oxide. In one embodiment, the dielectric material layer may include a layer stack of a silicon nitride layer and a silicon oxide layer. Each remaining portion of the dielectric material layer includes a vertical portion that laterally surrounds sidewalls of a respective layer stack. For example, a dielectric capacitor spacer 52 can laterally surround a layer stack including the first semiconductor plate 40, the second node dielectric 50, the semiconductor sheet 60S, the metallic sheet 70S, and the dielectric cap sheet 80S. The dielectric capacitor spacer 52 can contact sidewalls of the first semiconductor plate 40, the metallic sheet 70S, and the dielectric cap sheet 80S, and can be laterally spaced from the second node dielectric 50 and the semiconductor sheet 60S. A dielectric gate spacer (i.e., sidewall spacer) 58 can laterally surround, and can contact sidewalls of, a gate stack including a semiconductor gate electrode 48, a metallic gate electrode 78, and the dielectric gate cap 88. The lateral thickness of the dielectric capacitor spacer 52 and each dielectric gate spacer 58 may be in a range from 15 nm to 120 nm, such as from 30 nm to 60 nm, although lesser and greater lateral thicknesses may also be employed.

The anisotropic etch process that removes horizontal portions of the dielectric material layer collaterally etches portions of the first node dielectric 30 and the gate dielectrics 38 that are not masked by the dielectric capacitor spacer 52 or the dielectric gate spacers 58. Thus, the sidewalls of the remaining portions of the first node dielectric 30 can be vertically coincident with a bottom periphery of the outer sidewall of the dielectric capacitor spacer 52. The dielectric capacitor spacer 52 laterally surrounds, and contacts, the first semiconductor plate 40, which functions as a second electrode of a capacitor structure. The sidewalls of each remaining portion of the gate dielectrics 38 can be vertically coincident with a bottom periphery of an outer sidewall of a respective overlying dielectric gate spacer 58. Further, a bottom surface of the dielectric capacitor spacer 52 contacts a peripheral portion of the top surface of the first node dielectric 30. In one embodiment, a top edge of each sidewall of the first node dielectric 30 can coincide with a bottom periphery of an outer sidewall of the dielectric capacitor spacer 52. The dielectric capacitor spacer 52 laterally surrounds and contacts sidewalls of the metallic sheet 70S and the dielectric cap sheet 80S.

Electrical dopants can be implanted into regions of the second substrate semiconductor portions 10T that are not masked by the gate stacks (38, 78, 88) or by the dielectric gate spacers 58 to form source and drain regions (17, 19). The source and drain regions (17, 19) can include source regions 17 formed on one side of a respective composite gate electrode (48, 78) and drain regions 19 formed on another side of a respective composite gate electrode (48, 78). In one embodiment, masked ion implantation processes can be employed to form a first subset of the source and drain regions (17, 19) having a p-type doping, and to form a second subset of the source and drain regions (17, 19) having an n-type doping, if CMOS transistors are to be formed. Implanted portions of the source and drain extension regions (7, 9) can be incorporated into a respective one of the source and drain regions (17, 19). Field effect transistors are formed in the regions including or overlying the second substrate semiconductor portions 10T. The mask may optionally cover the first substrate semiconductor portion 10C to avoid implanting the capacitor areas of the substrate.

Field effect transistors can be formed on the second substrate semiconductor portions 10T of the substrate semiconductor layer 10. Each field effect transistor can include a gate dielectric 38 and a semiconductor gate electrode 48, which is a patterned portion of a gate semiconductor material portion 49. Each gate dielectric 38 comprises a same material as, and has a same thickness as, the first node dielectric 30. In one embodiment one or more of the semiconductor gate electrodes 48 may comprise a same material as, and has a same thickness as, the first semiconductor plate 40. In one embodiment, each field effect transistor may comprise a metallic gate electrode 78 that comprises a same material as, and has a same thickness as, the metallic sheet 70S.

Referring to FIGS. 9A and 9B, a photoresist layer 177 can be applied over the first exemplary structure, and can be lithographically patterned to form a moat-shaped opening within the area of the metallic sheet 70S. A moat-shaped opening refers to an opening having an inner periphery and an outer periphery that is laterally offset outward from the inner periphery and does not contact the inner periphery. In one embodiment, the outer periphery of the moat-shaped opening may be laterally recessed inward from the sidewall of the metallic sheet 70S in a plan view, i.e., a top-down view. In one embodiment, the outer periphery of the moat-shaped opening in the photoresist layer may be uniformly offset inward from the sidewalls of the metallic sheet 70S by a uniform lateral offset distance, which may be in a range from 20 nm to 200 nm, such as from 40 nm to 100 nm, although lesser and greater lateral offset distances may also be employed. The inner periphery of the moat-shaped opening may be laterally offset inward from the outer periphery of the moat-shaped opening by a width of the moat-shaped opening. The width of the moat-shaped opening may be in a range from 20 nm to 200 nm, such as from 40 nm to 100 nm, although lesser and greater widths may also be employed. In one embodiment the width of the moat-shaped opening may be uniform through the moat-shaped opening. The shape of the moat-shaped opening may be a shape of a rectangular frame or of any other polygonal frame, a shape of an annulus, or any two-dimensional shape including a hole therein.

An anisotropic etch process can be performed to remove portions of the dielectric cap sheet 80S, the metallic sheet 70S, and the semiconductor sheet 60S that are not masked by the photoresist layer 177. The second node dielectric 50 can function as an etch stop structure for the anisotropic etch process. For example, the anisotropic etch process can include selective etch steps that include a first anisotropic etch step that etches the material of the dielectric cap sheet 80S selective to the material of the metallic sheet 70S, a second anisotropic etch step that etches the material of the metallic sheet 70S selective to the material of the semiconductor sheet 60S, and a third anisotropic etch process that etches the semiconductor material of the semiconductor sheet 60S selective to the material of the second node dielectric 50. A moat trench 79 is formed in a volume from which the materials of the dielectric cap sheet 80S, the metallic sheet 70S, and the semiconductor sheet 60S are etched by the anisotropic etch process.

Since the semiconductor sheet 60S and the second node dielectric 50 are relatively thin, the moat trench 79 can be etched using a separate selective etch step which is different from the non-selective RIE step that is used to form the composite gate electrode (48, 78) and stack including the first semiconductor plate 40, the dielectric cap sheet 80S and the metallic sheet 70S shown in FIGS. 7A and 7B. This reduces the chance that the moat trench 79 etch step will punch through the second node dielectric 50 and cause a short circuit in the capacitor area. Furthermore, the moat trench 79 is preferably located entirely inside the area of the first semiconductor plate 40, the dielectric cap sheet 80S and the metallic sheet 70S. In this case, no portion of the first semiconductor plate 40, the dielectric cap sheet 80S and the metallic sheet 70S is etched twice during the etching steps shown in FIGS. 7A and 7B and in FIGS. 9A and 9B. This reduces the likelihood of etching induced defects, which may occur in regions that are etched twice during separate etching steps.

Each of the dielectric cap sheet 80S, the metallic sheet 70S, and the semiconductor sheet 60S is divided into an inner material portion and an outer material portion by the anisotropic etch process. Specifically, the dielectric cap sheet 80S is divided into a primary dielectric cap 80 located inside the moat trench 79 and a peripheral dielectric cap 82 located outside the moat trench 79. Each metallic sheet 70S is divided into a primary metallic plate 70 located inside the moat trench 79 and a peripheral metallic plate 72 located outside the moat trench 79. The semiconductor sheet 60S is divided into a primary semiconductor plate 60 located inside the moat trench 79 and a peripheral semiconductor plate 62 located outside the moat trench 79.

Generally, a combination of a dielectric cap sheet 80S, the metallic sheet 70S, and the semiconductor sheet 60S is divided into the inner layer stack (60, 70, 80) and a peripheral stack 201 by the moat trench 79 after formation of the dielectric capacitor spacer 52 and the dielectric gate spacers 58. The moat trench 79 laterally surrounds the inner layer stack (60, 70, 80), and is laterally surrounded by the peripheral stack 201. Sidewalls of the inner layer stack (60, 70, 80) and sidewalls of the peripheral stack 201 are physically exposed to the moat trench 79.

The inner layer stack (60, 70, 80) comprises a primary semiconductor plate 60, a primary metallic plate 70, and a primary dielectric cap 80. The peripheral stack 201 comprises a peripheral semiconductor plate 62, a peripheral metallic plate 72, and a peripheral dielectric cap 82. The primary semiconductor plate 60 and the peripheral semiconductor plate 62 are patterned portions of the semiconductor sheet 60S. The primary metallic plate 70 and the peripheral metallic plate 72 are patterned portions of the metallic sheet 70S. The primary dielectric cap 80 and the peripheral dielectric cap 82 are patterned portions of the dielectric cap sheet 80S.

A dual capacitor structure is formed over the first substrate semiconductor portion 10C. The first substrate semiconductor portion 10C functions as a first electrode of the capacitor structure, the first semiconductor plate 40 functions as a second electrode of the capacitor structure, the primary semiconductor plate 60 functions as a portion of a third electrode of the capacitor structure. The first node dielectric 30 is located between, and contacts each of, the first substrate semiconductor portion 10C and the first semiconductor plate 40. The second node dielectric 50 can be located on a top surface of the first semiconductor plate 40 and can contact a bottom surface of the primary semiconductor plate 60, which is a second semiconductor plate that functions as a portion of the third electrode of the capacitor structure. The third electrode can comprise a stack of a primary semiconductor plate 60 and a primary metallic plate 70.

In one embodiment, the first electrode of the first substrate semiconductor portion 10C and the third electrode of the primary semiconductor plate 60 can be electrically connected to each other to provide a two-terminal capacitor structure. Alternatively, the first electrode, the second electrode, and the third electrode may be connected to different nodes of other semiconductor devices (such as the field effect transistors formed over the second substrate semiconductor portions 10T) in subsequent processing steps to provide a series connection of two capacitors. The first capacitor comprises the first node (i.e., capacitor) dielectric 30 located between a first electrode comprising the first substrate semiconductor portion 10C and the second electrode comprising the first semiconductor plate 40. The second capacitor comprises the second node (i.e., capacitor) dielectric 50 located between the second electrode comprising the first semiconductor plate 40 and the third electrode (60, 70) comprising the primary semiconductor plate 60 and the primary metallic plate 70. Thus, the first semiconductor plate 40 acts as an electrode of both capacitors.

The peripheral stack 201 provides electrical contact to the second electrode comprising the first semiconductor plate 40. Specifically, the peripheral stack 201 comprises the peripheral semiconductor plate 62, the peripheral metallic plate 72, and the peripheral dielectric cap 82. The peripheral semiconductor plate 62 contacts a peripheral portion of a top surface of the second node dielectric 50, comprises the same material as the primary semiconductor plate 60, and is laterally spaced from the primary semiconductor plate 60 by the moat trench 79. The photoresist layer 177 can be subsequently removed, for example, by ashing.

Referring to FIGS. 10A and 10B, at least one contact-level dielectric material can be deposited over the inner layer stack (60, 70, 80), the peripheral stack 201, and the field effect transistors to form at least one contact-level dielectric layer 90. Thus, the at least one contact-level dielectric layer 90 can laterally extend over the third electrode (60, 70) and the peripheral stack 201, and comprises a downward-protruding portion that fills the moat trench 79 and contacts the second node dielectric 50. In one embodiment, the at least one contact-level dielectric layer 90 may include an optional dielectric liner 90A and a planarization dielectric layer 90B that includes a planarizable dielectric material. For example, the dielectric liner 90A may include a dielectric diffusion barrier material, such as silicon nitride, and the planarization dielectric layer 90B may include undoped silicate glass or a doped silicate glass. The thickness of the dielectric liner 90A may be in a range from 4 nm to 20 nm, although lesser and greater thicknesses may also be employed.

The downward-protruding portion of the at least one contact-level dielectric layer fills the moat trench 79. Generally, the peripheral stack 201 includes an opening defined by an inner sidewall (which can be the outer sidewall of the moat trench 79), and laterally surrounds the third electrode (60, 70) and is laterally spaced from the third electrode (60, 70). In one embodiment, each outer sidewall of the peripheral stack 201 can be vertically coincident with a respective sidewall of the second electrode comprising the first semiconductor plate 40. The downward-protruding portion of the at least one contact-level dielectric layer 90 can be formed directly on a surface of the second node dielectric 50, which may be a top surface or a recessed horizontal surface of the second node dielectric 50. The downward-protruding portion of the at least one contact-level dielectric layer 90 can be formed directly on the sidewalls of the layer stack (60, 70, 80) and the sidewalls of the peripheral stack 201. The downward-protruding portion of the at least one contact-level dielectric layer 90 can be in contact with a top surface of the second node dielectric 50, and can be vertically spaced from the second electrode comprising the first semiconductor plate 40 by the second node dielectric 50.

Referring to FIGS. 11A and 11B, contact vias are etched through the at least one contact-level dielectric layer 90 and the second node dielectric 50 using photolithography and etching. The contact vias are then filled with electrically conductive contact via structures (92, 94, 96, 97, 98, 99). The contact via structures extend through the at least one contact-level dielectric layer 90 to contact a respective node of the capacitor structure or the field effect transistors. The contact via structures (92, 94, 96, 97, 98, 99) can include first contact via structures 92 that contact the first electrode comprising the first substrate semiconductor portion 10C, second contact via structures 94 that contact the peripheral metallic plate 72 that is electrically connected to the second electrode comprising first semiconductor plate 40, and third contact via structures 96 that contact the primary metallic plate 70, which is a portion of the third electrode (60, 70). While three of each of the capacitor contact via structures (92, 94, 96) are shown in FIG. 11A, there may be only one, two or four or more of each of the capacitor via structures (92, 94, 96). Furthermore, if there are three or more of each type of the capacitor contact via structures (92, 94, 96), then each type of the capacitor contact via structures may be arranged in a row that extends along the first horizontal direction hd1, the second horizontal direction hd2 or in a random pattern. Further, the contact via structures (92, 94, 96, 97, 98, 99) can include source contact via structures 97 that contact a respective source region 17, drain contact via structures 99 that contact a respective drain region 19, and gate contact via structures 98 that contact a respective one of the composite gate electrodes (48, 78).

Referring to FIGS. 12A and 12B, an alternative configuration of the first exemplary structure can be derived from the first exemplary structure illustrated in FIGS. 5A and 5B by altering the pattern of the photoresist layer 67. Specifically, the pattern of the photoresist layer can be altered such that at least one edge of the patterned photoresist layer 67 overlies a top surface of the shallow trench isolation structure 20. Furthermore, the photoresist layer contains an opening (e.g., slit) 67A over the shallow trench isolation structure 20. The etch process of FIGS. 5A and 5B can be performed to pattern the second isolation dielectric layer 50L and a second semiconductor material layer 60L into a second stack of a second node dielectric 50 and a semiconductor sheet 60S. The second stack of the second node dielectric 50 and the semiconductor sheet 60S has a periphery that overlies, and contacts, a portion of the shallow trench isolation structure 20. In one embodiment, a first segment of the periphery of the second stack of the second node dielectric 50 and the semiconductor sheet 60S may overlie and contact a portion of the shallow trench isolation structure 20, and a second segment of the periphery of the second stack of the second node dielectric 50 and the semiconductor sheet 60S may contact a top surface of the first semiconductor plate 40. In another embodiment, the entirety of the periphery of the second stack of the second node dielectric 50 and the semiconductor sheet 60S may overlie and contact a portion of the shallow trench isolation structure 20. The periphery of the second stack of the second node dielectric 50 and the semiconductor sheet 60S that overlies a portion of the shallow trench isolation structure 20 includes an opening (e.g., slit) 560. Generally, the shallow trench isolation structure laterally surrounds the first substrate semiconductor portion 10C. A portion of the second node dielectric 50 and a portion of the semiconductor sheet 60S can overlie, and can contact a top surface of, the shallow trench isolation structure 20.

Referring to FIGS. 13A and 13B, the processing steps of FIGS. 6A-9B can be performed to form field effect transistors and to form the inner layer stack (60, 70, 80) and a peripheral stack 201. The moat trench 79 preferably has an areal overlap with the shallow trench isolation structure 20. The primary metallic plate 70 and the primary dielectric cap 80 fill the opening 560 to leave a groove 80G in the top of the primary dielectric cap 80. The top of the primary metallic plate 70 below the groove 80G is recessed.

Figure 14A:
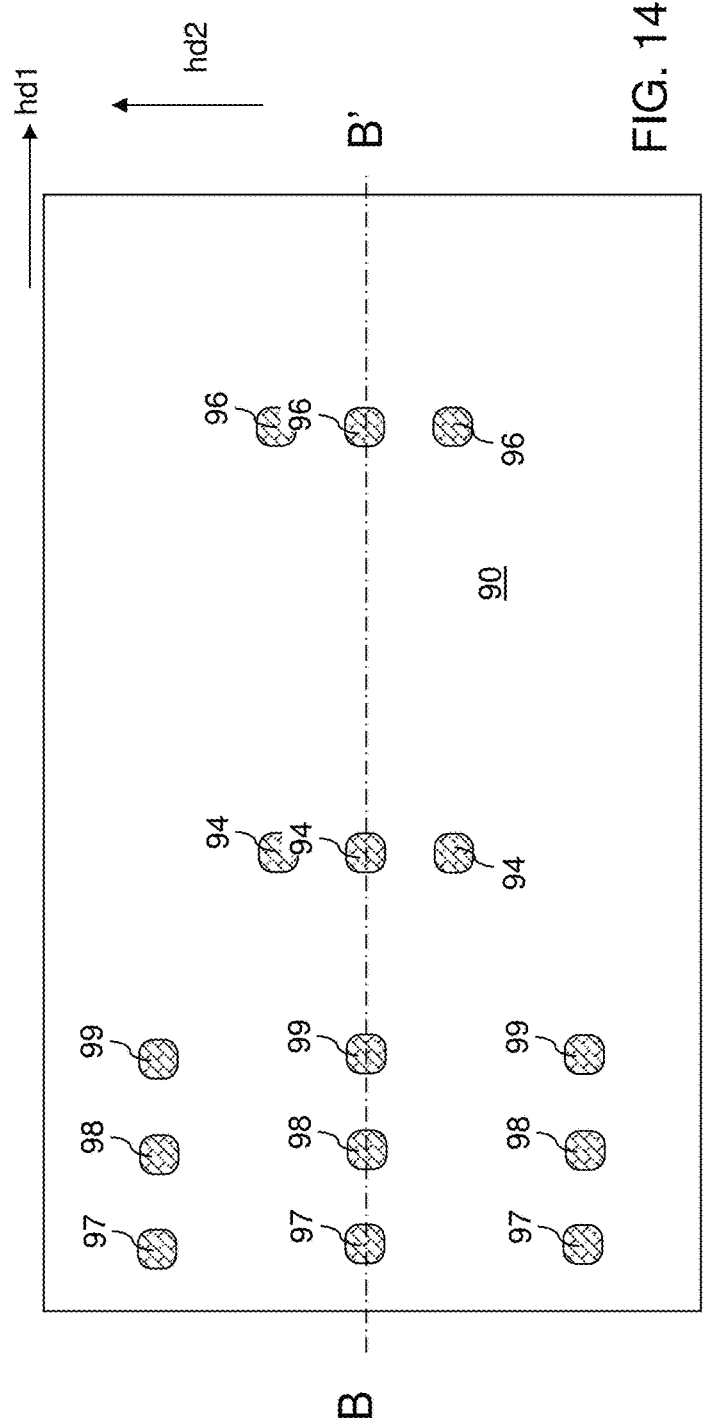
FIG. 14A is a schematic vertical cross-sectional view of the alternative configuration of the first exemplary structure after formation of contact via structures according to the first embodiment of the present disclosure.
Figure 14B:
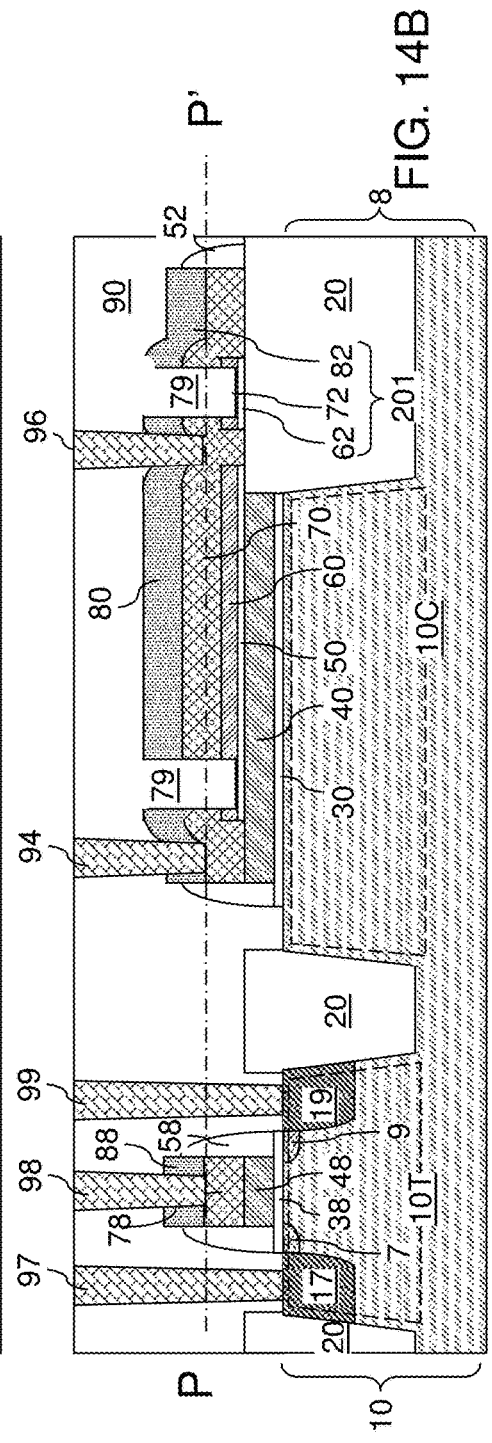
FIG. 14B is a top-down view of the first exemplary structure along the vertical plane B-B' of FIG. 14A.

Referring to FIGS. 14A and 14B, the processing steps of FIGS. 10A-11B can be performed to form at least one contact-level dielectric layer 90 and various contact via structures (94, 96, 97, 98, 99). A portion of the second node dielectric 50 and a portion of the peripheral stack 201 overlies, and contacts a top surface of, the shallow trench isolation structure 20. In one embodiment, a subset of the contact via structures such as the third contact via structures 96 can be formed over and within an area of the shallow trench isolation structure 20. Furthermore, the first contact via structures 92 may optionally be omitted in this embodiment. Still further, the primary semiconductor plate 60 and the second node dielectric 50 are removed in the opening 560 location underlying the third contact via structures 96. In this case, the primary metallic plate 70 extends downward through the opening 560 from which the primary semiconductor plate 60 and the second node dielectric 50 are removed and contacts the shallow trench isolation structure 20. The third contact via structures 96 is formed through the primary dielectric cap 80 in the location of the groove 80G and the opening 560. In this alternative embodiment, the height (i.e., depth) of all contact via structures (94, 96, 98) is similar. For example, the bottom of the contact via structures (94, 96, 98) is located in plate P-P' and their top is located coplanar with the of top of the dielectric layer 90. This improves the process margin during etching of the contact vias since contact vias have a similar height (i.e., depth), and during deposition of contact via structures (94, 96, 98) at the same time into contact vias having a similar height (i.e., depth).

Referring to FIGS. 1A-14B and according to various embodiments of the present disclosure, a semiconductor structure is provided, which comprises a capacitor structure located on a semiconductor substrate including a substrate semiconductor layer 10. The capacitor structure comprises: a first electrode comprising a first substrate semiconductor portion 10C of the substrate semiconductor layer 10; a first node dielectric 30 located on a top surface of the first substrate semiconductor portion 10C of the substrate semiconductor layer 10; a second electrode comprising a first semiconductor plate 40 and located on a top surface of the first node dielectric 30; a second node dielectric 50 located on a top surface of the first semiconductor plate 40; a third electrode (60, 70) comprising a stack of a primary semiconductor plate 60 and a primary metallic plate 70; a moat trench 79 laterally surrounding the third electrode (60, 70); a peripheral stack 201 laterally surrounding the third electrode (60, 70), wherein the peripheral stack 201 comprises a peripheral stack 201 comprising a peripheral semiconductor plate 62 and a peripheral metallic plate 72, and wherein the peripheral semiconductor plate 62 contacts a peripheral portion of a top surface of the second node dielectric 50, comprises a same material as the primary semiconductor plate 60, and is laterally spaced from the primary semiconductor plate 60; and at least one contact-level dielectric layer 90 laterally extending over the third electrode (60, 70) and the peripheral stack 201.

In one embodiment, the at least one contact-level dielectric layer 90 comprises a downward-protruding portion that fills the moat trench 79 and contacts the second node dielectric 50 exposed in the moat trench 79. The downward-protruding portion of the at least one contact-level dielectric layer 90 is vertically spaced from the second electrode by the second node dielectric 50. In one embodiment, each outer sidewall of the peripheral stack 201 is vertically coincident with a respective sidewall of the second electrode.

In one embodiment, a dielectric capacitor spacer 52 laterally surrounds, and contacts, the second electrode (as embodied as the first semiconductor plate 40) and the peripheral stack 201 and contacts a peripheral portion of the top surface of the first node dielectric 30. In one embodiment, a top edge of a sidewall of the first node dielectric 40 coincides with a bottom periphery of an outer sidewall of the dielectric capacitor spacer 52.

In one embodiment, the peripheral metallic plate 72 comprises a same metallic material as the primary metallic plate 70; and the peripheral stack 201 comprises a peripheral dielectric cap 82 contacting a top surface of the peripheral metallic plate 72.

In one embodiment, a shallow trench isolation structure 20 laterally surrounds the first substrate semiconductor portion 10C. An entire bottom periphery of the first node dielectric 30 can be in contact with the top surface of the substrate semiconductor portion 10C and can be laterally offset inward from an inner periphery of a portion of the shallow trench isolation structure 20 that laterally surrounds the first substrate semiconductor portion 10C.

In one embodiment, a shallow trench isolation structure 20 laterally surrounds the first substrate semiconductor portion 10C. A portion of the second node dielectric 50 and a portion of the peripheral stack 201 overlies, and contacts a top surface of, the shallow trench isolation structure 20.

In one embodiment, the semiconductor structure comprises a field effect transistor located on a second substrate semiconductor portion 10T of the substrate semiconductor layer 10 and comprising a gate dielectric 38 that comprises a same material as, and has a same thickness as, the first node dielectric 30. In one embodiment, the field effect transistor comprises a semiconductor gate electrode 48 that comprises a same material as and has a same thickness as the first semiconductor plate 40, and a metallic gate electrode 78 that comprises a same material as and has a same thickness as each of the primary metallic plate 70 and the peripheral metallic plate 72.

In one embodiment, the semiconductor structure further comprises a first contact via structure 92 that extends through the at least one contact-level dielectric layer 90 and electrically contacts the first electrode 10C; a second contact via structure 94 that that extends through the at least one contact-level dielectric layer 90 and contacts the second electrode 40 through the peripheral metallic plate 72; and a third contact via structure 96 that that extends through the at least one contact-level dielectric layer 90 and contacts the third electrode (60, 70).

In one embodiment, the first electrode 10C, the first node dielectric 30 and the second electrode 40 form a first capacitor, while the second electrode 40, the second node dielectric 50, and the third electrode (60, 70) form a second capacitor.

Referring to FIGS. 15A and 15B, a second exemplary structure according to the second embodiment of the present disclosure is illustrated. The second exemplary structure can be derived from the first exemplary structure of FIGS. 1A and 1B by forming a first isolation dielectric layer 30L and a first semiconductor material layer 140L over the substrate semiconductor layer 10. The first semiconductor material layer 140L includes a semiconductor material having a suitable resistivity (i.e., the inverse of electrical resistivity) for functioning as a resistor element. For example, the electrical conductivity of the first semiconductor material layer 140L may be in the range from $1.0 \times 10^{-6}$ S/cm to $1.0 \times 10^3$ S/cm, which corresponds to a resistivity range from $1.0 \times 10^{-3}$ Ohm-cm to $1.0 \times 10^6$ Ohm-cm. The electrical resistivity of the semiconductor material in the first semiconductor material layer 140L may be controlled by selecting a base semiconductor material (such as polysilicon or silicon-germanium alloy) for the first semiconductor material layer 140L, and by doping the first semiconductor material layer 140L with electrical dopants at a suitable atomic concentration, which may be, for example, in a range from $1.0 \times 10^{12}/cm^3$ to $1.0 \times 10^{19}/cm^3$, although lesser and greater atomic concentrations may also be employed. The thickness of the first semiconductor material layer 140L may be in a range from 20 nm to 200 nm, such as 60 nm to 100 nm, although lesser and greater thicknesses may also be employed. Different portions of the first semiconductor material layer 140L may be doped differently. For example, portions of the first semiconductor material layer 140L to be employed as semiconductor gate electrodes may be doped with a higher dopant concentration than the portions of the first semiconductor material layer 140L to be subsequently employed as resistor elements. Further, portions of the first semiconductor material layer 140L to be employed as resistor elements may have different dopant concentrations from other portions depending on the target value of resistivity for a respective resistor element.

The substrate semiconductor layer 10 include a first substrate semiconductor portion 10R located in a first device area (in which a resistor structure is subsequently formed)

and second substrate semiconductor portions 10T located in a second device area (in which field effect transistors are subsequently formed). Each first substrate semiconductor portion 10R on which a respective resistor element is subsequently formed may have a line shape, a serpentine shape, or of any straight, curved, or composite shape that can provide a high length-to-width ratio.

In one embodiment, the first semiconductor material layer 140L may be formed as an intrinsic semiconductor material layer or as a layer having a low level of electrical doping. In this case, the first exemplary structure can be formed concurrently with formation of the second exemplary structure by providing a suitable doping to a portion of the first semiconductor material layer 140L and using such a doped portion as the first semiconductor material layer 40L of the first exemplary structure.

Referring to FIGS. 16A and 16B, the first semiconductor material layer 140L and the first isolation dielectric layer 30L can be patterned, for example, by applying and patterning a photoresist layer to form a discrete patterned photoresist material portion over each area of the first substrate semiconductor portions 10R and to form an additional patterned photoresist material portion over each area of the second substrate semiconductor portions 10T. An anisotropic etch process can be performed to etch unmasked portions of the first semiconductor material layer 140L, the first isolation dielectric layer 30L, and an upper portion of the substrate semiconductor layer 10. Shallow isolation trenches 11 laterally surrounding patterned portions of the first semiconductor material layer 140L, the first isolation dielectric layer 30L, and the upper portions of the substrate semiconductor layer 10 are formed. The shallow isolation trenches 11 can be interconnected among one another as a single continuous volume. The photoresist layer can be subsequently removed, for example, by ashing. The bottom boundaries of the first substrate semiconductor portion 10R and the second substrate semiconductor portions 10T can be located within a horizontal plane including the bottom surfaces of the shallow isolation trenches 11.

Patterned portions of the substrate semiconductor layer 10 include the first substrate semiconductor portions 10R and the second substrate semiconductor portions 10T. In other words, the pattern in the patterned photoresist layer can be selected such that the remaining portions of the substrate semiconductor layer 10 include the first substrate semiconductor portions 10R and the second substrate semiconductor portions 10T. In one embodiment, the first substrate semiconductor portions 10R and the second substrate semiconductor portions 10T may optionally include vertically tapered and horizontally straight sidewalls that laterally extend along horizontal directions. For example, the first substrate semiconductor portions 10R and the second substrate semiconductor portions 10T may include a respective pair of sidewalls that laterally extend along a first horizontal direction hd1 and a respective pair of sidewalls that laterally extend along a second horizontal direction hd2 that is perpendicular to the first horizontal direction hd1. Generally, the first substrate semiconductor portions 10R may have any horizontal cross-sectional shape that can provide a high length-to-width ration. The first substrate semiconductor portions 10R may have a shape of rectangular strip, a serpentine strip, or a shape of any strip that can laterally extend with, or without, changes in the propagation direction. The length-to-width ratio of each first substrate semiconductor portion 10R may be in a range from 2 to 1,000, although lesser and greater length-to-width ratios may also be employed. The second substrate semiconductor portions 10T may have rectangular horizontal cross-sectional shapes which are conducive to formation of field effect transistors thereupon.

Patterned portions of the first isolation dielectric layer 30L comprise first resistor isolation dielectrics 130 that are formed on a top surface of a respective first substrate semiconductor portion 10R and gate dielectrics 38 formed on a respective one of the second substrate semiconductor portions 10T. Patterned portions of the first semiconductor material layer 140L comprise semiconductor material strips 140 and gate semiconductor material portions 49. The semiconductor material strips 140 can be formed on a top surface of a respective first resistor isolation dielectric 130. The gate semiconductor material portions 49 can be formed on a top surface of a respective one of the gate dielectrics 38. Portions of the semiconductor material strips 140 can be employed as a resistor element of the resistor structure of the second embodiment of the present disclosure. Thus, a first stack of a first resistor isolation dielectric 130 and a semiconductor material strip 140 can be formed on each first substrate semiconductor portion 10R. The periphery of the bottom surface of the semiconductor material strip 140 may coincide with the periphery of the top surface of an underlying first resistor isolation dielectric 130. The sidewalls of the semiconductor material strip 140 and the first resistor isolation dielectric 130 can be vertically coincident.

Figure 17A:
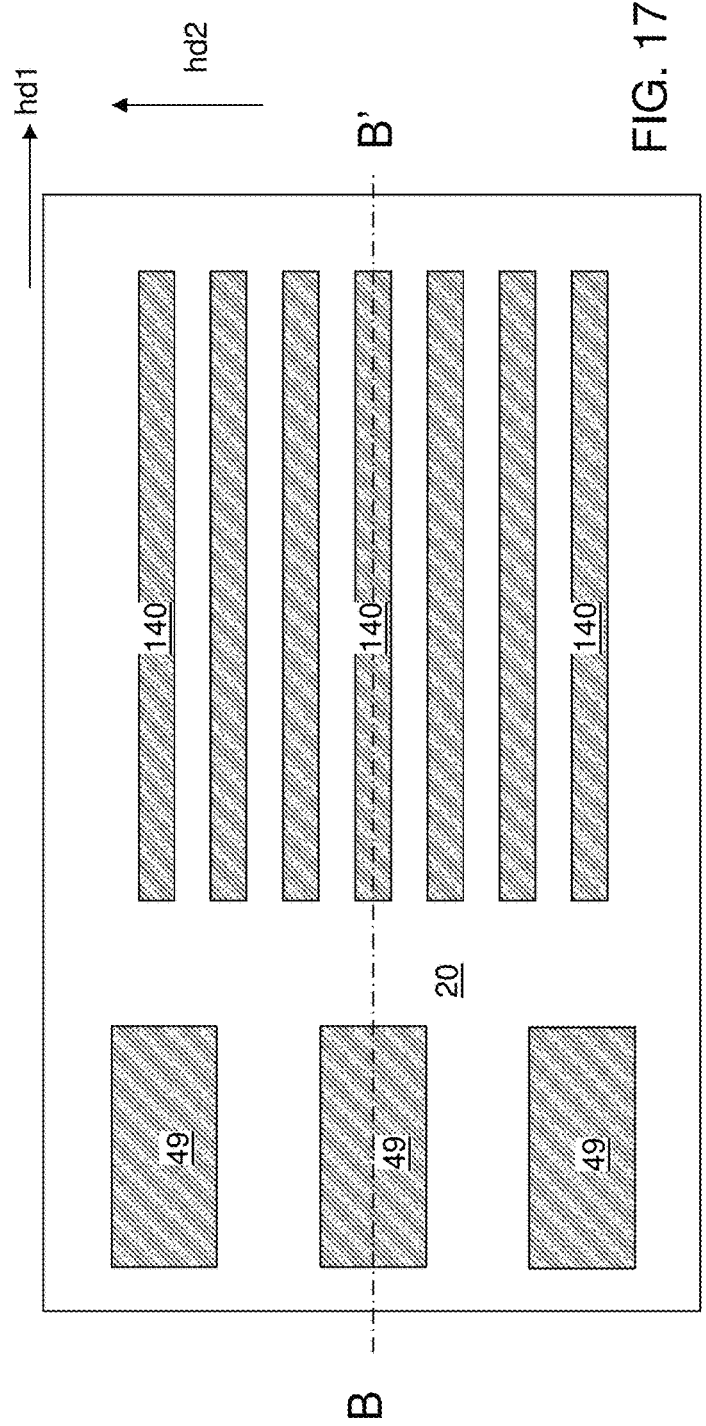
FIG. 17A is a schematic vertical cross-sectional view of the second exemplary structure after formation of a shallow isolation structure according to the second embodiment of the present disclosure.
Figure 17B:
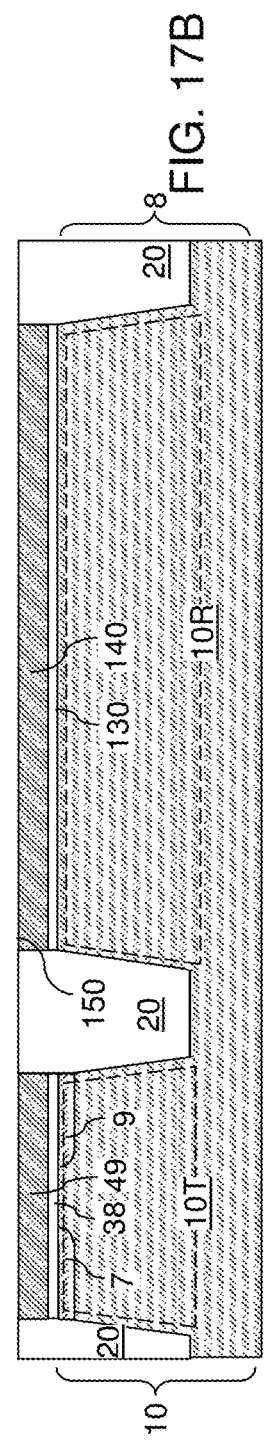
FIG. 17B is a top-down view of the second exemplary structure along the vertical plane B-B' of FIG. 17A.

Referring to FIGS. 17A and 17B, at least one dielectric material can be deposited in the shallow isolation trenches 11. The at least one dielectric material may include an optional diffusion barrier liner material (such as a silicon nitride liner material) and a planarizable dielectric fill material (such as undoped silicate glass or a doped silicate glass). The at least one dielectric material can fill the entire volume of the shallow isolation trenches 11. Excess portions of the at least one dielectric material can be removed from above the horizontal plane including the top surfaces of the semiconductor material strips 140 and the gate semiconductor material portions 49 by a planarization process. For example, a chemical mechanical planarization process may be employed to remove the excess portions of the at least one dielectric material from above the horizontal plane including the top surfaces of the semiconductor material strip 140 and the gate semiconductor material portions 49. Remaining portions of at least one dielectric material that fill the volumes of the shallow isolation trenches 11 constitute a shallow trench isolation (STI) structure 20. The shallow trench isolation structure 20 laterally surrounds the first substrate semiconductor portions 10R and the second substrate semiconductor portions 10T, the first resistor isolation dielectrics 130 and the gate dielectrics 38, and the semiconductor material strips 140 and the gate semiconductor material portions 49. In one embodiment, each sidewall of the first substrate semiconductor portions 10R, the second substrate semiconductor portions 10T, the first resistor isolation dielectrics 130, the gate dielectrics 38, the semiconductor material strips 140, and the gate semiconductor material portions 49 can contact the shallow trench isolation structure 20. In one embodiment, the top surfaces of the semiconductor material strips 140 and the gate semiconductor material portions 49 can be located within a same horizontal plane as the top surface of the shallow trench isolation structure 20.

Referring to FIGS. 18A and 18B, a second isolation dielectric layer 50L and a second semiconductor material layer 60L can be deposited over the semiconductor material strips 140 and the gate semiconductor material portions 49 as continuous material layers. The second isolation dielectric layer 50L can include any dielectric material that may be employed as a resistor isolation dielectric of a resistor, i.e., any dielectric material that can function as an electrical isolation material. In one embodiment, the second isolation dielectric layer 50L includes silicon oxide, silicon nitride, and/or a dielectric metal oxide. The thickness of the second isolation dielectric layer 50L may be in a range from 1 nm to 20 nm, such as from 2 nm to 12 nm and/or from 4 nm to 10 nm, although lesser and greater thicknesses may also be employed. The second isolation dielectric layer 50L may, or may not, include the same material as the first resistor isolation dielectrics 130. The second isolation dielectric layer 50L may, or may not, have the same thickness as the first resistor isolation dielectrics 130.

A second semiconductor material layer 60L can be deposited over, and directly on, the second isolation dielectric layer 50L. The second semiconductor material layer 60L may be the same as in the first exemplary structure (e.g., may comprise polysilicon). Alternatively, if a capacitor structure in the first exemplary structure is not manufactured concurrently with formation of the second exemplary structure, the second semiconductor material layer 60L may include any semiconductor material, and may be undoped, p-doped, or n-doped. In one embodiment, the second semiconductor material layer 60L may be conductive. In another embodiment, the second semiconductor material layer 60L may be semiconducting. The second semiconductor material layer 60L may be deposited employing chemical vapor deposition. The second semiconductor material layer 60L may be undoped, be in-situ doped with electrical dopants during deposition of the second semiconductor material layer 60L, or may be ex-situ doped after deposition of an intrinsic semiconductor material by performing a low energy ion implantation process. The thickness of the second semiconductor material layer 60L may be in a range from 20 nm to 200 nm, such as 60 nm to 100 nm, although lesser and greater thicknesses may also be employed.

Referring to FIGS. 19A and 19B, a photoresist layer (not shown) can be applied over the second semiconductor material layer 60L, and can be lithographically patterned to cover an area that includes an entire set of the first substrate semiconductor portion 10R that is laterally enclosed within a periphery of a shallow trench isolation structure 20 in a top-down view, i.e., in a plan view. An outer periphery of the patterned portion of the photoresist layer may be laterally offset outward from the periphery of the shallow trench isolation structure 20 that laterally encloses the set of the first substrate semiconductor portion 10R. In one embodiment, the entirety of the outer periphery of the patterned portion of the photoresist layer may be located within the area of the shallow trench isolation structure such that the outer periphery of the patterned portion of the photoresist layer does not overly any of the first substrate semiconductor portions 10R.

According to an aspect of the present disclosure, the photoresist layer can be patterned to provide a pair of openings over end portions of each semiconductor material strip 140. In other words, one opening in the photoresist layer is formed over a first end portion of each semiconductor material strip 140 and another opening in the photoresist layer is formed over a second end portion of each semiconductor material strip 140. The areas of openings in the photoresist layer correspond to the areas in which electrical contacts to an underlying semiconductor material strip 140 are to be subsequently formed. In one embodiment, the positions of the openings in the photoresist layer may be offset from the end of a respective one of the semiconductor material strips 140 to increase nearest neighbor distances among the openings in the photoresist layer and reduce a pattern failure in the photoresist layer during the lithographic patterning process. For example, if the semiconductor material strips 140 laterally extend along the first horizontal direction hd1 and are spaced apart along the second horizontal direction hd2, then the openings in the photoresist layer to adjacent semiconductor material strips 140 that are offset along the second horizontal direction hd2 may be laterally shifted along the first horizontal direction hd1 to increase distances among neighboring pairs of openings and to reduce the probability of electrical shorts among contact structures to be subsequently formed.

At least one etch process can be performed to remove unmasked portions of the second semiconductor material layer 60L and the second isolation dielectric layer 50L. In one embodiment, the at least one etch process may include a first etch process that etches unmasked portions of the second semiconductor material layer 60L selective to the material of the second isolation dielectric layer 50L, and a second etch process that etches unmasked portions of the second isolation dielectric layer 50L selective to the material of the semiconductor material strips 140.

The first etch process and/or the second etch process may include at least one anisotropic etch process (such as a reactive ion etch process) or an isotropic etch process (such as a wet etch process). For example, a wet etch process employing hot trimethyl-2 hydroxyethyl ammonium hydroxide ("hot TMY") or tetramethyl ammonium hydroxide (TMAH) may be performed to remove unmasked portions of the second semiconductor material layer 60L during a first etch process, and a wet etch process employing an etchant that etches the dielectric material of the second isolation dielectric layer 50L may be employed to remove unmasked portions of the second isolation dielectric layer 50L. The remaining patterned portion of the second semiconductor material layer 60L comprises a semiconductor sheet 160, and the remaining patterned portion of the second isolation dielectric layer 50L comprises a second resistor isolation dielectric 150. A second stack of the second resistor isolation dielectric 150 and the semiconductor sheet 160 can be formed over the first stacks of the first resistor isolation dielectric 130 and the semiconductor material strips 140. The periphery of the bottom surface of the semiconductor sheet 160 may coincide with the periphery of the top surface of the second resistor isolation dielectric 150. The sidewalls of the second resistor isolation dielectric 150 and the semiconductor sheet 160 can be vertically coincident.

A stack of a second resistor isolation dielectric 150 and a semiconductor sheet 160 can be formed on the top surfaces of semiconductor material strips 140. Each top surface of the semiconductor material strips 140 may contact the bottom surface of the second resistor isolation dielectric 150. A pair of openings 161 in the second stack of the second resistor isolation dielectric 150 and the semiconductor sheet 160 can be formed over each semiconductor material strip 140. A top surface of a semiconductor material strip 140 can be physically exposed at the bottom of each opening 161 through the second stack of the second resistor isolation dielectric 150 and the semiconductor sheet 160. In one embodiment, if the second stack of the second resistor isolation dielectric 150 and the semiconductor sheet 160 overlies N semiconductor material strips 140, the total number of openings 161 through the second stack of the second resistor isolation dielectric 150 and the semiconductor sheet 160 can be 2N.

Referring to FIGS. 20A and 20B, a metallic material layer 70L and a dielectric cap layer 80L can be deposited over the second stack of the second resistor isolation dielectric 150 and the semiconductor sheet 160, the gate semiconductor material portions 49, and the shallow trench isolation structure 20. The metallic material layer 70L in the second exemplary structure includes any material that may be employed for the metallic material layer 70L in the first exemplary structure, and may have the same thickness as in the first exemplary structure. The metallic material layer 70L includes downward-protruding portions that vertically extend through the openings 161 in the second stack of the second resistor isolation dielectric 150 and the semiconductor sheet 160 and contact a top surface of a respective one of the semiconductor material strips 140.

The dielectric cap layer 80L includes a dielectric capping material that is resistant to diffusion of metal and impurity ions. For example, the dielectric cap layer 80L can include silicon nitride. The dielectric cap layer 80L may be deposited, for example, by chemical vapor deposition. The thickness of the dielectric cap layer 80L can be in a range from 10 nm to 60 nm, although lesser and greater thicknesses may also be employed.

Referring to FIGS. 21A and 21B, a photoresist layer (not shown) can be applied over the dielectric cap layer 80L, and can be lithographically patterned to cover an area overlying the second stack of the second resistor isolation dielectric 150 and the semiconductor sheet 160 and each gate area of transistors to be subsequently formed over the second substrate semiconductor portions 10T. In one embodiment, the area of a patterned portion of the photoresist layer overlying the second stack of the second resistor isolation dielectric 150 and the semiconductor sheet 160 can include the entire area of the second stack of the second resistor isolation dielectric 150 and the semiconductor sheet 160. In one embodiment, the periphery of the patterned portion of the photoresist layer overlying the second stack of the second resistor isolation dielectric 150 and the semiconductor sheet 160 can be laterally offset outward from the sidewalls of the second stack of the second resistor isolation dielectric 150 and the semiconductor sheet 160 by a finite lateral spacing, which may be in a range from 10 nm to 200 nm, although lesser and greater spacings may also be employed. Thus, the periphery of the patterned portion of the photoresist layer overlying the second stack of the second resistor isolation dielectric 150 and the semiconductor sheet 160 may be laterally offset outward from a closed periphery of the portion of the shallow trench isolation structure 20 that laterally surrounds, and contacts, the first substrate semiconductor portions 10R. Each patterned portion of the photoresist layer that overlies a respective one of the second substrate semiconductor portion 10T may laterally traverse a center portion of the respective one of the second substrate semiconductor portion 10T. The width each patterned portion of the photoresist layer may correspond to the gate length of a respective field effect transistor to be subsequently formed.

An anisotropic etch process can be performed to transfer the pattern in the photoresist layer through the dielectric cap layer 80L, the metallic material layer 70L, and each of the gate semiconductor material portions 49 by performing an anisotropic etch process, such as an RIE process that stops on silicon oxide or a dielectric metal oxide material within the first resistor isolation dielectric 130 and the gate dielectrics 38. The semiconductor material strips 140 are covered by the photoresist layer pattern as well as by the second stack of the second resistor isolation dielectric 150 and the semiconductor sheet 160, and thus, are not etched at this processing step.

Patterned portions of the dielectric cap layer 80L include a dielectric cap sheet 180S formed over the second stack of the second resistor isolation dielectric 150 and the semiconductor sheet 160, and includes dielectric gate caps 88 formed across a respective one of the second substrate semiconductor portions 10T. Patterned portions of the metallic material layer 70L include a metallic sheet 170S formed over the second stack of the second resistor isolation dielectric 150 and the semiconductor sheet 160, and includes metallic gate electrodes 78 formed across a respective one of the second substrate semiconductor portions 10T. The second stack of the second resistor isolation dielectric 150 and the semiconductor sheet 160 are encapsulated by the metallic sheet 170S, the semiconductor material strips 140, and the shallow trench isolation structure 20, and is not etched by the anisotropic etch process. Each patterned portion of the gate semiconductor material portions 49 comprises a semiconductor gate electrode 48. The first resistor isolation dielectric 130 and the gate dielectrics 38 can function as etch stop structures for the anisotropic etch process. The first resistor isolation dielectrics 130 may cover a respective first substrate semiconductor portion 10R, and the gate dielectrics 38 may cover the entire top surface of a respective one of the second substrate semiconductor portions 10T.

The sidewalls of the dielectric cap sheet 180S and the metallic sheet 170S can be vertically coincident with each other. Each combination of a semiconductor gate electrode 48 and a metallic gate electrode 78 constitutes a composite gate electrode (48, 78). The sidewalls of each contiguous set of a semiconductor gate electrode 48, a metallic gate electrode 78, and a dielectric gate cap 88 can be vertically coincident with each other. Each contiguous combination of a semiconductor gate electrode 48, a metallic gate electrode 78, and a dielectric gate cap 88 constitutes a gate stack (38, 78, 88).

Electrical dopants can be implanted into regions of the second substrate semiconductor portions 10T that are not masked by the gate stacks (38, 78, 88) to form source and drain extension regions (7, 9). The source and drain extension regions (7, 9) can include source extension regions 7 formed on one side of a respective composite gate electrode (48, 78) and drain extension regions 9 formed on another side of a respective composite gate electrode (48, 78). In one embodiment, masked ion implantation processes can be employed to form a first subset of the source and drain extension regions (7, 9) having a p-type doping, and to form a second subset of the source and drain extension regions (7, 9) having an n-type doping, if CMOS transistors are formed.

Figure 22A:
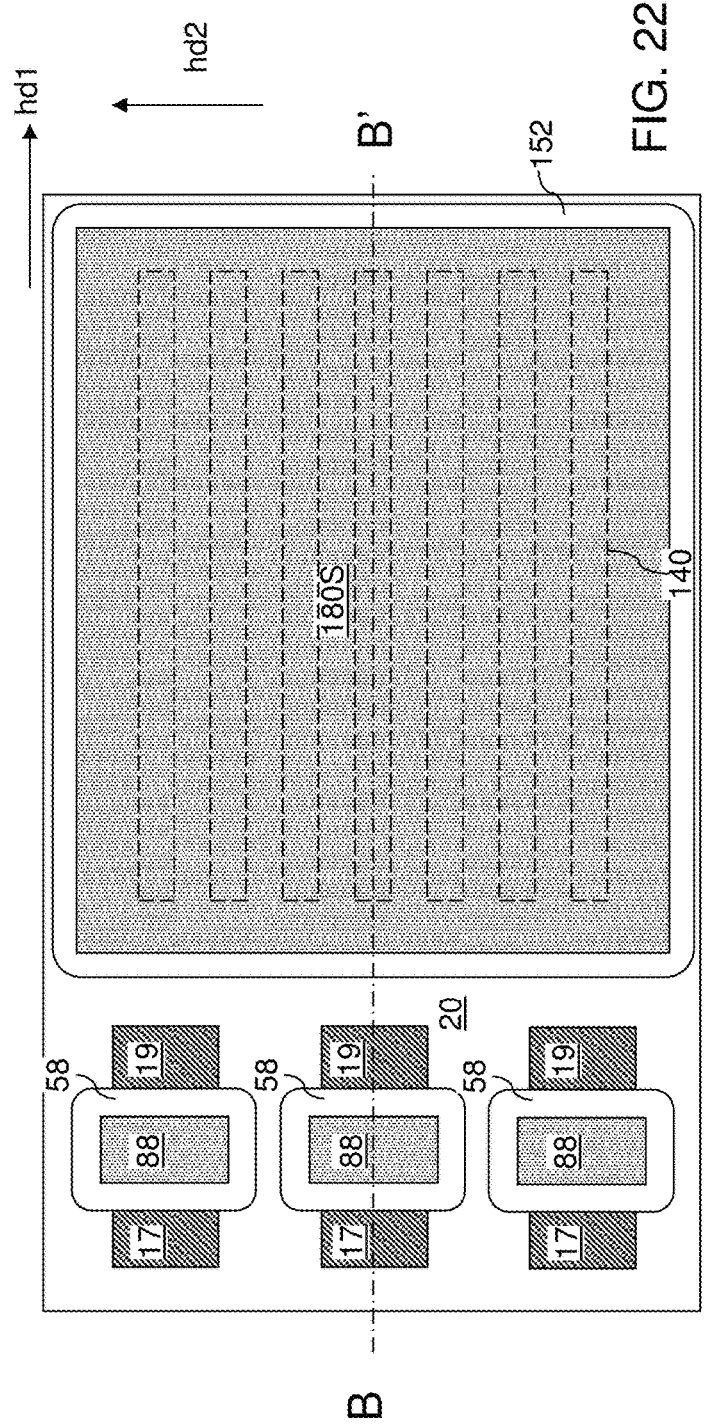
FIG. 22A is a schematic vertical cross-sectional view of the second exemplary structure after formation of a dielectric resistor spacer, a dielectric gate spacer, and source and drain regions according to the second embodiment of the present disclosure.
Figure 22B:
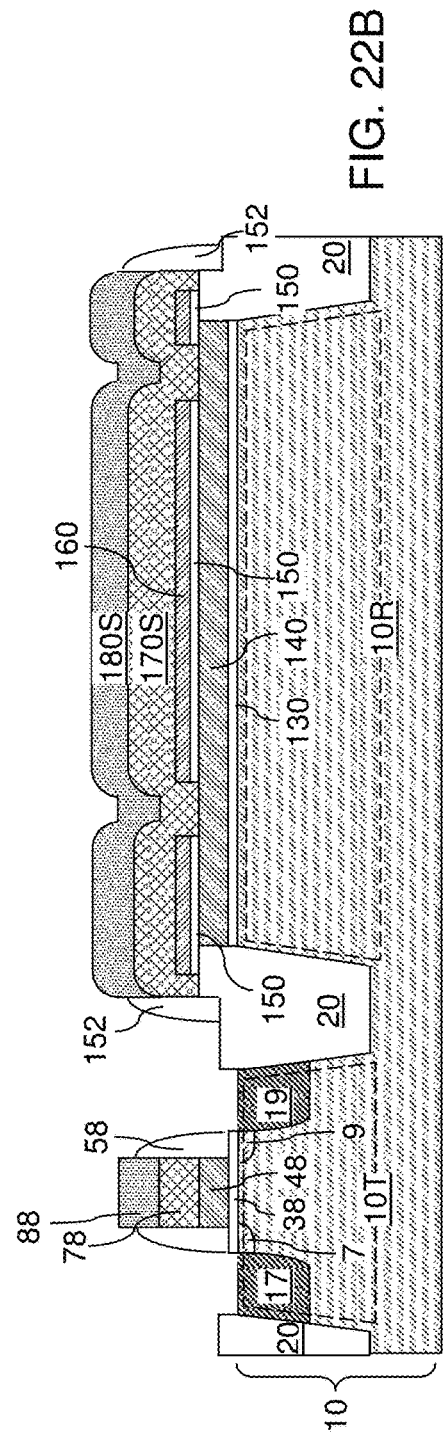
FIG. 22B is a top-down view of the second exemplary structure along the vertical plane B-B' of FIG. 22A.

Referring to FIGS. 22A and 22B, a dielectric material layer can be conformally deposited over the second exemplary structure, and can be anisotropically etched using a sidewall spacer etch to remove horizontally-extending portions of the dielectric material layer. The dielectric material layer includes at least one dielectric material such as silicon nitride and/or silicon oxide. In one embodiment, the dielectric material layer may include a layer stack of a silicon nitride layer and a silicon oxide layer. Each remaining portion of the dielectric material layer includes a vertical portion that laterally surrounds sidewalls of a respective layer stack. For example, a dielectric resistor spacer 152 can laterally surround a layer stack including the first resistor isolation dielectrics 130, the semiconductor material strips 140, the second resistor isolation dielectric 150, the semiconductor sheet 160, the metallic sheet 170S, and the dielectric cap sheet 180S. The dielectric resistor spacer 152 can contact sidewalls of the metallic sheet 170S and the dielectric cap sheet 180S, and can be laterally spaced from the second resistor isolation dielectric 150, the semiconductor sheet 160, and the semiconductor material strips 140 by the metallic sheet 170S. A dielectric gate spacer 58 can laterally surround and can contact sidewalls of a gate stack including a semiconductor gate electrode 48, a metallic gate electrode 78, and the dielectric gate cap 88. The lateral thickness of the dielectric resistor spacer 152 and each dielectric gate spacer 58 may be in a range from 15 nm to 120 nm, such as from 30 nm to 60 nm, although lesser and greater lateral thicknesses may also be employed.

The anisotropic etch process that removes horizontal portions of the dielectric material layer collaterally etches portions of the gate dielectrics 38 that are not masked by the dielectric gate spacers 58. The sidewalls of each remaining portion of the gate dielectrics 38 can be vertically coincident with a bottom periphery of an outer sidewall of a respective overlying dielectric gate spacer 58. Further, the entirety of the bottom surface of the dielectric resistor spacer 152 may contact a top surface of the shallow trench isolation structure 20. The dielectric resistor spacer 152 that laterally surrounds and contacts sidewalls of the metallic sheet 170S and the dielectric cap sheet 180S. The semiconductor material strips (i.e., the resistor strips) 140 are not damaged during the sidewall spacer (58, 152) etch because they are covered by overlying layers and not exposed during the sidewall spacer etch.

Electrical dopants can be implanted into regions of the second substrate semiconductor portions 10T that are not masked by the gate stacks (38, 78, 88) or by the dielectric gate spacers 58 to form source and drain regions (17, 19). The source and drain regions (17, 19) can include source regions 17 formed on one side of a respective composite gate electrode (48, 78) and drain regions 19 formed on another side of a respective composite gate electrode (48, 78). In one embodiment, masked ion implantation processes can be employed to form a first subset of the source and drain regions (17, 19) having a p-type doping, and to form a second subset of the source and drain regions (17, 19) having an n-type doping, if CMOS transistors are fabricated. Implanted portions of the source and drain extension regions (7, 9) can be incorporated into a respective one of the source and drain regions (17, 19). Field effect transistors are formed in the regions including or overlying the second substrate semiconductor portions 10T.

Thus, a field effect transistor can be formed on the second substrate semiconductor portions 10T of the substrate semiconductor layer 10. Each field effect transistor can include a gate dielectric 38 and a semiconductor gate electrode 48, which is a patterned portion of a gate semiconductor material portion 49. Each gate dielectric 38 comprises a same material as, and has a same thickness as, the first resistor isolation dielectric 130. In one embodiment one or more of the semiconductor gate electrodes 48 may comprise a same material as and has a same thickness as the semiconductor material strips 140. In one embodiment, each field effect transistor may also comprise a metallic gate electrode 78 that comprises a same material as and has a same thickness as the metallic sheet 170S.

Referring to FIGS. 23A and 23B, a photoresist layer 177 can be applied over the second exemplary structure, and can be lithographically patterned to form an opening within the area enclosed by sidewalls of the metallic sheet 170S and a plurality of discrete patterned photoresist material portions 177A laterally surrounded by the opening within the area of the metallic sheet 170S. The sidewalls of the opening in the photoresist layer can be laterally offset inward from the sidewalls of the metallic sheet 170S formed at the processing steps of FIGS. 21A and 21B. The sidewalls of each discrete patterned photoresist material portion 177A can be formed such that the periphery of each patterned photoresist material portion encloses, and is laterally offset outward, from an underlying opening 161 through the second stack of the second resistor isolation dielectric 150 and the semiconductor sheet 160. If N semiconductor material strips 140 are present under the second stack of the second resistor isolation dielectric 150 and the semiconductor sheet 160, and if 2N openings through the second stack of the second resistor isolation dielectric 150 and the semiconductor sheet 160 are provided at end portions of the semiconductor material strips 140, 2N discrete photoresist material portions 177A located within an opening in a continuous portion of the photoresist layer 177 can be formed over the second stack of the second resistor isolation dielectric 150 and the semiconductor sheet 160. In one embodiment, the periphery of the opening in the photoresist layer may be laterally recessed inward from the sidewall of the metallic sheet 170S in a plan view, i.e., a top-down view. In one embodiment, the periphery of the opening in the photoresist layer may be uniformly offset inward from the sidewalls of the metallic sheet 170S by a uniform lateral offset distance, which may be in a range from 20 nm to 200 nm, such as from 40 nm to 100 nm, although lesser and greater lateral offset distances may also be employed.

An anisotropic etch process can be performed to remove portions of the dielectric cap sheet 180S, the metallic sheet 170S, and the semiconductor sheet 160 that are not masked by the photoresist layer 177. The second resistor isolation dielectric 150 can function as an etch stop structure for the anisotropic etch process. For example, the anisotropic etch process can include a first anisotropic etch step that etches the material of the dielectric cap sheet 180S, a second anisotropic etch step that etches the material of the metallic sheet 170S, and a third anisotropic etch process that etches the semiconductor material of the semiconductor sheet 160 selective to the material of the second resistor isolation dielectric 150. Therefore, the semiconductor material strips (i.e., resistor strips) 140 are also not exposed during this etching step.

A trench 179 laterally surrounding discrete patterned portions of the dielectric cap sheet 180S, the metallic sheet 170S, and the semiconductor sheet 160 can be formed in a volume from which the materials of the dielectric cap sheet 180S, the metallic sheet 170S, and the semiconductor sheet 160 are etched by the anisotropic etch process.

Each of the dielectric cap sheet 180S, the metallic sheet 170S, and the semiconductor sheet 160 is divided into resistor contact assemblies (101A, 101B) laterally surrounded by the trench 179 and a peripheral stack 101P that laterally surrounds the trench 179 by the anisotropic etch process. Therefore, the likelihood of etch damage to the semiconductor material strips 140 is reduced by etching the sidewall spacers (58, 152) before etching that forms the resistor contact assemblies (101A, 101B). The reduced damage to the strips 140 reduces the resistance variation between different strips 140, which may provide the ability to reduce the size of the strips 140 without negatively affecting their resistance. The resistor structure layout also makes the gate electrode RIE optimization easier because the step height difference between the layers is reduced. Furthermore, the resistor contact assemblies (101A, 101B) do not have sidewall spacers. Finally, a dummy stack of portions of the dielectric cap sheet 180S, the metallic sheet 170S, and the semiconductor sheet 160 may be omitted from a space between the pairs of resistor contact assemblies (101A, 101B) and replaced by the trench 179 located between the resistor contact assemblies (101A, 101B).

The resistor contact assemblies (101A, 101B) include first resistor contact assemblies 101A that are formed on an first end portion of each semiconductor material strip 140 and second resistor contact assemblies 101B that are formed on a second end portion of each semiconductor material strip 140. A first resistor contact assembly 101A and a second resistor contact assembly 101B can be formed on each semiconductor material strip 140. The photoresist layer 177 can be subsequently removed, for example, by ashing.

The dielectric cap sheet 180S is divided into first dielectric caps 180A overlying a first end portion of a respective semiconductor material strip 140, second dielectric caps 180B overlying a second end portion of a respective semiconductor material strip 140, and a peripheral dielectric cap 180P located outside the trench 179. Each metallic sheet 170S is divided into a first metallic plate 170A overlying a first end portion of a respective semiconductor material strip 140, a second metallic plate 170B overlying a second end portion of a respective semiconductor material strip 140, and a peripheral metallic plate 170P located outside the trench 179. The semiconductor sheet 160 is divided into a first semiconductor plate 160A overlying a first end portion of a respective semiconductor material strip 140, a second semiconductor plate 160B overlying a second end portion of a respective semiconductor material strip 140, and a peripheral semiconductor plate 160P located outside the trench 179.

Generally, a combination of a dielectric cap sheet 180S, the metallic sheet 170S, and the semiconductor sheet 160 is divided into the resistor contact assemblies (101A, 101B) and the peripheral stack 101P by the trench 179 after formation of the dielectric resistor spacer 152 and the dielectric gate spacers 58. The trench 179 laterally surrounds each of the resistor contact assemblies (101A, 101B), and is laterally surrounded by the peripheral stack 101P. All sidewalls of the resistor contact assemblies (101A, 101B) and inner sidewalls of the peripheral stack 201 are physically exposed to the trench 179.

Each first resistor contact assembly 101A comprises a stack of a first semiconductor plate 160A, a first metallic plate 170A, and a first dielectric cap 180A. Each second resistor contact assembly 101B comprises a stack of a second semiconductor plate 160B, a second metallic plate 170B, and a second dielectric cap 180B. The peripheral stack 101P comprises a peripheral semiconductor plate 160P, a peripheral metallic plate 170P, and a peripheral dielectric cap 180P. The first semiconductor plates 160A, the second semiconductor plates 160B, and the peripheral semiconductor plate 160P are patterned portions of the semiconductor sheet 160. The first metallic plates 170A, the second metallic plates 170B, and the peripheral metallic plate 170P are patterned portions of the metallic sheet 170S. The first dielectric caps 180A, the second dielectric caps 180B, and the peripheral dielectric cap 180P are patterned portions of the dielectric cap sheet 180S.

The trench 179 can laterally surround each of the first resistor contact assemblies 101A and the second resistor contact assemblies 101B, and can be laterally surrounded by the peripheral stack 101P. In one embodiment, each first resistor contact assembly 101A can comprise a first semiconductor plate 160A including an opening therein and a first metallic plate 170A extending through an opening in the first semiconductor plate 160A and contacting a first area of a top surface of a respective semiconductor material strip 140, and each second resistor contact assembly 101B can comprise a second semiconductor plate 160B including an opening therein and a second metallic plate 170B extending through an opening in the second semiconductor plate 160B and contacting a second area of the top surface of a respective semiconductor material strip 140. The peripheral stack 101P comprises a peripheral semiconductor plate 160P and a peripheral metallic plate 170P and is electrically isolated from the semiconductor material strips 140. The peripheral semiconductor plate 160P comprises a same material as the first semiconductor plates 160A and the second semiconductor plates 160B, and the peripheral metallic plate 170P comprises a same material as the first metallic plates 170A and the second metallic plates 170B.

Referring to FIGS. 24A and 24B, at least one contact-level dielectric material can be deposited over the second resistor isolation dielectric 150, the resistor contact assemblies (101A, 101B), the peripheral stack 101P, and the field effect transistors to form at least one contact-level dielectric layer 90. The at least one contact-level dielectric layer 90 can laterally extend over the second resistor isolation dielectric 150, the resistor contact assemblies (101A, 101B), the peripheral stack 101P, and the field effect transistors, and comprises a downward-protruding portion that fills the trench 179 and contacts the second resistor isolation dielectric 150. In one embodiment, the at least one contact-level dielectric layer 90 may include a dielectric liner 90A and a planarization dielectric layer 90B that includes a planarizable dielectric material. For example, the dielectric liner 90A may include a dielectric diffusion barrier material such as silicon nitride, and the planarization dielectric layer 90B may include undoped silicate glass or a doped silicate glass. The thickness of the dielectric liner 90A may be in a range from 4 nm to 20 nm, although lesser and greater thicknesses may also be employed.

The downward-protruding portion of the at least one contact-level dielectric layer fills the trench 179. Generally, the peripheral stack 101P includes an opening defined by an inner sidewall (which can be the outer sidewall of the trench 179), and laterally surrounds the resistor contact assemblies (101A, 101B) and is laterally spaced from the resistor contact assemblies (101A, 101B). The downward-protruding portion of the at least one contact-level dielectric layer 90 can be formed directly on a surface of the second resistor isolation dielectric 150, which may be a top surface or a recessed horizontal surface of the second resistor isolation dielectric 150. The downward-protruding portion of the at least one contact-level dielectric layer 90 can be formed directly on the sidewalls of the resistor contact assemblies (101A, 101B) and the inner sidewalls of the peripheral stack 101P. The downward-protruding portion of the at least one contact-level dielectric layer 90 can be in contact with a top surface of the second resistor isolation dielectric 150, and can be vertically spaced from the semiconductor material strips 140 by the second resistor isolation dielectric 150.

Referring to FIGS. 25A and 25B, contact via structures (192, 194, 97, 98, 99) can be formed through the at least one contact-level dielectric layer 90 on a respective node of the resistor structure or the field effect transistors. The contact via structures (192, 194, 97, 98, 99) can include first contact via structures 192 that contact a respective first metallic plate 170A and second contact via structures 194 that contact a respective second metallic plate 170B. While only a single respective contact via structure (192, 194) which contacts one respective resistor contact assembly (101A, 101B) is shown in FIG. 25A, in an alternative configuration, two or more respective contact via structures (192, 194) may contact one respective resistor contact assembly (101A, 101B). Further, the contact via structures (192, 194, 97, 98, 99) can include source contact via structures 97 that contact a respective source region 17, drain contact via structures 99 that contact a respective drain region 19, and gate contact via structures 98 that contact a respective one of the composite gate electrodes (48, 78).

Referring to FIGS. 15A-25B and according to various embodiments of the present disclosure, a semiconductor structure is provided, which comprises a resistor structure located on a semiconductor substrate including a substrate semiconductor layer 10. The resistor structure comprises: a first resistor isolation dielectric 130 located on a top surface of a first substrate semiconductor portion 10R of the substrate semiconductor layer 10; a semiconductor material strip 140 located on a top surface of the first resistor isolation dielectric 130; a first resistor contact assembly 101A comprising a first semiconductor plate 160A including an opening therein and a first metallic plate 170A extending through an opening in the first semiconductor plate 160A and contacting a first area of a top surface of the semiconductor material strip 140; a second resistor contact assembly 101B comprising a second semiconductor plate 160B including an opening therein and a second metallic plate 170B extending through an opening in the second semiconductor plate 160B and contacting a second area of the top surface of the semiconductor material strip 140; and a peripheral stack 101P comprising a peripheral semiconductor plate 160P and a peripheral metallic plate 170P and electrically isolated from the semiconductor material strip 140, wherein the peripheral semiconductor plate 160P comprises a same material as the first semiconductor plate 160A and the second semiconductor plate 160B, and the peripheral metallic plate 170P comprises a same material as the first metallic plate 170A and the second metallic plate 170B.

In one embodiment, the resistor structure comprises a second resistor isolation dielectric 150 that contacts a top surface of the semiconductor material strip 140, a bottom surface of the first semiconductor plate 160A, and a bottom surface of the second semiconductor plate 160B. In one embodiment, the second resistor isolation dielectric 150 contacts a bottom surface of the peripheral semiconductor plate 160P.

In one embodiment, the second resistor isolation dielectric 150 contacts a sidewall of the first metallic plate 170A, a sidewall of the second metallic plate 170B, and a sidewall of the peripheral metallic plate 170P. In one embodiment, the resistor structure comprises: an additional first resistor isolation dielectric 130 located on a top surface of an additional first substrate semiconductor portion 10R and laterally spaced from the first resistor isolation dielectric 130 by a shallow trench isolation structure 20; and an additional semiconductor material strip 140 (e.g., another strip 140 that is spaced from the first strip 140 along the second horizontal direction hd2) located on a top surface of the additional first resistor isolation dielectric 130, laterally spaced from the semiconductor material strip 140 by the shallow trench isolation structure 20, and contacting a bottom surface of the second resistor isolation dielectric 150.

In one embodiment, a bottom surface of the first metallic plate 170A contacts a top surface of the first semiconductor plate 160A; and a sidewall of the first metallic plate 170A is vertically coincident with an outer sidewall of the first semiconductor plate 160A. In ne embodiment, the peripheral stack 101P comprises an opening that extends from a top surface of the peripheral stack 101P to a bottom surface of the peripheral stack 101P, wherein the first resistor contact assembly 101A and the second resistor contact assembly 101B are located within the opening in the peripheral stack 101P. A dielectric resistor spacer 152 can laterally surround, and can contact outer sidewalls of, the peripheral stack 101P. However, the first resistor contact assembly 101A and the second resistor contact assembly 101B do not have dielectric resistor spacers on their respective sidewalls.

At least one contact-level dielectric layer 90 laterally extending over the first resistor contact assembly 101A, the second resistor contact assembly 101B, and the peripheral stack 101P, and comprising a downward-protruding portion that protrudes into the opening in the peripheral stack 101P. In one embodiment, the downward-protruding portion of the at least one contact-level dielectric layer 90 contacts sidewalls of the first resistor contact assembly 101A, sidewalls of the second resistor contact assembly 101B, an inner sidewall of the peripheral stack 101P, and an outer sidewall of the dielectric resistor spacer 152.

In one embodiment, the semiconductor structure comprises a field effect transistor located on a second substrate semiconductor portion 10T of the substrate semiconductor layer 10 and comprising a gate dielectric 38 that comprises a same material as, and has a same thickness as, the first resistor isolation dielectric 130. In one embodiment, the field effect transistor comprises a semiconductor gate electrode 48 that comprises a same material as, and has a same thickness as, the semiconductor material strip 140. In one embodiment, the field effect transistor comprises a metallic gate electrode 78 that comprises a same material as, and has a same thickness as, each of the first metallic plate 170A and the second metallic plate 170B.

The various processing steps of the present disclosure can be employed to provide a capacitor structure and/or a resistor structure concurrently with formation of field effect transistors. Gate materials are employed as components of the capacitor structure and/or the resistor structure. In one embodiment, the capacitor structure and/or the resistor structure may be formed on a same semiconductor substrate as the transistors. At least one of a capacitor or a resistor structure can be formed concurrently with formation of the field effect transistor by patterning a gate dielectric layer into gate dielectric and into a first node dielectric or a first resistor isolation dielectric, and by patterning a semiconductor layer into a gate electrode and into a second electrode of a capacitor or a resistor strip. Contacts are then formed to the capacitor or resistor structure. Sidewall spacers may be formed on the gate electrode prior to patterning the capacitor or resistor contacts to reduce etch damage to the underlying capacitor or resistor layers.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising a capacitor structure located on a semiconductor substrate including a substrate semiconductor layer, wherein the capacitor structure comprises:
   a first electrode comprising a first substrate semiconductor portion of the substrate semiconductor layer;
   a first node dielectric located on a top surface of the first substrate semiconductor portion of the substrate semiconductor layer;
   a second electrode comprising a first semiconductor plate located on a top surface of the first node dielectric;
   a second node dielectric located on a top surface of the first semiconductor plate;
   a third electrode comprising a stack of a primary semiconductor plate and a primary metallic plate;
   a moat trench laterally surrounding the third electrode;
   a peripheral stack laterally surrounding the third electrode, wherein the peripheral stack comprises a peripheral semiconductor plate and a peripheral metallic plate, and wherein the peripheral semiconductor plate contacts a peripheral portion of a top surface of the second node dielectric, comprises a same material as the primary semiconductor plate, and is laterally spaced from the primary semiconductor plate; and
   at least one contact-level dielectric layer laterally extending over the third electrode and the peripheral stack.

2. The semiconductor structure of claim 1, wherein the at least one contact-level dielectric layer comprises a downward-protruding portion that fills the moat trench and contacts the second node dielectric exposed in the moat trench.

3. The semiconductor structure of claim 2, wherein the downward-protruding portion of the at least one contact-level dielectric layer is vertically spaced from the second electrode by the second node dielectric.

4. The semiconductor structure of claim 2, wherein each outer sidewall of the peripheral stack is vertically coincident with a respective sidewall of the second electrode.

5. The semiconductor structure of claim 4, further comprising a dielectric capacitor spacer laterally surrounding, and contacting, the second electrode and the peripheral stack and contacting a peripheral portion of the top surface of the first node dielectric.

6. The semiconductor structure of claim 5, wherein a top edge of a sidewall of the first node dielectric coincides with a bottom periphery of an outer sidewall of the dielectric capacitor spacer.

7. The semiconductor structure of claim 1, wherein:
   the peripheral metallic plate comprises a same metallic material as the primary metallic plate; and
   the peripheral stack comprises a peripheral dielectric cap contacting a top surface of the peripheral metallic plate.

8. The semiconductor structure of claim 1, further comprising a shallow trench isolation structure laterally surrounding the first substrate semiconductor portion, wherein an entire bottom periphery of the first node dielectric is in contact with the top surface of the substrate semiconductor portion and is laterally offset inward from an inner periphery of a portion of the shallow trench isolation structure that laterally surrounds the first substrate semiconductor portion.

9. The semiconductor structure of claim 1, further comprising a shallow trench isolation structure laterally surrounding the first substrate semiconductor portion, wherein a portion of the second node dielectric and a portion of the peripheral stack overlies and contacts a top surface of the shallow trench isolation structure.

10. The semiconductor structure of claim 1, further comprising a field effect transistor located on a second substrate semiconductor portion of the substrate semiconductor layer and comprising a gate dielectric that comprises a same material as, and has a same thickness as, the first node dielectric.

11. The semiconductor structure of claim 10, wherein the field effect transistor comprises a semiconductor gate electrode that comprises a same material as and has a same thickness as the first semiconductor plate, and a metallic gate electrode that comprises a same material as and has a same thickness as each of the primary metallic plate and the peripheral metallic plate.

12. The semiconductor structure of claim 1, further comprising:
   a first contact via structure that extends through the at least one contact-level dielectric layer and contacts the first electrode;
   a second contact via structure that that extends through the at least one contact-level dielectric layer and electrically contacts the second electrode through the peripheral metallic plate; and
   a third contact via structure that that extends through the at least one contact-level dielectric layer and contacts the third electrode.

13. The semiconductor structure of claim 12, wherein:
   the first electrode, the first node dielectric and the second electrode form a first capacitor; and
   the second electrode, the second node dielectric, and the third electrode form a second capacitor.

14. A method of forming a semiconductor structure comprising a capacitor structure on a semiconductor substrate including a substrate semiconductor layer, the method comprising:
   forming a first stack including a first node dielectric and a first semiconductor plate on a top surface the first substrate semiconductor portion of the substrate semiconductor layer;
   forming a second stack including a second node dielectric and a semiconductor sheet over the first stack;
   forming a metallic sheet over the second stack and over a peripheral portion of a top surface of the first semiconductor plate;
   dividing the metallic sheet and the semiconductor sheet into an inner layer stack surrounded by a moat trench and a peripheral stack surrounding the moat trench, wherein sidewalls of the inner layer stack and sidewalls of the peripheral stack are physically exposed in the moat trench;
   forming at least one contact-level dielectric layer directly on the sidewalls of the inner layer stack and the sidewalls of the peripheral stack; and
   forming contact via structures through the at least one contact-level dielectric layer on the inner layer stack and on the peripheral stack,
wherein:
   the inner layer stack comprises a primary semiconductor plate and a primary metallic plate;
   the peripheral stack includes a peripheral semiconductor plate and a peripheral metallic plate;
   the primary semiconductor plate and the peripheral semiconductor plate are patterned portions of the semiconductor sheet; and
   the primary metallic plate and the peripheral metallic plate are patterned portions of the metallic sheet.

15. The method of claim 14, wherein the moat trench laterally surrounds a third electrode which comprises the primary semiconductor plate and the primary metallic plate.

16. The method of claim 15, wherein the at least one contact-level dielectric layer comprises a downward-protruding portion that fills the moat trench.

17. The method of claim 16, wherein the downward-protruding portion of the at least one contact-level dielectric layer is formed directly on a surface of the second node dielectric.

18. The method of claim 14, further comprising:
depositing a metallic material layer over the semiconductor plate;
patterning the metallic material layer into the metallic sheet; and
forming a dielectric capacitor spacer that laterally surrounds the metallic sheet on a sidewall of the metallic sheet,
wherein the metallic sheet and the semiconductor sheet are divided into the inner layer stack and the peripheral stack after formation of the dielectric capacitor spacer.

19. The method of claim 14, further comprising:
forming an isolation dielectric layer over the first substrate semiconductor portion and a second substrate semiconductor portion of the substrate semiconductor layer;
forming a first semiconductor material layer over the isolation dielectric layer;
patterning the isolation dielectric layer and the first semiconductor material layer, wherein patterned portions of the isolation dielectric layer comprise the first node dielectric and a gate dielectric formed on the second substrate semiconductor portion, and patterned portions of the first semiconductor material layer comprise the first semiconductor plate and a gate semiconductor material portion; and
forming a field effect transistor including the gate dielectric and a patterned portion of the gate semiconductor material portion over the second substrate semiconductor portion.

20. The method of claim 19, further comprising:
depositing a metallic material layer over the gate semiconductor material portion and over the semiconductor plate; and
patterning the metallic material layer, the gate semiconductor material portion, and the first semiconductor plate by performing an etch process,
wherein:
patterned portions of the metallic material layer comprises a metallic gate electrode and the metallic sheet;
a patterned portion of the gate semiconductor material portion comprises a semiconductor gate electrode; and
a peripheral portion of the first semiconductor plate is removed by the etch process.

* * * * *